United States Patent [19]
Lawrence et al.

[11] Patent Number: 5,914,902
[45] Date of Patent: Jun. 22, 1999

[54] SYNCHRONOUS MEMORY TESTER

[75] Inventors: Archer R Lawrence; Jack C Little, both of Austin, Tex.

[73] Assignee: Tanisys Technology, Inc., Austin, Tex.

[21] Appl. No.: 09/115,386

[22] Filed: Jul. 14, 1998

Related U.S. Application Data

[62] Division of application No. 08/895,307, Jul. 16, 1997.

[51] Int. Cl.⁶ .................................................. G11C 7/00

[52] U.S. Cl. ........................ 365/201; 365/222; 365/233

[58] Field of Search .................................. 365/201, 222, 365/233, 189.05, 226

[56] References Cited

U.S. PATENT DOCUMENTS

| | | | |
|---|---|---|---|
| 5,402,389 | 3/1995 | Flannagan et al. | 365/233 |
| 5,539,692 | 7/1996 | Kajigaya et al. | 365/201 X |
| 5,587,950 | 12/1996 | Sawada et al. | 365/201 |

*Primary Examiner*—Huan Hoang
*Attorney, Agent, or Firm*—Baker & Botts, L.L.P.

[57] ABSTRACT

An automated, portable, and time conservative memory test system for identifying test parameters including type, control line configuration, depth, width, access time, and burst features of any one of a wide variety of synchronous memories including SDRAMs and SGRAMs, and whether an IC chip, bank, board or module, without requiring hardware modifications or additions to the memory device being identified, and without requiring storage of test patterns or characterizing data in the memory device.

15 Claims, 48 Drawing Sheets

SYNCHRONOUS MEMORY TESTER

RELATED APPLICATIONS

This application is related to patent applications entitled "Synchronous Memory Identification System" and "Nested Loop Method Of Identifying Synchronous Memories", assigned to the assignee of this application, and filed concurrently herewith, and is a Divisional Application of Prior application Ser. No. 08/895,307 filed Jul. 16, 1997.

FIELD OF THE INVENTION

The invention relates generally to memory test systems, and more particularly to a test system for SDRAM and SGRAM memories.

BACKGROUND OF THE INVENTION

A substantial industry has evolved for the packaging of integrated circuit (IC) memory devices into subassemblies commonly referred to as memory modules. The memory module is a more practical increment of memory than a single IC, and has enjoyed some industry standardization with regard to means of connection, operating voltages, definition of connector pins, and operation of signals. A representative standards organization is the Joint Electronic Device Engineering Council (JEDEC). However, beyond that which has been standardized by industry, there are many attributes of a memory module which cannot be recognized readily by the reading of the part number or by examination of the ICs on the module. This is a result of the wide variety of end user requirements which are placed upon the manufacture of modules.

For a memory module to be tested correctly, test parameters must be precisely identified. When module testing occurs outside of an automated environment, manual entry of test parameters becomes tedious and prone to human error. In an automated environment, the incorporation of a small non-volatile memory device known as "serial presence detect bits" into a memory module for the storage of memory parameters has not solved the test parameter identification problem. The contents of these non-volatile memories themselves are generally incomplete, not standardized, and not initialized and tested at the point of manufacture.

A synchronous memory test system has been developed which provides for the automatic identification (ID) of synchronous memory modules, and for the purpose of reporting to the operator of the test system the type, configuration, size, and other characteristics of the memory module, and the establishment of all operating parameters necessary for correct testing of the module.

The memory module identification process itself is carried out in a hardware/software state machine which includes a multilayered, nested loop architecture which allows the efficient identification of all necessary memory module attributes.

Anticipating that larger and more diverse synchronous memory modules will be developed in the future, patterns representing possible control line connections are stored in tables. Table storage permits simple updating of the memory module test system without altering the operation or accuracy of the identification process.

U.S. Pat. No. 5,561,636 discloses a RAM memory which has been adapted to include a self-test feature and a plurality of memory cells arranged in rows and columns, means for selecting rows and columns, and means for simultaneously testing a plurality of cells in a plurality of rows to replace non-functioning memory cells with functioning memory cells held in reserve. The memory cells are arranged in segments with sense amplifiers coupled to each column and a second group of sense amplifiers connected to the segment to bring the test feature into effect. The present invention, by way of contrast, identifies any one of a plurality of different synchronous memories rather than a specific pre-defined memory.

U.S. Pat. No. 5,487,042 discloses a DRAM which has been modified to include circuitry that will communicate the characteristics of the DRAM including test patterns to a memory tester to accommodate a highly customized testing for the particular DRAM. By way of contrast, the present invention is not SDRAM or vendor specific, and does not depend upon the SDRAM under test to supply test patterns for use by the memory test system.

U.S. Pat. No. 5,533,194 discloses an SDRAM tester which requires hardware test circuitry to be added to the memory array "board" or memory module to control the testing of the memory array, and uses two different addressing protocols at two different rates to test all memory blocks. By contrast, the present invention uses a single addressing protocol at a single rate, and tests only a representative block in a memory array board.

U.S. Pat. No. 5,301,156 discloses a RAM which has been adapted to include a self-test circuit. The test circuit uses a signature generator to form a test signature from the RAIM responses to test patterns, and a scan path to serially shift data into and out of the test circuit. The disclosed apparatus and method must be configured to operate on only a single, specific, pre-defined memory device. By way of contrast, the present invention has the capability to identify a wide variety of synchronous memories, and determines all parameters necessary to test any one of the synchronous memories being identified.

U.S. Pat. No. 5,450,364 discloses a self-refresh system which includes an oscillator coupled to a self-refresh counter, and which generates a signal to indicate that a self-refresh cycle has been completed. U.S. Pat. No. 4,451,903 discloses a method of modifying a RAM. EEPROM or EPROM to include ROM cells which are written with chip parameters including supply voltages, operating currents, programming voltages, and programming pulse-widths, as well as manufacturer's identification and mask sets. No testing occurs. By way of contrast, the present invention does not require or use identification codes stored in or with a memory unit being identified or under test in order to determine the necessary test parameters for the memory unit.

The present invention is further distinguished from U.S. Pat. Nos. 5,561,636; 5,487,042; 5,533,194; 5,301,156; 5,450,364; and 4,451,903 in that the present invention does not require hardware modifications or additions to the memory unit, memory board, or module being identified or tested.

U.S. Pat. No. 5,577,236 discloses a memory controller which is adaptive to read data from synchronous RAM modules in which the memory cells in use may vary without compromising the memory bandwidth. The memory controller has an open loop clock system which includes a system clock, and a sampling clock which provides an assortment of phase-shifted clock signals based upon the system clock. In response to a memory loading, one of the phase-shifted clock signals is selected and thereafter delayed to trigger data latches to accept data read from a memory bank after an appropriate access time. The disclosed method and apparatus requires that memory modules be precharacterized or identified and enumerated, and based upon such information, a phase-shifted sampling clock is preselected. By contrast, the present invention adapts to the memory module access time by adjusting the timing of a data sampling strobe in small increments until during a test phase the data patterns read are identical to the data patterns written, thereby adapting to any synchronous memory access time without need for any preselections.

U.S. Pat. No. 5,570,381 discloses a method of testing SDRAM memory banks, in which data is written into a first bank at a slow tester speed, transferred between banks at a high full page burst speed, and read by the tester from the second bank at the slower tester speed. The present invention accomplishes the same result by using only the slower tester speed, and a variable word burst transfer. Further, a lower cost synchronous memory tester is made possible by employing a state machine based memory controller that obviates the need for any high-speed clock by controlling the clock enable (CKE) control line to the memory unit being identified.

U.S. Pat. No. 4,606,025 discloses a memory array test system which attempts to match the test requirements of memory arrays of different manufacturers with an array of memory testers from different manufacturers, by providing a universal tester independent language for manually entering parameter tests in accordance with designer specifications, and then using translators to make the test sequence compatible with a particular memory tester. The present invention obviates the need for processing parameters external to the memory test system by using test parameters determined by the test system itself. A lower cost synchronous memory tester is thereby made available.

U.S. Pat. No. 3,659,088 discloses a method of indicating memory chip failures in which binary numbers are assigned to each test performed on a memory cell, and an error syndrome number is provided which is a function of the numbers assigned to failed tests. A user thus must interpret the error syndrome number before deciding that the memory unit under test is sufficiently functional. By way of contrast, the present invention determines a set of test parameters which may be used to test a memory cell or unit, and conveys a message to a user which includes the test parameters without any need for an interpretive step.

SUMMARY OF THE INVENTION

A portable memory test system for synchronous memories which employs tables of ordered entries of bit patterns representative of all known synchronous memories, the tables being accessed by means of a nested loop identification process to identify the type, control line configuration, depth, and width of any one of a wide variety of synchronous memories, and the test system further having a means for determining access times of synchronous memories.

In one aspect of the invention, all parameters necessary to test a synchronous memory are determined without requiring either hardware to be added to a memory module, and without requiring any parameters to be stored in a synchronous memory.

In another aspect of the invention, all parameters for testing a synchronous memory are determined through use of a substantially reduced number of trial combinations within a substantially reduced period of time.

BRIEF DESCRIPTION OF THE DRAWINGS

For a more complete understanding of the present invention and the advantages thereof, reference is now made to the following description taken in conjunction with the accompanying drawings in which:

FIG. 6b is a functional block diagram of UUT adapter 14 of FIG. 6a;

FIG. 8 is a logic diagram of the control enable logic 192 of FIG. 7 which is used in the memory test controller 116 of FIG. 6a;

FIG. 9 is a logic flow diagram of the states which are assumed by the state machine 150 of FIG. 6a;

FIGS. 12a–12l constitute a logic flow diagram of the automated identification process used by the memory test system 10 in identifying synchronous memories;

DESCRIPTION OF PREFERRED EMBODIMENTS

Figure 1:
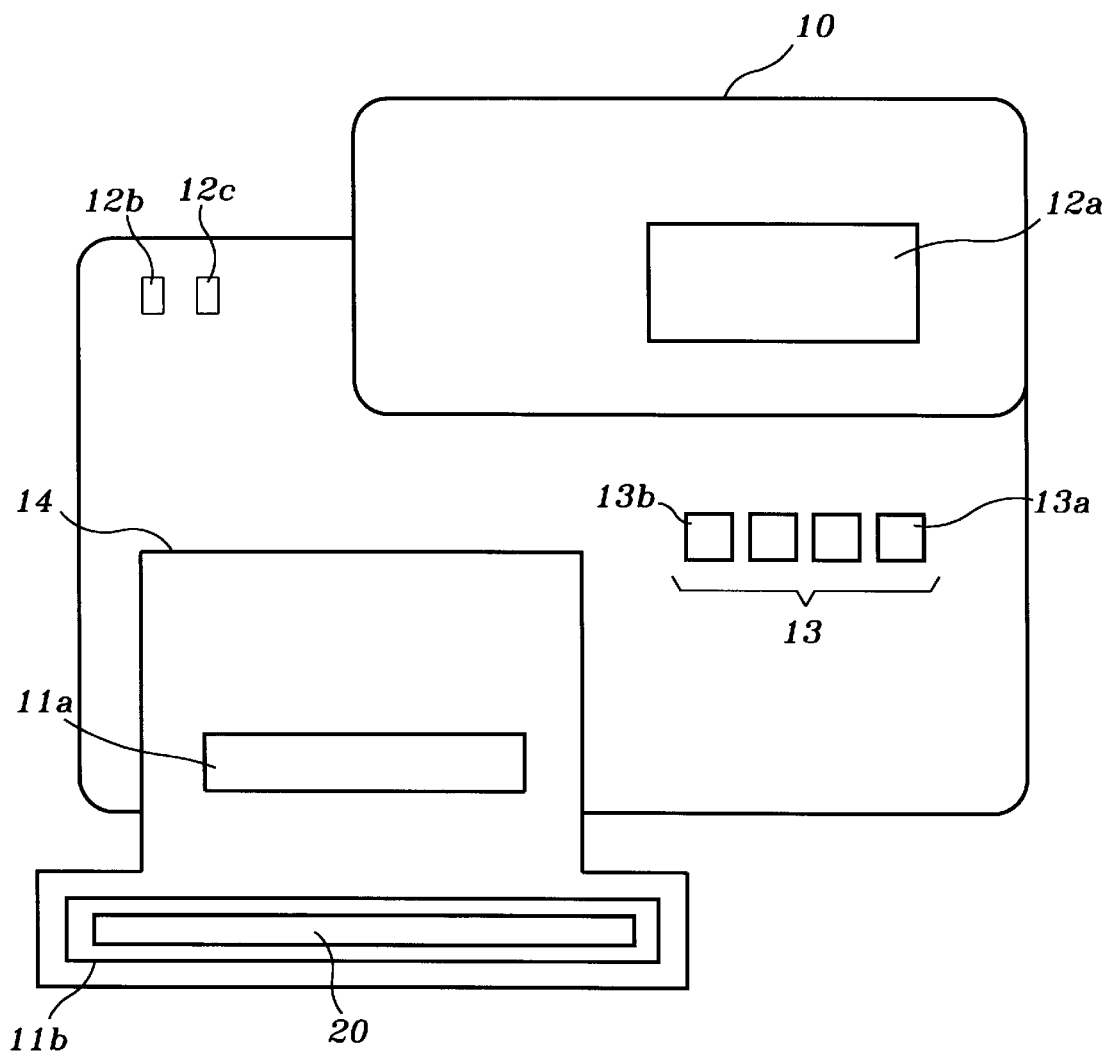
FIG. 1 is a functional block diagram of a portable synchronous memory module test system in accordance with the invention.

Preferred embodiments of the present invention are now described with reference to the Figures, in which like reference numbers refer to like elements.

Before proceeding with a description of the invention, however, the following glossary of terms is presented to aid in an understanding of the invention.

GLOSSARY

Access time: Period of time (measured in nanoseconds) from the presentation of control signal (address, clock, row enable, column enable, etc.) to a memory device to the point in time when data output becomes valid.

Array: A two-dimensional arrangement of addressable memory cells within a memory IC.

Auto-ID: An intelligent tester method and system in accordance with the invention which determines the speed, width, depth, and control line configuration of a memory module.

Bank: A group of memory ICs accessed and tested in parallel. In the memory test system of the present invention, banks are numbered 0 to 3 and are up to 40 bits wide. burst The capability of an SDRAM and SGRAM to read or write two, four, or eight locations on successive clock cycles, given only the starting address.

CAS (column address strobe): A signal to a DRAM that loads the column portion of the memory address. (Compare RAS.) CAS latency The number of clock cycles that must elapse before data is valid.

CBR (CAS-before-RAS): Historical term denoting a standard memory refresh cycle.

CE (column enable): Synchronous counterpart to the asynchronous CAS signal on DRAM.

clock A continuously running memory signal that provides the timing reference for all SDRAM operations.

CS (chip select): Allows only one selected bank of memory to respond to signals in common with all memory chips.

DIMM (dual in-line memory module). In a DIMM, the front and back sets of module-edge contacts are electrically separate.

DQMB (DQ mask byte). A control line to SDRAM; it signals SDRAM to write selected 8-bit bytes within a word.

DRAM (dynamic random-access memory). A memory chip that stores 1's and 0's as charges in capacitors, allowing very high-density memories at a low cost per bit.

EEPROM (electrically erasable programmable read-only memory): A nonvolatile memory device that can retain information when power is removed. Used for storing serial PD bits on SDRAM modules.

IC (integrated circuit): As used herein, an individual memory chip mounted on a memory module.

JEDEC (Joint Electron Device Engineering Council): An industry group established to agree upon standards for electronic components such as memory devices.

ns (nanosecond): One billionth or $10^{-9}$ second.

PD (presence detect): Bits added to a memory module to allow a PC to recognize the type of memory, speed, and other properties.

RAS (row address strobe): A signal to a DRAM to load the row portion of the memory address. (Compare CAS.)

RE (row enable). Synchronous counterpart to the asynchronous RAS signal on DRAM.

Refresh: The process of cyclically reading and writing memory cells to prevent the decay of stored charges (representing 1's and 0's).

SDRAM (synchronous dynamic random-access memory): Unlike conventional DRAMs, commands and data transfers in and out of the memory device are synchronized with a high-speed clock signal.

Serial PD bits: The EEPROM method of storing the presence detect (PD) bits that enable a PC to recognize the type, size, and manufacturer data of the memory in place on the motherboard. Communication with the EEPROM is over a 1-bit-wide serial bus.

SGRAM (synchronous graphics random-access memory): A special SDRAM with color and data mask registers added to accelerate graphical operations in video adapters.

$\mu s$ (microsecond). One millionth or $10^{-6}$ second.

UUT: A unit under test.

UUT adapter: A plug-in interface board that has test sockets specific to a particular physical size and class of memory module.

Voltage bounce: A test method that varies the memory-chip voltage during testing between the minimum and maximum values preset by the operator. These variations can help to simulate power fluctuations found in some PCs.

width The number of bits that can be read or written in a single memory cycle.

FIG. 1 is a functional block diagram of a portable synchronous memory module tester 10 for testing the functional status of synchronous memories such as synchronous dynamic random access memories (SDRAMs) and synchronous graphics memories (SGRAMs). By way of example, the following discussions address SDRAMs only, but it is to be understood that SGRAMs may be accommodated as well. Where a difference in test system configuration is required, such difference is disclosed.

In operation, an SDRAM module 20 is placed into one of UUT (unit under test) sockets 11a and 11b, and a user interface program is executed to cause an indication to be visually displayed on display 12 that an ID process may be performed. When key 13b of keyboard 13 is pressed by the operator, power is applied to one of UUT sockets 11a or 11b, which respectively receive 144 pin and 168 pin memory modules. In the illustration, a SDRAM module 20 is shown inserted into the UUT 11b. Upon being initialized, the memory module tester performs a module identification process referred to as auto-ID, during which various stimuli are applied to and responses sensed from the SDRAM module 20. Upon completion of the auto-ID process all parameters necessary for testing SDRAM module 20 are written to a setup portion of a test system memory in preparation for functional testing. The test parameters are available to the operator through use of menus appearing on display 12.

Figure 2:
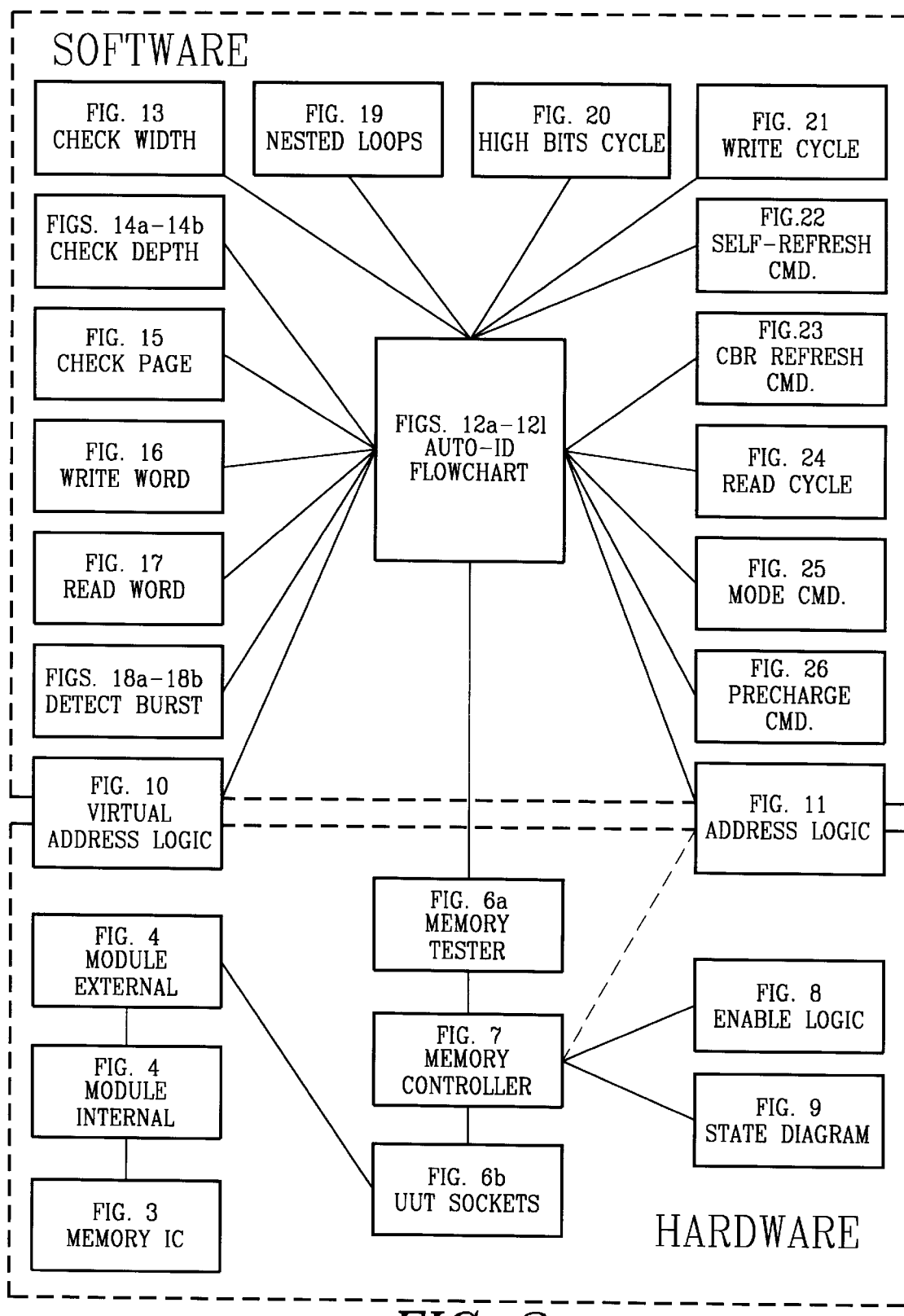
FIG. 2 is an overview diagram showing how the FIGS. 3–26 interrelate in illustrating the hardware and software systems comprising the invention.

FIG. 2 is an overview diagram showing how FIGS. 1–12 interrelate in illustrating the hardware, software, and data structures of the present invention.

Figure 3:
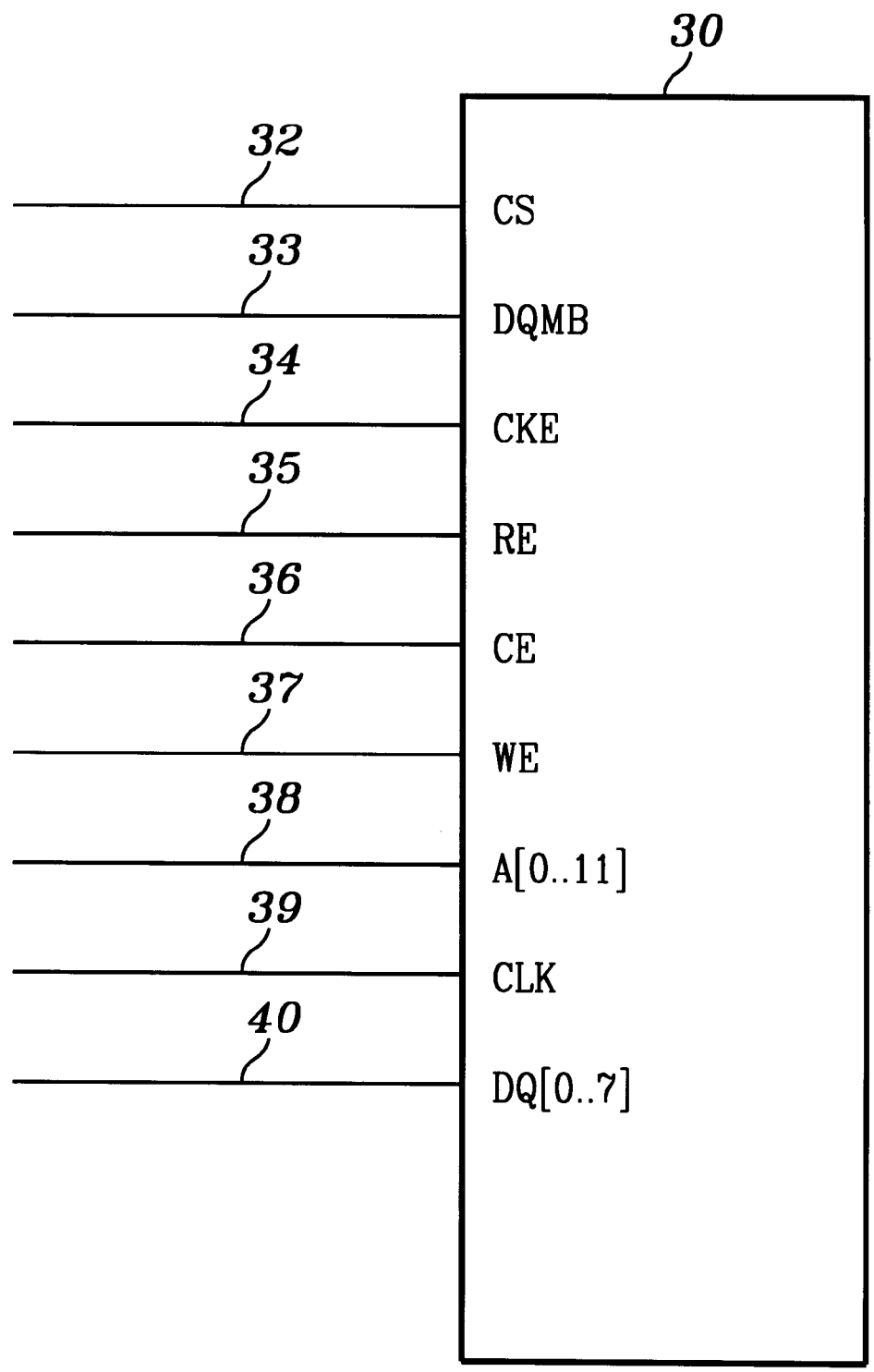
FIG. 3 is a graphic illustration of the control lines of a SDRAM IC.

FIG. 3 illustrates graphically the control lines of a SDRAM IC 30, which has ports for the following: chip select (CS) 32, data mask byte (DQMB) 33, clock enable (CKE) 34, row enable (RE) 35, column enable (CE) 36, write enable (WE) 37, multiplexed address (A[0 . . . 11]) bus 38, timing reference clock (CLK) 39, and bi-directional data line (DQ) bus 40, without regard for active polarities. The multiplexed address bus 38 provides a means for delivering to SDRAM 30 a memory address consisting of a row address when RE 35 is asserted, and a column address when CE 36 is asserted. Bi-directional data lines (DQ[0 . . . 7]) of bus 40 allow 8-bit-parallel transfers in and out of the SDRAM which are synchronized with CLK 39. Individual SDRAMs respond to read or write commands when their CS 32, DQMB 33, CKE 34, and CE 36 inputs are simultaneously asserted. It is to be appreciated that plural SDRAM ICs as illustrated in FIG. 3 may comprise a single SDRAM module.

Figure 4:
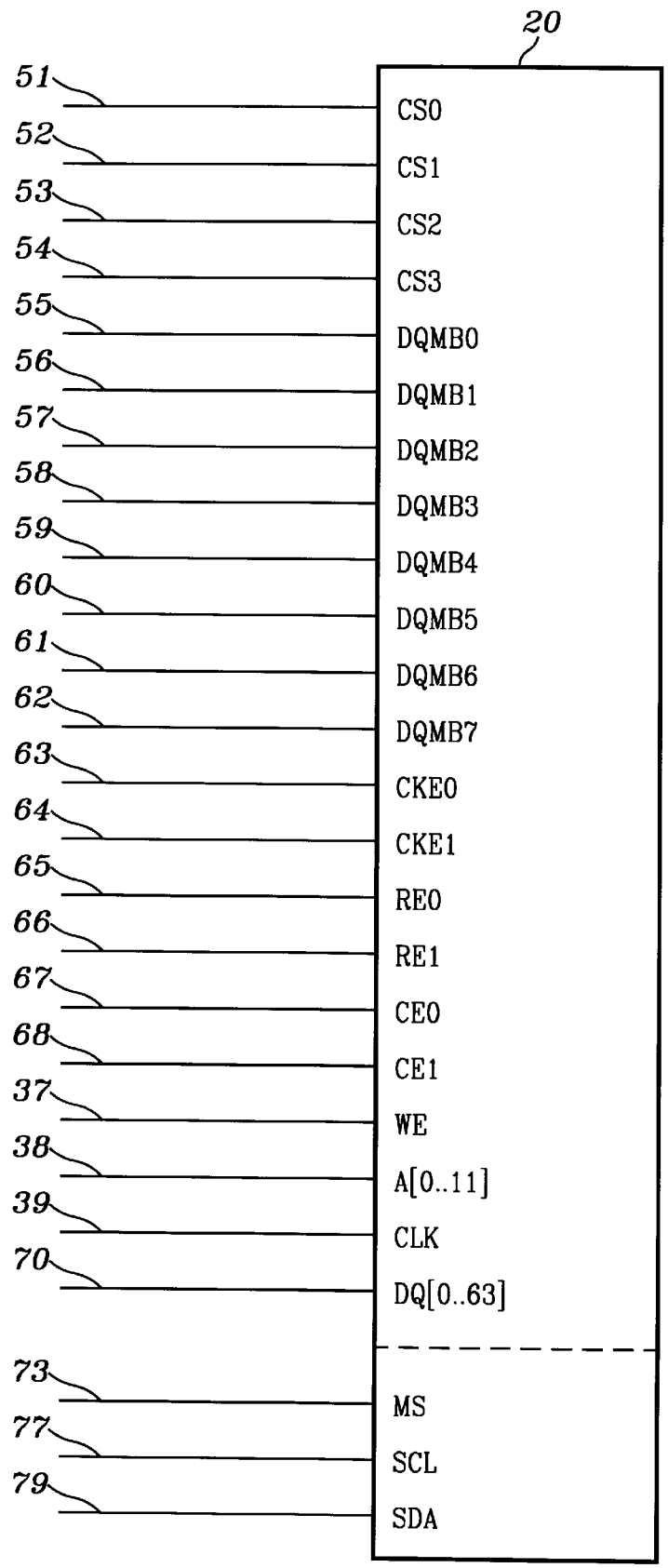
FIG. 4 is a graphic illustration of the control lines of a SDRAM memory module.

FIG. 4 illustrates the interface to SDRAM module 20. Signals on control lines CS0 51, CS1 52, CS2 53, and CS3 54 are chip selects; signals on control lines DQMB0 55, DQMB1 56, DQMB2 57, DQMB3 58, DQMB4 59, DQMB5 60, DQMB6 61, and DQMB7 62 are data byte masks; signals on control lines CKE0 63 and CKE1 64 are clock enables: signals on control lines RE0 65 and RE1 66 are row enables; and signals on control lines CE0 67 and CE1 68 are column enables. WE 37 is the write enable; A[0 . . . 11] 38 is the multiplexed address bus, and CLK 39 is the system clock signal. All of the aforementioned signals originate from the memory test controller of the memory module test system, and are synchronized to CLK 39. For purposes of illustration, bi-directional data bus DQ[0 . . . 63] 70 aggregates eight 8-bit-wide buses of the constituent SDRAMs into one 64-bit bus. It is understood, however, that a SDRAM memory module could be comprised of more or fewer than eight SDRAM ICs. All transfers on DQ[0 . . . 63] 70 are synchronized to CLK 39.

Figure 5:
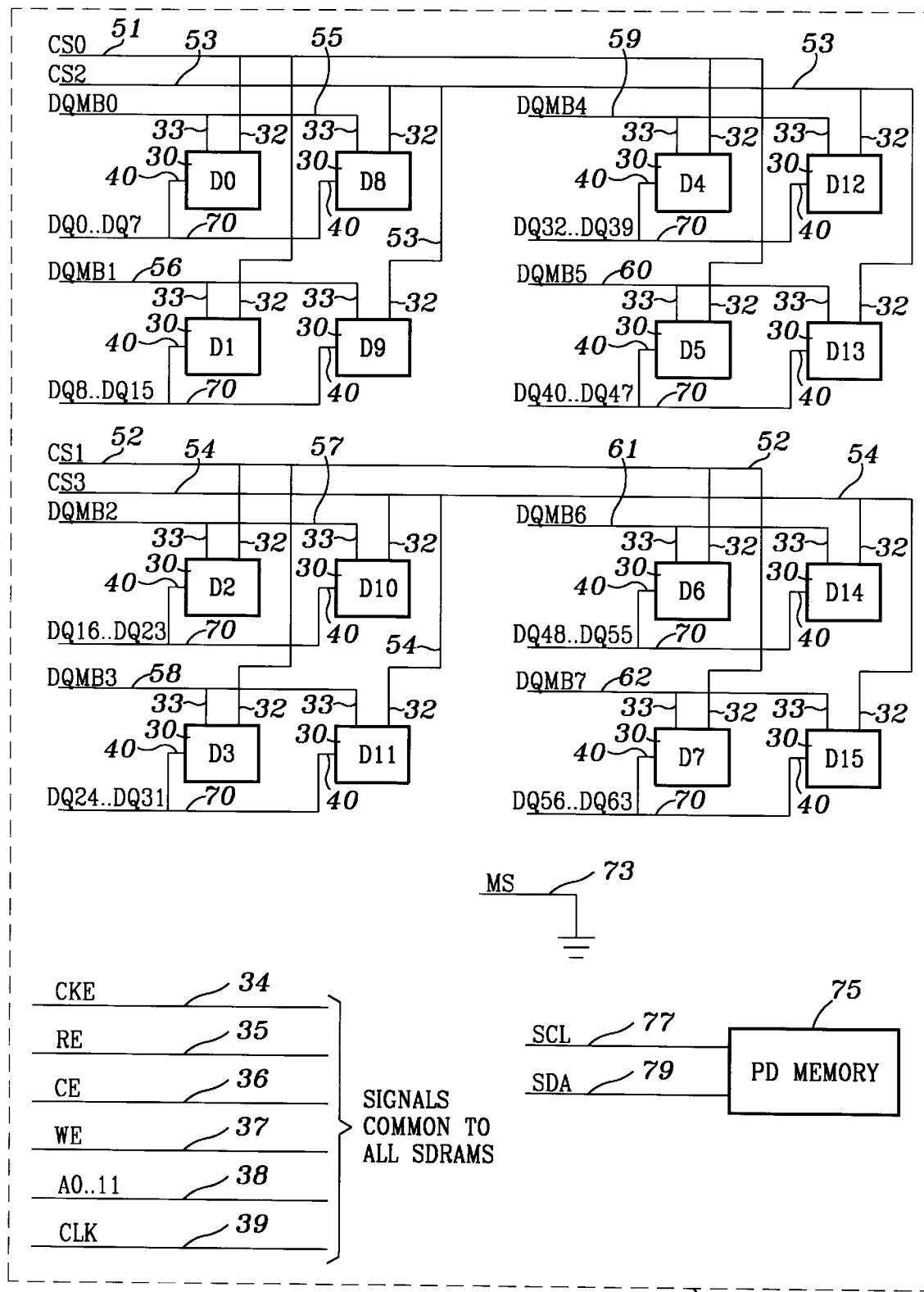
FIG. 5 is a functional block diagram of two parallel, interconnected banks of SDRAM ICs forming a SDRAM memory module having a 64 bit width.

FIG. 5 illustrates how two banks of 16 eight-bit-wide SDRAM ICs are wired within a typical SDRAM memory module 20 with a width of 64 bits. SDRAMs D0 through D7, inclusively, are connected in parallel to SDRAMs D8 through D15 by way of 64 data lines DQ0–DQ63 of bus 70 to increase the depth or number of IC banks of module 20. Therefore, multiple, individually-selectable banks of SDRAM ICs may be connected in parallel to form memory module 20.

The uniqueness of each bank of SDRAM ICs is established by way of module control lines CS 32, DQMB 33, and CE 36. That is, the CS 32 terminal of each SDRAM IC may be connected to one of the CS0 51, CS1 52, CS2 53, CS3 54 control lines, or to a fixed logic level that constitutes permanent enable. The DQMB 33 terminal may be connected to one of the DQMB0 55, DQMB1 56, DQMB2 57, DQMB3 58, DQMB4 59, DQMB5 60, DQMB6 61, or DQMB7 62 control lines, or to a fixed logic level that provides a permanent enable. The CE 36 terminal may be connected to either of the CE0 67 or CE1 68 control lines. It thus may be seen that there are many wiring combinations which may be used to connect banks of SDRAM ICs into a single SDRAM module.

PD memory 75 is a 256 word by 8 bit, non-volatile, electrically erasable, programmable read-only memory (EEPROM) typically having stored therein memory module parameters in accordance with JEDEC guidelines. The memory 75 operates electrically separate from SDRAM signals, and has a SCL clock line 77 input, and a bi-directional serial SDA data line 79. Lines 77 and 79 are used in accordance with industry-standard $I^2C$ bus specifications as described in "PC Peripherals for Microcontrollers", a data book by Signetics Company, a division of Philips Semiconductors, 1992. The lines 77 and 79 provide a means for tester 10 to communicate with PD memory 75.

Figure 6A:
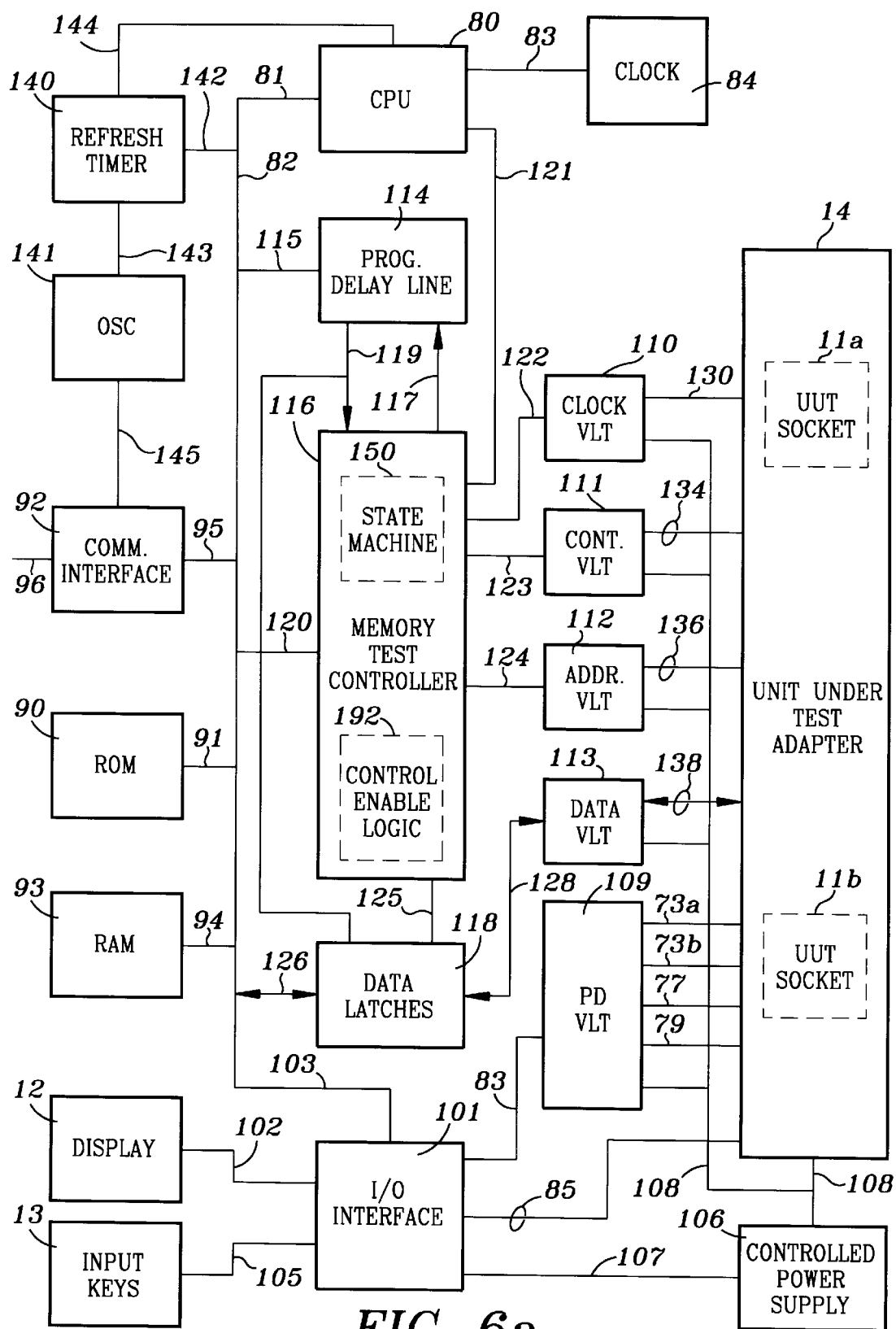
FIG. 6a is a functional block diagram of the memory test system 10 of FIG. 1 in accordance with the invention.

FIG. 6a illustrates a portable SDRAM tester 10, which is employed to identify the module 20 that is inserted into the UUT socket 11a or 11b through use of the Auto-ID algorithm. Tester 10 is comprised of a 32-bit RISC CPU 80 in electrical communication by way of line 81 with address/data/control bus 82, and by way of line 83 with processor clock 84 which provides timing for CPU 80. The processor clock is a programmable synthesizer which generates a 40 MHz signal when a memory module is being tested, and an 8 MHz signal when in standby mode for reduced power consumption. ROM 90 provides a non-volatile storage for all memory test system operating software programs, and for certain constants which may be used to identify most SDRAMs. ROM 90 is in electrical communication with bus 82 by way of line 91. Further, ROM 90 is a flash ROM which may be written into only when an appropriate code is applied to its data lines. Upgrades to the software stored in the ROM thereby may be effected by way of communications interface 92.

RAM 93 provides temporary and intermediate storage for software programs, and for certain variables which allow the operating software to reference a single SDRAM module configuration having many parameters. A more efficient execution of the software thereby is provided. The RAM 93 is in electrical communication with bus 82 by way of line 94.

Communications interface 92 is in electrical communication with bus 82 by way of line 95, and provides an electrical connection to an external printer or PC connected to line 96. Display 12 is in electrical communication with I/O interface 101 by way of line 102. The I/O Interface 101 in turn is in electrical communication with bus 82 by way of line 103. Input keys 13 are in electrical communication with I/O interface 101 by way line 105. Power supply 106 receives control signals from I/O interface 101 by way of line 107, and supplies power to the UUTs 11a and 11b, and by way of line 108 to a PD voltage level translator (VLT) 109, to a clock VLT 110, to a control VLT 111, to an address VLT 112, and to a data VLT 113.

Power Supply 106 is a program-controlled power supply which turns the power to the UUT on and off, sets actual voltages supplied to the UUT for worst case testing, and provides voltage bouncing to simulate PC power fluctuations.

Programable delay line 114 receives delay values from bus 82 via line 115, and receives a delay start signal from memory test controller 116 on line 117. The delay line 114 returns a delay-end signal to memory test controller 116, and to data latches 118 by way of line 119. The delay line 114 may be programmed for a delay equal to the shortest known access time for SDRAMs. The delay time then may be ratcheted up step-by-step until consistent responses are detected from module 20. The access time of the memory module under test is thereby determined.

Memory controller 116 is a field programmable gate array (FPGA) semiconductor device comprised of a state machine and control enable logic, as will be further described below. Upgrades to the internal hardware interconnection of memory controller 116 may be programmed and verified by way of communications interface 92. The controller is in electrical communication with bus 82 by way of line 120, and receives a memory clock signal, from CPU 80 on line 121. The memory test controller 116 sends a module clock signal to clock VLT 110 on line 122, issues memory control signals by way of bus 123 to control VLT 111, and sends multiplexed addresses by way of bus 124 to address VLT 112. The memory test controller 116 further is in electrical communication with data latches 118 by way of line 125. The data latches 118 in turn are in bi-directional communication with bus 82 via line 126, and in bi-directional communication with data VLT 113 via line 128.

The data latches 118 allow the CPU 80 to perform a two cycle (8 bit followed by a 32 bit) write, into the data latches. Thereafter a single cycle, 40-bit write from data latches 118 to the memory module 20 occurs. Additionally, data latches 118 allow CPU 80 to perform a two-cycle (32 bit followed by an 8 bit) read of the content of the data latches following a single cycle 40-bit read from memory module 20 into the data latches.

Further functions performed by the memory controller include providing test set up signals for a memory module, refreshing a memory module to maintain memory content, commanding the memory module to perform dummy reads and writes, and writing information into and reading information from a memory module. UUT adapter 14 (which is comprised of UUT socket 11a and UUT socket 11b) is in electrical communication with clock VLT 110 via line 130, with control VLT 111 via bus 134, with address VLT 112 via bus 136, with data VLT 113 via bus 138, and with PD VLT 109 by way of lines 73a, 73b, 77 and 79.

The clock, control, and address VLTs convert the 5 volt logic level of the memory module tester to the 3.3 volt logic level of a memory module. The data VLT 113 provides bi-directional conversions between the memory module and the memory tester. The VLTs further provide for programmed electrical disconnection from a memory module.

The period of the Refresh Timer 140 can be controlled by CPU 80 by way of line 81, bus 82, and line 142, to provide an end-of-period interrupt to CPU 80 over line 144. Control thereby is transferred to an interrupt service routine stored in ROM 90 at rates appropriate for nominal and worst-case memory refresh operation of SDRAM module 20.

A crystal-controlled oscillator 141 provides an accurate reference signal having a frequency of 3.6864 MHz over line 143 to the refresh timer 140, and over line 145 to the communications interface 92. The refresh timer controls interrupts to the CPU 80. The communication interface provides information to other systems for further processing and/or display by way of line 96.

In operation, CPU 80 provides a derived system clock on line 121 for the memory test controller 116, while executing software program codes stored in ROM 90 and using RAM 93 for temporary, intermediate. and variables storage. Programmable delay line 114 has a delay set in increments of approximately 40/256ths of a nanosecond under software control. Display 12 and input keys 13 provide the user interface, and a means of prompting the operator and displaying the results of the auto-ID functionality which will be explained in more detail below. Memory test controller 116 generates all timing for the UUT 11. Controlled power supply 106 allows the power to the UUT 11 and VLTs 110, 111, 112, and 113 to be switched on and off under control of the software stored in ROM 90.

CPU 80 is comprised of a 32-bit RISC processor operating at 20 MHz, and associated peripherals including a reset circuit, an address latch, and an address decoder. The 32-bit RISC processor is identified by part number 79R3041-20J, and is available from Integrated Device Technology, Inc., 2975 Stender Way, Santa Clara, Calif. 95054.

Display 12, is comprised of (1) a graphical 128×64-pixel liquid-crystal display (LCD) assembly identified by part number HG12602NG, which is available from Hyundai, Central Commerce Building, 8F-1, No. 181, Fu-Hsin N. Road, Taiwan, R.O.C.; (2) a red-color "fail" LED; and (3) green-color "pass" LED;

Input keys 13 provide a change in logic levels when pressed. The logic levels in turn are conveyed to I/O interface 101 and read by the CPU 80.

The tester system electronics and power supply 106 are energized by a 12-volt DC power supply. Controlled power supply 106 provides a +3.3 volt source which is required by SDRAM module 20, and includes an I/O port for control signals. Power supply 106 is comprised of key components identified by part number DS 1267-10 (dual digital potentiometer chip available from Dallas Semiconductor Corp., 4401 South Beltwood Parkway, Dallas, Tex. 75244-3292), and part number TL594C, and includes a pulse-width modulation control IC available from Texas Instruments, P.O. Box 655303, Dallas, Tex. 75265-5303; for which many application notes are available in the industry.

Programmable delay line 114 is identified by part number AD9501JP, and is available from Analog Devices, One Technology Way, P.O. Box 9106, Norwood, Mass. 02062-9106.

Memory test controller 116 is identified by part number ispLSI 1048E-70LQ, and is a high-density programmable logic device which is available from Lattice Semiconductor Corp., 5555 Northeast Moore Court, Hillsboro, Oreg. 97124.

Voltage level translators 110, 111, 112, and 113, are identified by part number 74LVX2425WM, and are supplied as an 8-bit, dual supply, translating transceiver IC available from National Semiconductor Corp., 2900 Semiconductor Drive, Santa Clara, Calif. 95052-8090.

Communications interface 92 and refresh timer 140 are identified by part number SCN2681, as a dual asynchronous receiver/transmitter IC available from Philips Semiconductors, Signetics Company, 811 East Arques Avenue, Sunnyvale, Calif. 94088-3409. Line 96 is identified as an electrical interface having part number MAX238 RS-232, and is available as a level translator IC that may be purchased from Maxim Integrated Products, Inc., 120 San Gabriel Drive, Sunnyvale, Calif. 94086.

Data latches 118 are comprised of three units, each of which is identified by part number IDT74FCT16543AT as a 16-bit, non-inverting, latched transceiver available from Integrated Device Technology, Inc., 2975 Stender Way, Santa Clara, Calif. 95054-3090.

Figure 6B:
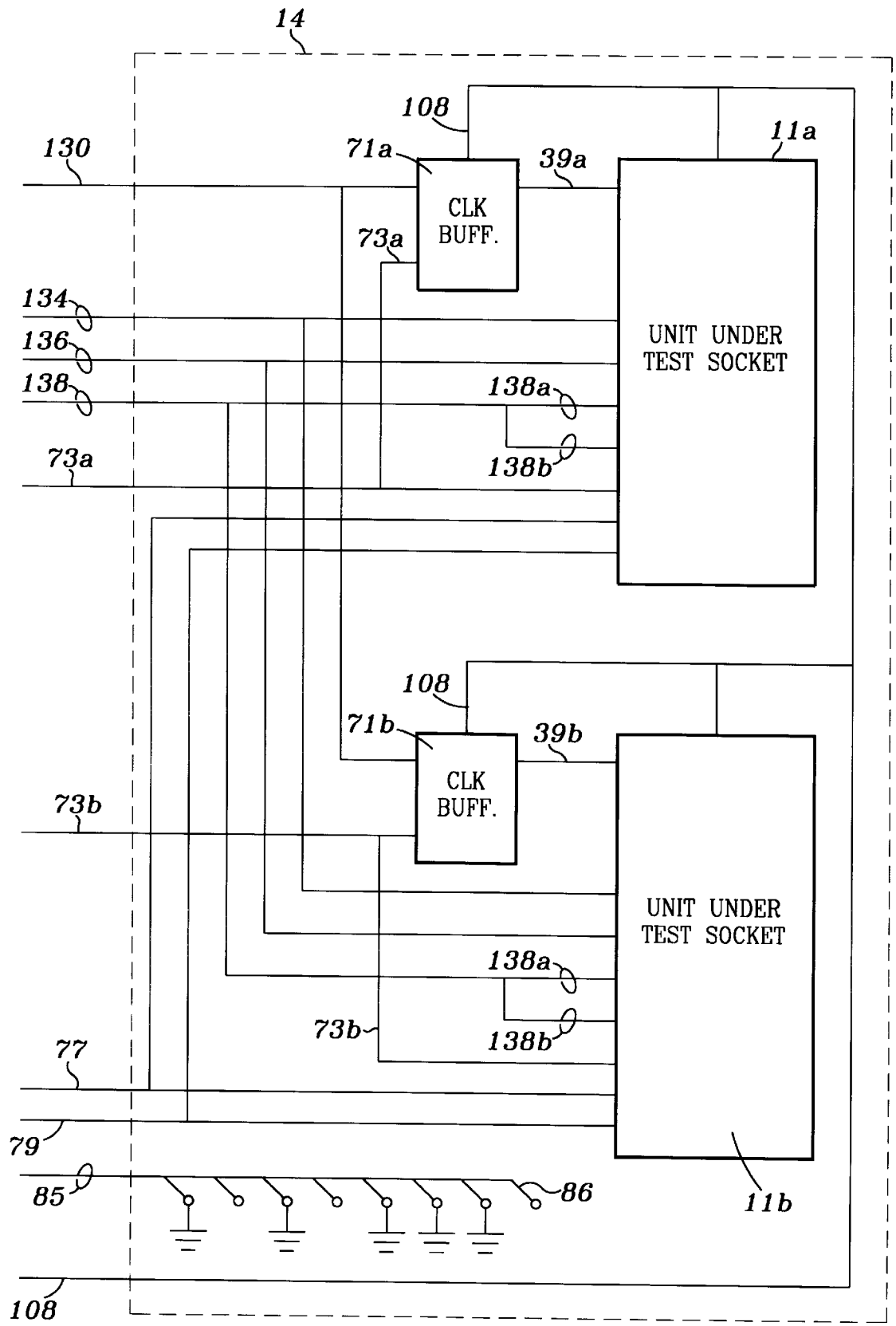

Referring to FIG. 6b UUT adapter 14 is detachable from tester 10 and comprises a 144 pin SO DIMM UUT socket 11a and a 168 pin DIMM UUT socket 11b. The module clock signal 130 is independently buffered by clock buffers 71a and 71b to provide second module clock signals CLK 39a and 39b, respectively, to UUT sockets 11a and 11b. The clock buffers 71a and 71b may be identified by part number PI49FCT3805S, and is available from Pericom Semiconductor Corp., 2380 Bering Drive, San Jose, Calif. 95131. Module sense lines 73a and 73b are respectively grounded when a memory module 20 is inserted into either of the UUT sockets 11a or 11b, thereby providing hardware means for auto-ID software to sense package type, the (SO DIMM 144 or DIMM 168) and enable clock buffers 71a and 71b to drive the clock signals 39a and 39b. Thus, for minimum electromagnetic radiation, the clock signal lines 39a and 39b are not driven when there is no memory module in either UUT socket 11a or UUT socket 11b.

Module control signals bus 134 comprises chip select lines CS0, CS1, CS2, and CS3; data byte mask lines DQMB0, DQMB 1, DQMB2, DQMB3, DQMB4, DQMB5, DQMB6, and DQMB7; clock enable lines CKE0 and CKE1; row enable lines RE0 and RE1; column enable lines CE0 and CE1; define special function line DSF; and write enable line WE. Bus 134 is in electrical communication with both UUT sockets 11a and 11b.

Module address bus 136 comprises fourteen multiplexed lines $A_0$–$A_{13}$, and is in electrical communication with both UUT sockets 11a and 11b. Module Serial clock (SCL) line 77 and bi-directional serial data (SDA) line 79 provide connections for an $I^2C$ (inter-IC) electrical interface to both UUT sockets 11a and 11b. UUT power line 108 energizes both clock buffers 71a and 71b, and both UT sockets 11a and 11b.

Table A shows the signal connection of each line of the 40-bit data bus 138 leading from data VLT 113 to both UUT sockets 11a and 11b. The high 8 bits of data bus 138 ($D_{32}$ through $D_{39}$) connect to synchronous DRAM modules having "check bits", as may be denoted by terminals CB0 through CB15 on UUT sockets 11a and 11b. Check bits are most commonly used on error-correcting type memory modules with widths of 72 and 80 bits.

TABLE A

| DATA VLT 113 | UUT SOCKET 11a | | UUT SOCKET 1b | |
|---|---|---|---|---|
| BUS 138 | BUS 138a | BUS 138b | BUS 134a | BUS 138b |
| D0 | DQ0 | DQ32 | DQ0 | DQ32 |
| D1 | DQ1 | DQ33 | DQ1 | DQ33 |
| : | : | : | : | : |
| D31 | DQ31 | DQ63 | DQ31 | DQ63 |
| D32 | CB0 | CB8 | CB0 | CB8 |
| D33 | CB1 | CB9 | CB1 | CB9 |
| : | : | : | : | : |
| D39 | CB7 | CB15 | CB7 | CB15 |

Software recognition of a UUT adapter's identification is provided by CPU 80 upon reading the state of eight adapter ID lines 85 by way of I/O interface 101. On UUT adapter 14, adapter ID lines 85 are normally in the high or logic "1" state, and are selectively grounded with straps 86 wherever it is desired to read a logic "0" in some bit position. Thus, one adapter may be strapped for a code of 01010001 or hexadecimal 51, and comprise UUT sockets for memory modules with 144 pin SO DIMM and 168 pin DIMM packages. Another adapter may be strapped for a code of 01010011 or hexadecimal 53, and comprise one or more sockets for synchronous graphics RAM, and so forth. Further, reading a code of 11111111 or hexadecimal FF signifies that no UUT adapter is installed.

Figure 7:
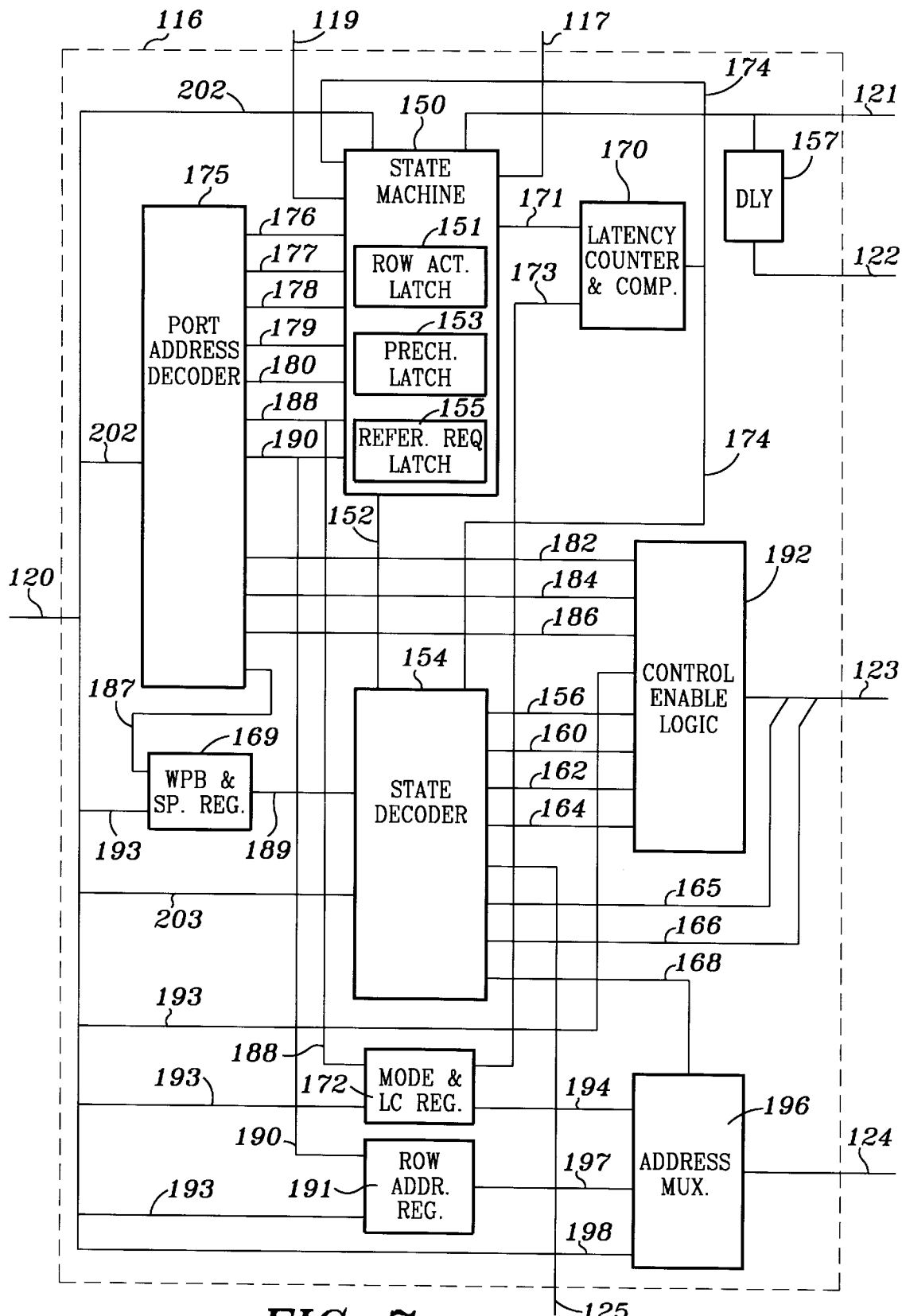
FIG. 7 is a functional block diagram of the memory test controller 116 of FIG. 6a which is used in the memory test system 10.

FIG. 7 is a functional block diagram of memory test controller 116 which provides all timing, control and addressing for the memory module under test. The system clock signal on line 121 provides state machine 150 the timing control to sample all incoming signals and to clock state transitions. The system clock signal on line 121 further is delayed by delay element 157 and output as a reference clock signal on line 122. The heart of the memory test controller 116 is a 5-bit finite state machine 150, which generates latency counter increment and clear signals on line 171, a delay start signal on line 117, and a 5-bit state value on a line 152. The exact sequence from the idle state, through all intervening states, and back to the idle state, is a function of which of the software-driven commands that is triggered and persists through the sequence, and which of the CPU-initiated cycles that occur.

The state value on line 152 is decoded by state decoder 154 into chip select or CS control signals which are issued to line 156, a clock enable or CKE signal which is issued to line 160, a row enable (RE) signal issued to line 162, a column enable (CE) signal issued to line 164, a write enable (WE) signal issued to line 166, and an address select signal on line 168.

The state machine 150 thus provides all hardware timing to the UUT at hardware speeds.

Latency counter & comparator 170 receives increment and clear signals from state machine 150 over line 171, and a latency code from Mode & LC Register 172 over bus 173. The code indicates the number of clock cycles that must elapse before data received from the memory module 20 is valid. The latency counter & comparator 170 compares the current value of an internal latency counter with the latency code received from the Mode & LC Register 172, and generates LC equality signals over line 174. The LC equality signals cause the state machine 150 to enter a next state, and cause the state decoder 154 to decode a new state pattern received from the state machine over line 152. In response thereto, the state decoder 154 issues logic gating signals on lines 156, 160, 162, 164, and 166, a data strobe on line 125, and an address select signal on line 168. The latency counter & comparator 170 acts to stall the reading of UUT information to ensure compatibility with memory module access times.

Addresses which are generated by CPU 80 onto line 120, and which fall into the range of I/O addresses recognized by a port address decoder 175, cause command signals to be generated for state machine 150. The command signals include a set-precharge signal on line 176, a set-mode signal on line 177, a set self-refresh signal on line 178, a set-burst-end signal on line 179 and a set refresh signal on line 180. In addition, the decoder 175 generates a chip select enable register strobe on line 182, a DQMB enable register strobe on line 184, a CKE/RE/CE enable register strobe on line 186, a WPB (write-per-bit) and SP special register strobe on line 187, a Mode & LC Register strobe on line 188, and a row address register strobe on a data bus 190.

The decoder 175 thus recognizes specific addresses from the CPU 80, provides a plurality of triggers to the state machine 150, and strobes the WPB & SP register 169, the Mode & LC Register 172, a row address register 191, and the control enable register 192. The lines 188 and 190 provide for parallel operation of the state machine 150, and the strobing of registers 172 and 191.

The WPB & SP register 169 receives configuration data from the CPU 80 on line 193 which is specific to the operation of SGRAMs, and which enables the programming of one bit within the SGRAM for the write-per-bit operation, and one bit for the special register. The state decoder 154 receives the content of the WPB & SP register 169 on bus 189, and generates a define special function (DSF) signal on line 165 which becomes a constituent of the module control bus 123. In accordance with SGRAM specification, the DSF signal is asserted; (a) during state 09 at logic step 354 of FIG. 9 during the set mode command when the SP bit in the WPB & SP register 169 is set, (b) immediately upon entry into state 0A at logic step 362 is the WPB bit in the WPB & SP register 169 is set, (c) one cycle into state 0A at logic step 362 during write cycles if the row activate latch 151 is cleared and the SP bit in the WPB & SP register 169 is set, and (d) upon the assertion of a latency count equality signal on 138 of FIG. 7 if the row activate latch is set and the SP bit in WPB & SP register 169 is set.

Continuing with the description of FIG. 7, the Mode & LC Register 172 receives configuration data from the CPU 80 on line 193, and supplies a burst length code, a burst mode code, and a CAS latency code to bus 194 leading to the address multiplexer 196. In addition, the register 172 sends the CAS latency code over bus 173 to the latency counter & comparator 170. The burst length code is a three bit binary code with "000" representing one byte, "001" representing two bytes, "010" representing four bytes, and "011" representing eight bytes. The burst mode code indicates either a sequential or interleaved addressing sequence.

Under software control, data patterns on data bus 190 are written into registers inside control enable logic 192. The patterns gate state decoder signals including the chip select (CS) signal on line 156, the DQ mask byte (DQMB) signal on line 158, the clock enable (CKE) signal on line 160, the row enable (RE) signal on line 162, and the column enable (CE) signal on line 164 onto the module controls bus 123. State decoder 154 also generates a write enable (WE) signal on line 166 which becomes a constituent of module control bus 123.

Module address bus 124 is driven by address multiplexer 196, which selects among an SDRAM mode command on line 194, an SDRAM row address on line 197, and an SDRAM column address on line 198. The row address provided by row address register 191, and the column address on line 198, collectively provide a multiplexed row/column address to memory module 20 by way of address multiplexer 196. The burst length, burst mode, and latency codes on bus 194 are applied to the memory module address bus 124 when state decoder 154 indicates on line 168 that the state machine 150 has entered state (01). The address selection is controlled by signals issued by state decoder 154 on line 168.

In operation, memory controller 116 provides all control signal, a UUT clock signal 122, and a multiplexing of address signals required by memory module 20. Addresses of Mode & LC Register 172, row address register 191, and control enable logic 192 are transmitted by CPU 80 over bus 120 and line 202, and are decoded by port address decoder 175. Simultaneous with the transmission of register addresses, configuration or trial data appropriate to a given memory configuration is transmitted from CPU 80 over bus 120 and line 193, and is held in Mode & LC Register 172, in row address register 191, and control enable logic 192.

After the above registers of memory test controller 116 are initialized under software control, a memory cycle may be initiated under software control by CPU 80 writing into one of the addresses decoded by port address decoder 175. State machine 150 thereupon is triggered to perform a data read or data write operation within the 28-bit address space of the UUT. Using state decoder 154, state machine 150 provides a sequencing of control lines 125, 156, 160, 162, 164, and 166. Further, the state machine 150 commands the state decoder 154 to issue control signals by way of line 168, thereby causing address multiplexer 196 to select among (1) mode information on line 194 from Mode & LC Register 172, (2) a row address on line 197 from row address register 191, (3) a precharge constant value with only bit 10 equal to 1, or (4) a column address from bus 120 on line 198.

Figure 8:
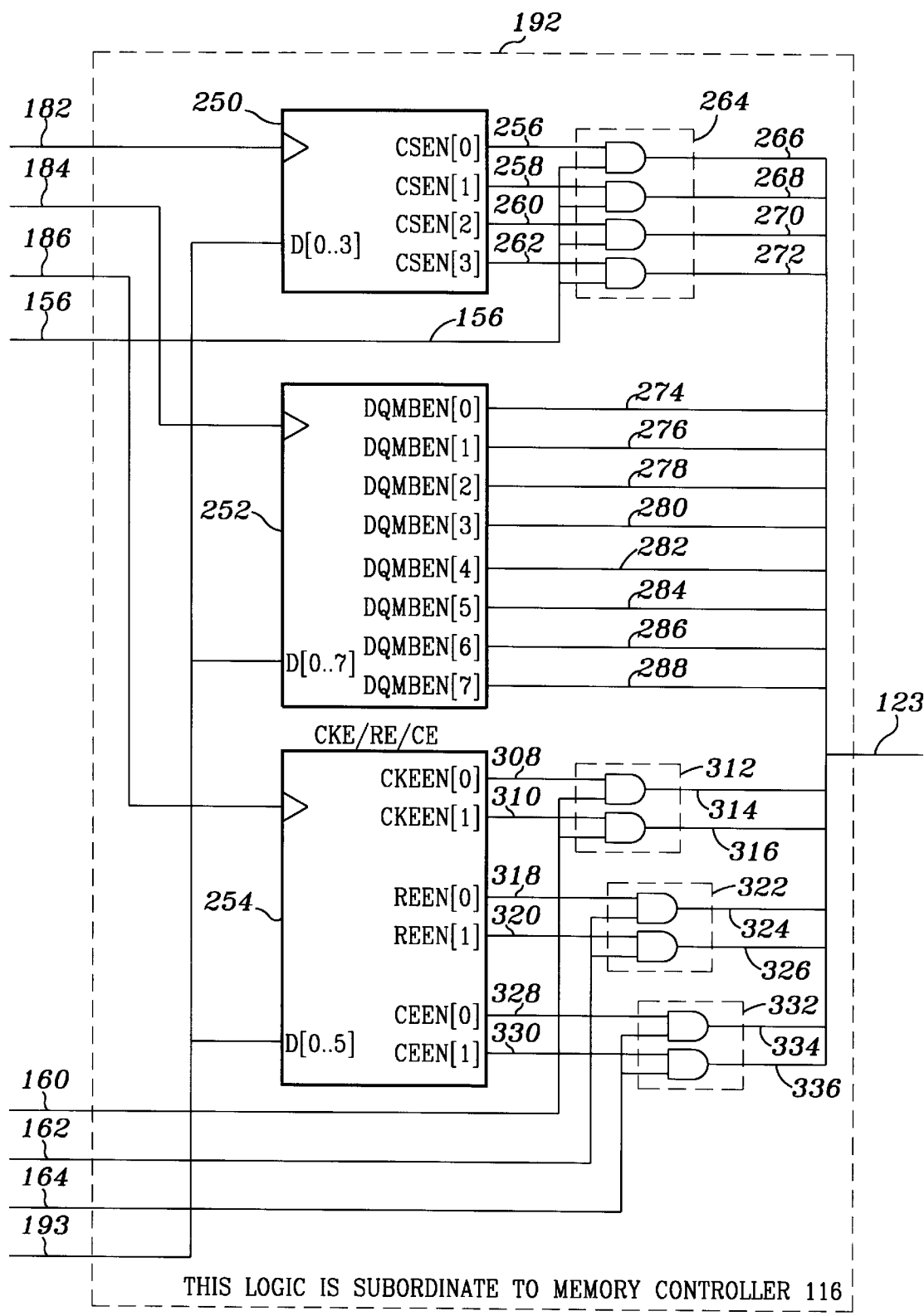

FIG. 8 is a illustration of the control enable registers comprising the control enable logic 192 of FIG. 7. Logic 192 includes a four-bit CS enable register 250, an eight-bit DQMB enable register 252, and a six-bit CKE/RE/CE enable register 254.

The CS enable register 250 receives four bits of data from bus 193, and a chip select enable register strobe on line 182. The register 250 generates CS enable signals CSEN[0] on line 256, CSEN[1] on line 258, CSEN[2] on line 260, and CSEN[3] on line 262. These signals respectively are applied to CS AND gates 264, which in turn provide selective gating of a CS signal occurring on line 156 to provide module control signals CS0 on line 266, CS1 on line 268, CS2 on line 270, and CS3 on line 272 signals CS0–CS3 in turn are aggregated into memory control bus 123.

DQMB enable register 252 receives eight bits of data on bus 193 and a DQMB enable register strobe on line 184, and in response thereto generates DQMB enable signals DQMBEN[0] on line 274. DQMBEN[1] on line 276, DQMBEN[2] on line 278, DQMBEN[3] on line 280, DQMBEN[4] on line 282, DQMBEN[5] on line 284, DQMBEN[6] on line 286, and DQMBEN[7] on line 288. These signals are aggregated onto memory control bus 123.

CKE/RE/CE enable register 254 receives six bits of data by way of data bus 193, and a CKE/RE/CE enable register strobe on line 186, and thereupon generates CKE enable signals CKEEN[0] on line 308 and CKEEN[1] on line 310. In response to the CKEEN[0] and CKEEN[1] signals, CKE AND gates 312 provide selective gating of CKE signal 160 into module control signals CKE0 on line 314 and CKE1 on line 316. The enable register 254 further generates RE enable signals REEN0 on line 318 and REEN1 on line 320, which signals are applied to RE AND gates 322. The RE AND gates in turn provide selective gating of the RE signal on line 162 to provide module control signals RE0 on line 324 and RE1 on line 326. The signal on line 162 is responsive to a state (0A) or a state (0B) signal on line 152. The signals on lines 314, 316, 324 and 326 are applied to the module control bus 123.

The enable register 254 in addition generates CE enable signals CEEN0 on line 328 and CEEN1 on line 330, which signals are applied to CE AND gates 332 to provide selective gating of a CE signal on line 164 to produce module control signals CE0 on line 334 and CE1 on line 336 leading to module control bus 123.

Figure 9:
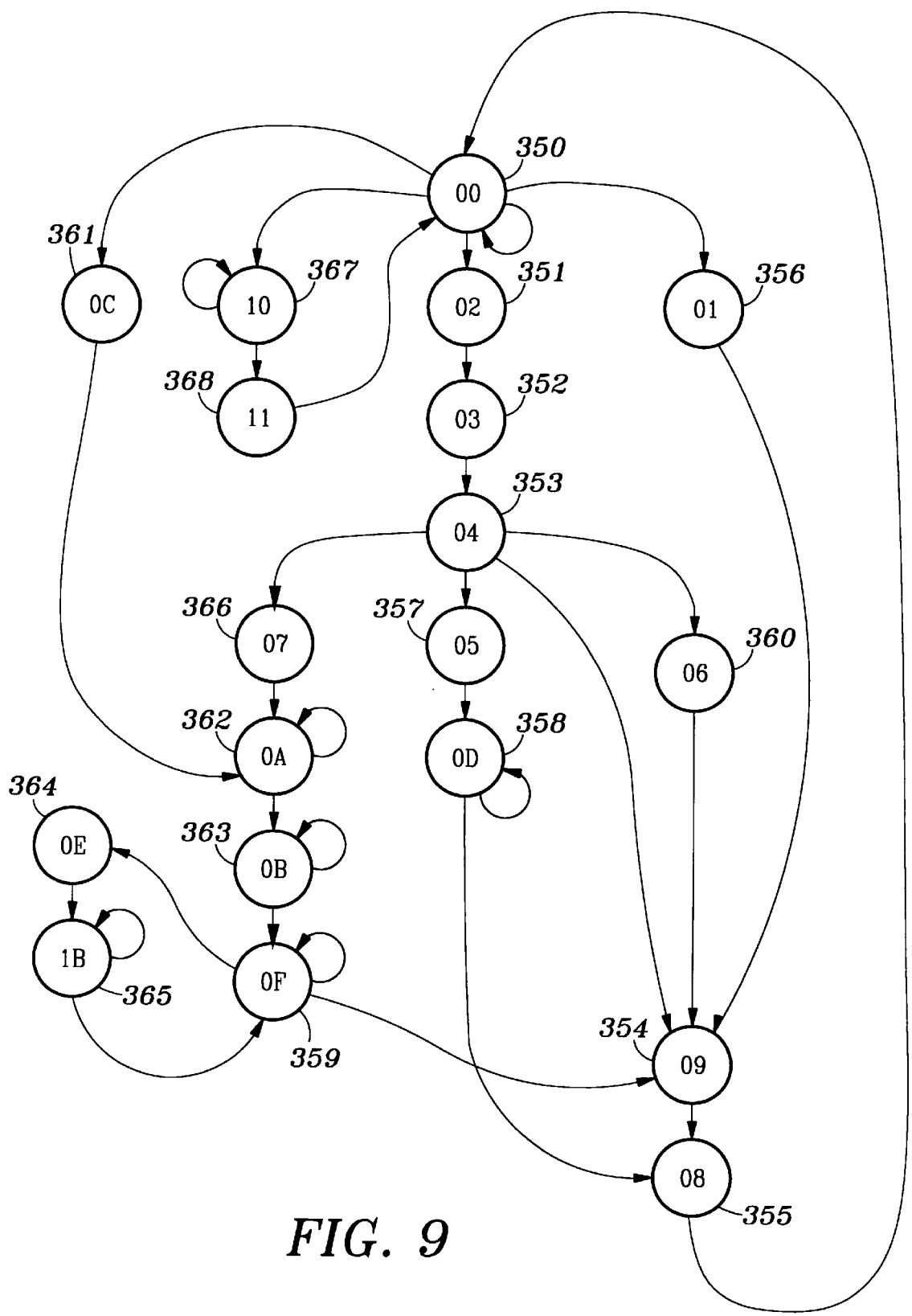

FIG. 9 illustrates a state diagram of the state machine 150. Each circular node of the state diagram contains a hexadecimal number that represents one of 19 states. The operation of state machine 150 is described below in connection with the description of the remaining figures for the following command signals: set-precharge command on line 176; the set mode command on line 177; the set self-refresh command on line 178; the set-burst-end command on line 179; the set mode command on line 188; the row activate command on line 190; and an activate high bits command on line 202.

Figure 10:
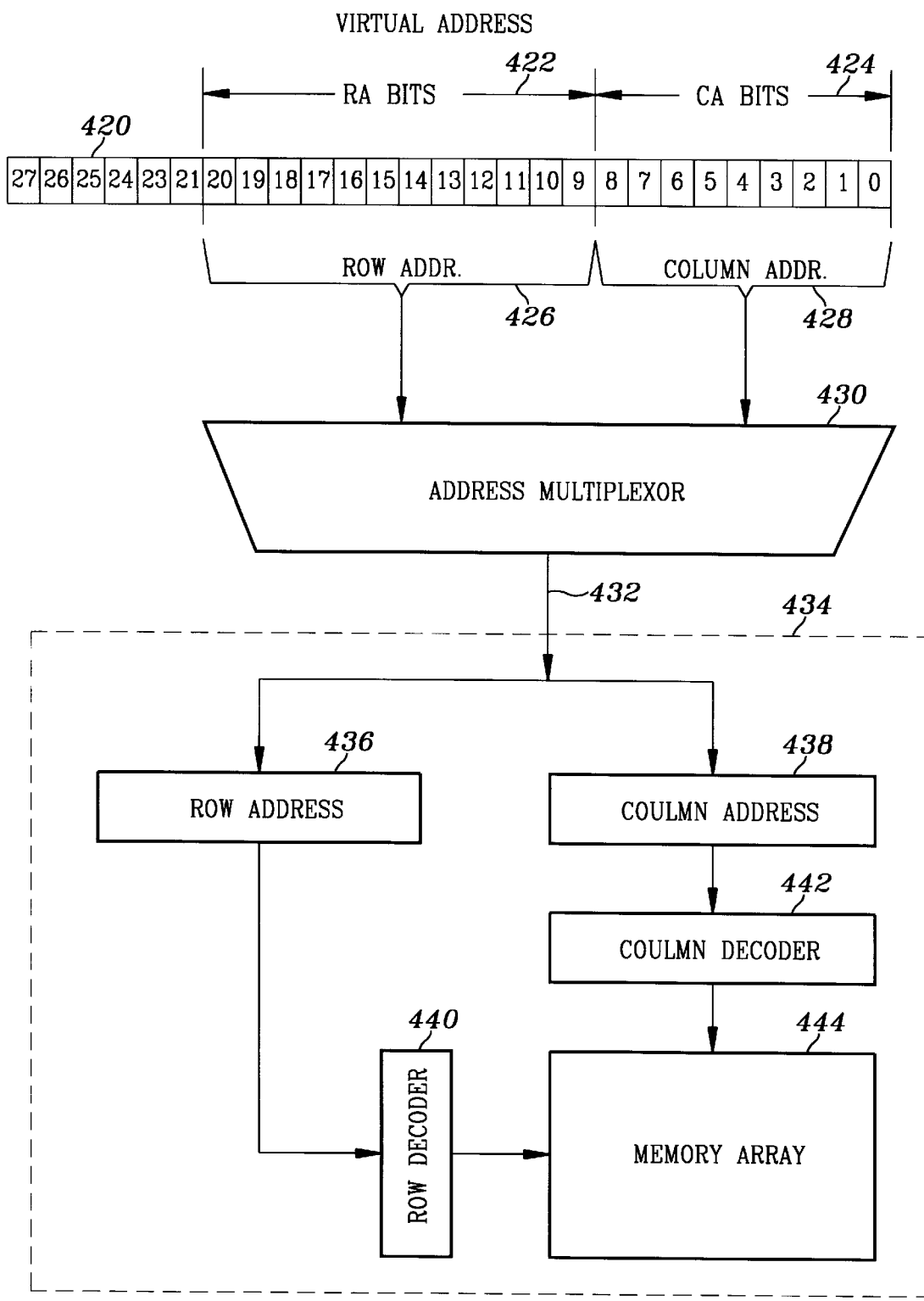
FIG. 10 is a logic diagram of a system used by the memory test system 10 to convert a virtual address of the memory test system into a physical address of a synchronous memory under test.

FIG. 10 illustrates in logic diagram form a simplified model of a logic system for producing a physical address from a virtual address. and partitioning the test system operation between hardware and software to substantially reduce overhead. Typical schemes for providing a physical address to a memory IC have either a fixed, or very limited number of combinations of RA bits and CA bits, and an address multiplexer gate complexity which is proportional to the number of multiplexed lines that are output. In a test environment, however, the number of RA bits and the number of CA bits are each variable, with the actual numbers being specified by the type of part which is used in a memory module. In addition, SDRAMs allocate one or more high-order address bits for internal array selection, and these bits need to be replicated into the high-order bits of both row and column addresses. Further, virtual addresses are numbered in increments of one, while a typical processor-based, memory-test architecture addresses memory at the byte level. A conversion from virtual addressing to physical addressing thus is required.

Providing a hardware conversion from a virtual address to a multiplexed address in a test environment requires a high number of gates, as compared to an address multiplexer with a fixed number of row address bits and column address bits. Most memory test algorithms, however, address memory sequentially, rather than randomly. Infrequently-performed row address logic, therefore, may be moved into software, thereby permitting a simple, fixed, address multiplexer to be implemented in hardware to multiplex between two sets of input lines. In practice, by way of example, if there are 9 column address bits, then the row address needs updating once every $2^9$ or 512 memory cycles. This represents a very small system overhead. It can be seen that memory devices with larger numbers of column address bits enjoy even lower software address processing overhead. Therefore, using the example above, a test of $2^{21}$ menory array locations may be divided into an inner loop of 512 iterations and an outer loop of $2^{21} \div 2^9 = 2^{12}$ or 4096 iterations. When the inner loop exits, the next row address may be calculated in software.

Referring to FIG. 10, a virtual address 420 is dissected into a row address field of RA bits 422 and a column address field of CA bits 424 to produce a row address 426 and a column address 428. The row and column addresses are multiplexed by an address multiplexer 430 to produce a multiplexed address on bus 432.

The address logic for a memory IC 434 is comprised of a row address register 436 which has stored therein the row address 426 portion of the virtual address 420; a column address register 438 having stored therein the column address 428 portion of the virtual address 420; a row decoder 440 which selects rows of cells within a memory array 444; and a column decoder 442 which selects columns of cells within a memory array 444.

Figure 11:
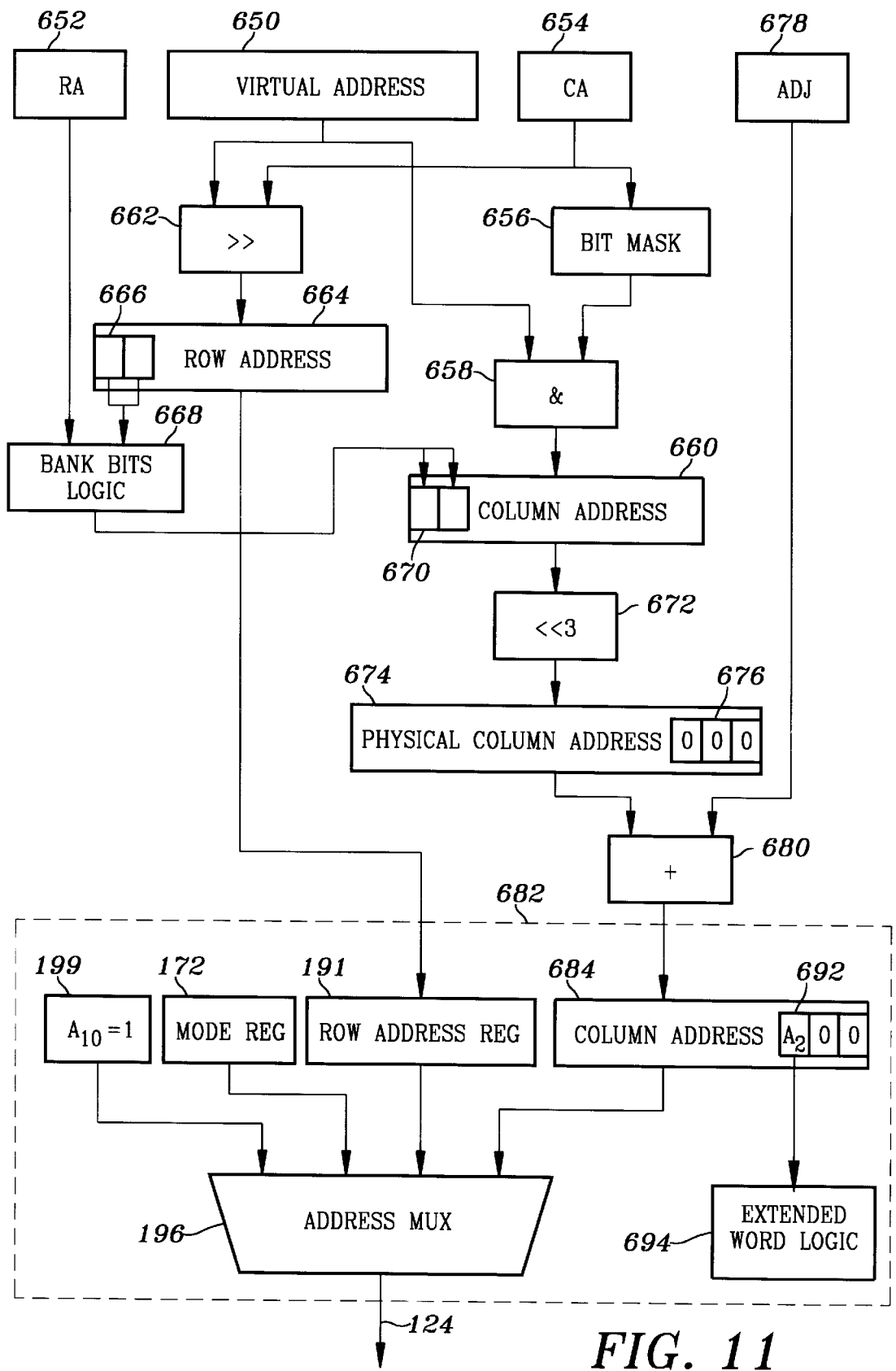
FIG. 11 is a logic diagram of a system used by the memory test system 10 to cause address multiplexer 196 to generate physical addresses.

FIG. 11 illustrates a logic system which allows memory module address multiplexer 196 to generate physical addresses within the memory tester. The SDRAM address generation is partitioned into software and hardware components, such that hardware complexity is minimized by performing static or infrequently performed operations in software, and by performing repetitive high-speed operations such as address multiplexing in a hardware system 682. The hardware system 682 is located in the memory test controller 116. The software is stored in ROM 90 for execution by the CPU 80.

The address multiplexer 196 is configured to handle a fixed number of row and column bits, irrespective of the number of row and column address bits of the SDRAM IC under test. The content of the virtual address register 650 is transformed into a row signal and a column signal. Contents of a variable column address (CA) register 654 contains the number of column address bits used by the SDRAM IC, and are input to a bit mask processor 656 where the constant "1" is shifted left the number of places specified by the variable CA register 654. The result then is decremented by 1 to form a mask containing as many 1's as the number of bits that are specified by the CA register 654. The output of the bit mask processor 656 next is AND'ed in a bit-wise fashion with the virtual address of register 650 at logic unit 658, and stored in a variable column address register 660.

The most significant bits of virtual address register 650 are also shifted right in a shift register 662 by the number of places specified by variable CA register 654, and stored in a variable row address register 664. The most significant bits 666 of the row address register 664 are processed in a block bank bits logic unit 668 under the control of a value stored in a variable row address RA register 652. If the value stored in RA register 652 indicates 12 row lines, then bit 11 is extracted from the variable row address register 664 and OR'ed into corresponding column address bits 670 of the column address register 660. If the value stored in the RA register 652 indicates 14 row lines, then bits 13 and 12 are extracted from variable row address register 664, and OR'ed into corresponding column address bits 670. Otherwise, if the variable RA register 652 does not contain an indication of either12 or 14 row lines, then the contents of column address register 660 are left unaltered.

The contents of the variable column address register 660 are shifted left three bits by logic unit 672 to create a physical column address which is stored in register 674, with the three least-significant bits 676 at a logic zero.

The variable adjustment register 678 contains only logic zeroes when the lower 32 bits of a word are to be addressed, and contains the value 4 or "0100" bit pattern when the upper 8 bits, if present, of a 40-bit word are to be addressed. The contents of the variable adjustment register 678 are added by an arithmetic unit 680 to the contents of variable column address register 674 to create a column address. The column address is stored in the column address register 684 of the hardware system 682. The contents of variable row address register 664 are written to the row address register 191 in address hardware 682. The content of bit location 692 of the least significant bits in column address register 684, if a logic "1", signals an extended word logic unit 694 to strobe the upper 8 bits of the data latches 118 of FIG. 6. Under control of state machine 150. address multiplexer 196 of FIG. 11 selects among a precharge constant, and the contents of mode register 172, row address register 191, and column address register 684, to provide a multiplexed SDRAM address on bus 124.

The descriptions which follow relate to a method of identifying SDRAM modules, which is referred to below as the auto-ID method. The method is illustrated by the logic flow diagrams of FIGS. 12a–12l, which interact with the data structures of Tables I–IX, XA, and XB, and depict the operations of the CPU 80 as controlled by an operating program stored in ROM 90 of FIG. 6. When a transfer of information (I/O operation) between the memory test system 10 and a memory module occurs, reference is made to the functional block diagrams of FIGS. 6, 7, and 8. More particularly, when an I/O operation falls within the address range of the state machine 150 of FIG. 7, the state machine is activated to follow a sequence of states as depicted in FIG. 9. As a result, the state machine generates state patterns which are decoded by the state decoder 154 to provide timina signals as illustrated by the timing diagrams of FIGS. 20–26. The timing signals indicate those memory test controller 116 signals that are active during a given state of the state machine 150.

FIGS. 12a–12l comprise a logic flow diagram of the operation of CPU 80 in performing an auto-identification (auto-ID) function on a synchronous dynamic random-access memory (SDRAM) module. The auto-ID logic flow process is initiated by a user depressing a key 13b on the memory module tester which is recognized by the user interface program stored in ROM 90 Control thereupon is transferred from logic step 700 of FIG. 12a to logic step 702, where CPU 80 of FIG. 6 sends a command over line 81, bus 82, and line 103 through I/O interface 101 to line 107 to cause the controlled power supply 106 to apply power to line 108. Voltage level translators 110, 111, 112, and 113, UUT adapter 14, UUT sockets 11a and 11b, and SDRAM module 20 are thereby energized.

Figure 12A:
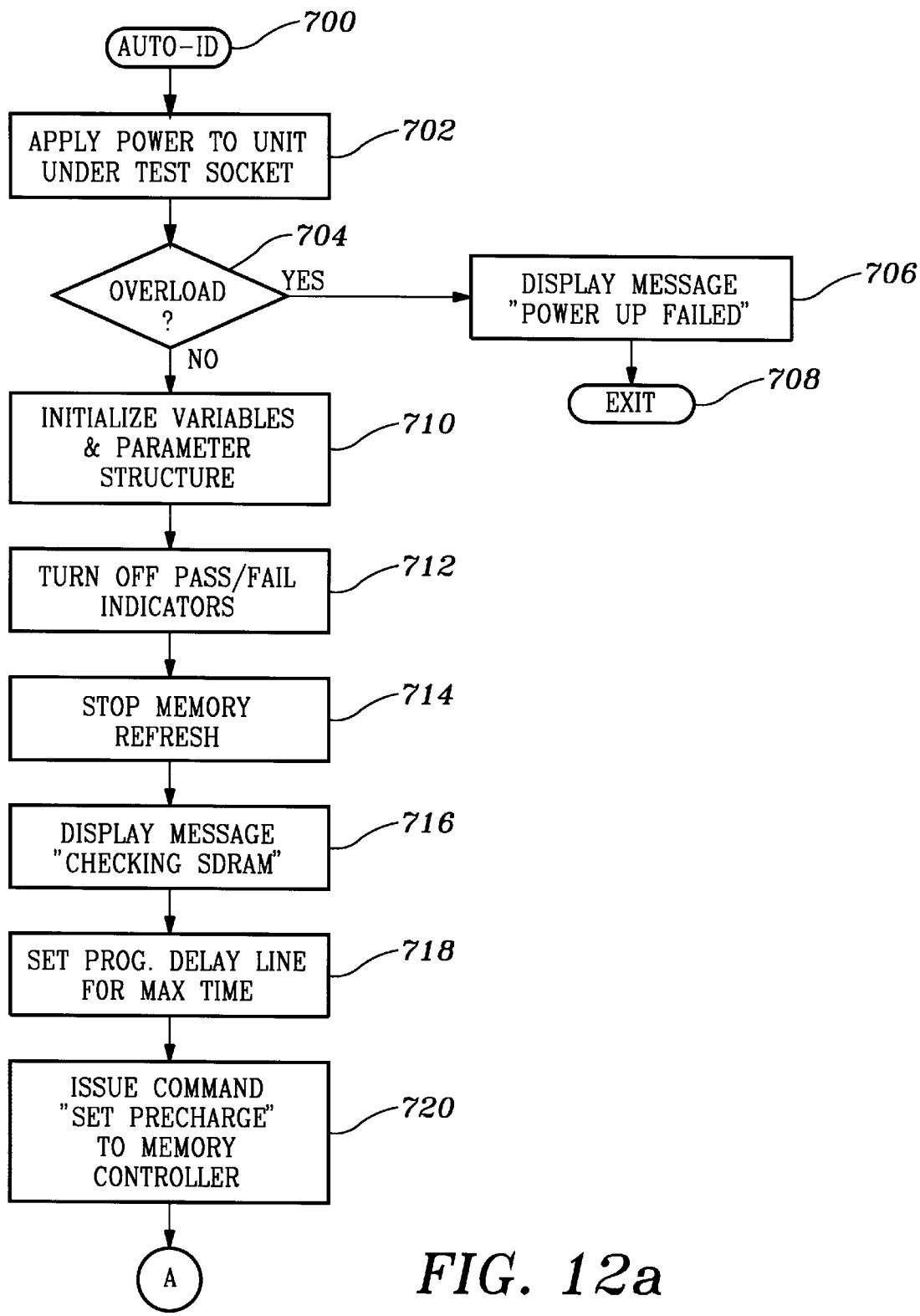

From logic step 702 of FIG. 12a, the logic flow process continues to logic step 704 to test for overload conditions. If controlled power supply 106 of FIG. 6 senses an overload either by overcurrent or by undervoltage, it sends a signal over line 107 to I/O interface 101 that can be sensed under software control at logic step 704 of FIG. 12a. If an overload condition is sensed, the logic flow process proceeds to logic step 706 where the message "Power Up Failed" is sent to display 12 of FIG. 6 by way of I/O interface 101. Thereafter, the logic flow process exits to the user interface program at logic step 708 of FIG. 12a.

If, at logic step 704 no overload condition is sensed, the logic flow process continues to logic step 710, where data structures and variables used in the auto-ID method are cleared to zero for initialization. The logic flow process then proceeds from logic step 710 to logic step 712 where pass and fail indicators in display 12 are turned off. The logic flow process then continues from logic step 712 to logic step 714, where refresh timer 140 of FIG. 6 is stopped. From logic step 714 of FIG. 12a, the logic flow process continues to logic step 716, where the message "Checking SDRAM" is sent to display 12 of FIG. 6 by way of I/O interface 101. Thereafter, the logic flow process proceeds to logic step 718 of FIG. 12a, where the programmable delay line 114 of FIG. 6 is loaded with a constant "MAX_ACCESS_TIME" to permit a relaxed timing tolerance, and to establish the configuration of control lines on the SDRAM module 20 under test.

Figure 26:
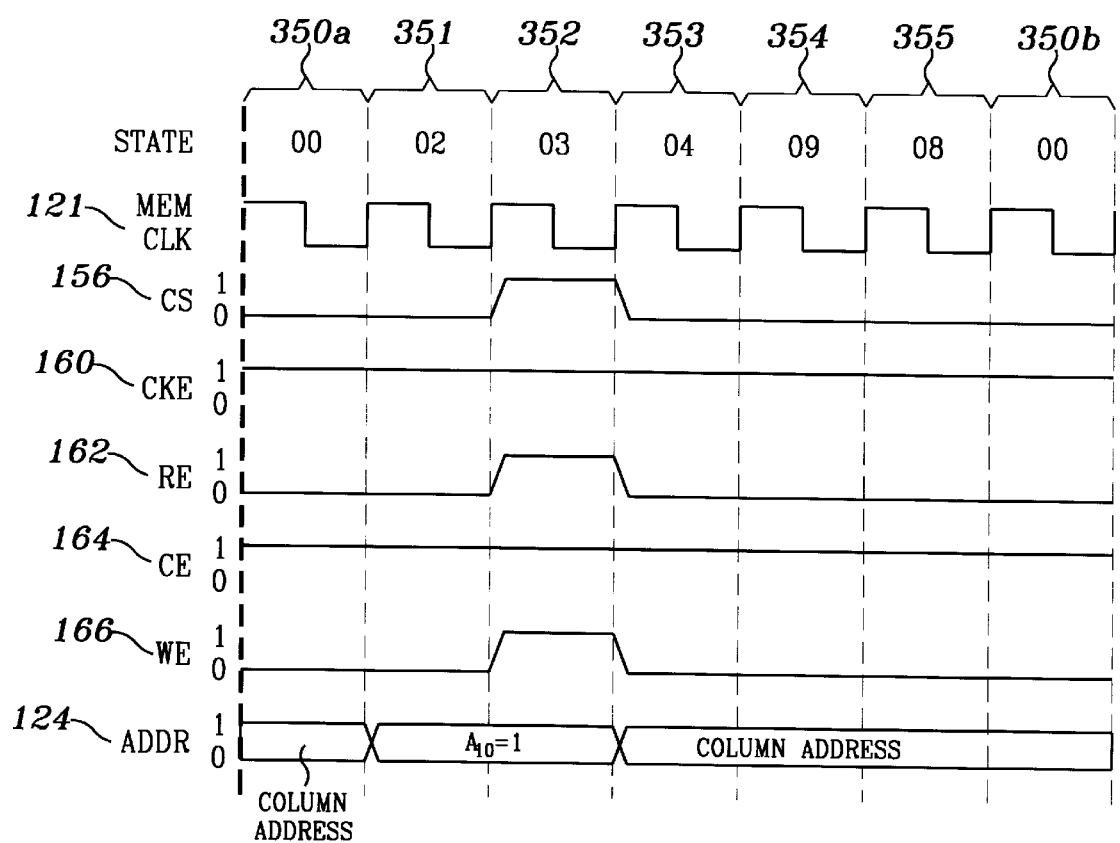
FIG. 26 is a graphical illustration of the timing signals generated by memory test system 10 during a "set precharge" operation on synchronous memory.

From logic step 718 of FIG. 12a, the logic flow process continues to logic step 720, where row address register 191 of FIG. 7 is written with a value having the SDRAM precharge bit Alo set to a logic 1. This is in accordance with JEDEC requirements as part of the post-power-on initialization sequence of UUT 11 of FIG. 6. Register 254 of FIG. 8 is written with a value containing all logic 1's so that all SDRAM ICs will receive the precharge command. A write to the address designated as set precharge command is decoded by port address decoder 175 of FIG. 7, and appears on line 176 to trigger state machine 150. FIG. 26 indicates the logic state of state decoder 154 outputs signals chip select, clock enable, row enable, column enable, write enable, and address bus for each state of state machine 150 during the precharge command.

Upon the next cycle of a memory clock signal on line 121 of FIG. 6, idle state 350 of FIG. 9 is exited and state 351 is entered. State machine 150 of FIG. 7 then causes the state decoder 154 to output address multiplexor select signals on line 168 to route the contents of row address register 191 through the address multiplexer 196 to the memory address bus 124. Row address register 191 was previously programmed with a logic 1 in bit 10 in accordance with JEDEC recommendations for SDRAMs, thus signifying a precharge of all SDRAM ICs of the bank under test. After the next cycle of the memory clock signal on line 121 of FIG. 6, state 352 of FIG. 9 is entered by the state machine. The state decoder 154 of FIG. 7 thereupon asserts a chip select signal on line 156, a row enable signal on line 162, and a write enable signal on line 166. After the next cycle of the memory clock signal on line 121 of FIG. 6, the state machine enters state 353 of FIG. 9, where the state decoder 154 of FIG. 7 de-asserts (no signals applied) control lines 156, 160, 162, 164, and 166. Upon the next memory clock cycle on line 121 of FIG. 6, the state machine enters state 354 of FIG. 9. Upon the next cycle of memory clock signal on line 121 of FIG. 6, state 355 of FIG. 9 is entered, and upon the next succeeding cycle of the memory clock signal on line 121, the idle state 350 is entered to await the next command. Following the completion of the precharge command, a write to set mode command is decoded by port address decoder 175 of FIG. 7, and appears on line 197 to trigger state machine 150 of FIG. 7.

Figure 25:
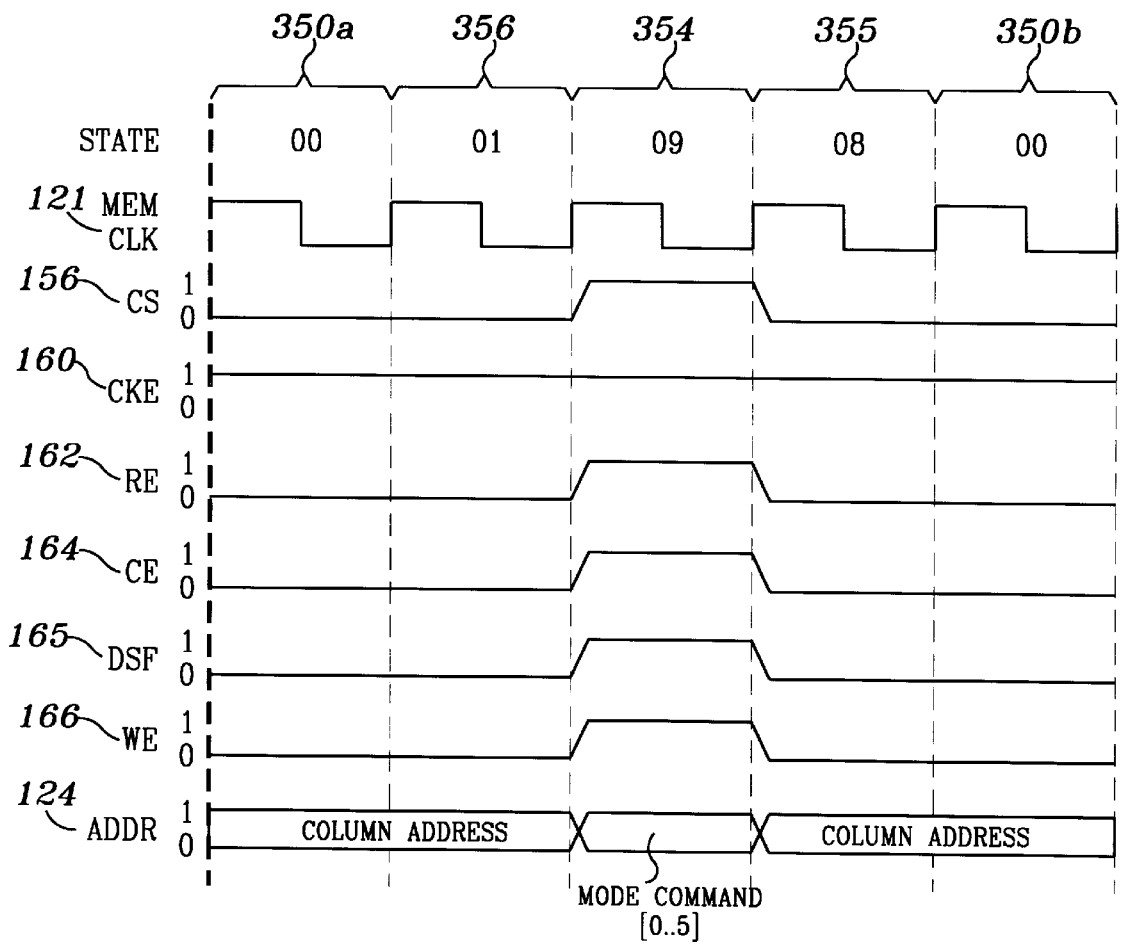
FIG. 25 is a graphical illustration of the timing signals generated by memory test system 10 during a "set mode" operation on synchronous memory.

From logic step 720 of FIG. 12a, the logic flow process continues through node A to logic step 722 of FIG. 12b, where a mode command is issued by address multiplexer 196 of FIG. 7 to configure memory test controller 116 of FIG. 6 for a burst length of one, a sequential wrap, and a CAS latency of three as described in more detail below. FIG. 25 indicates the logic state of state decoder 154 outputs signals chip select, clock enable, row enable, column enable, write enable, and address bus for each state of state machine 150 during the set mode command.

When a set mode signal on line 177 of FIG. 7 is received by state machine 150, the state machine exits idle state 350 of FIG. 9 upon the next cycle of the memory clock signal on line 121 of FIG. 6, and enters state 356 of FIG. 9. Upon the next cycle of the memory clock, the state machine continues to state 354, where state decoder 154 of FIG. 7 asserts a chip select signal on line 156, a row enable signal on line 162, a column enable signal on line 164 and a write enable signal on line 166. The state machine further causes the state decoder 154 to issue a select control signal on line 168 to route mode bits [5 . . . 0] of mode register 172 through the address multiplexer 196 to memory address bus 124. Following state 354 of FIG. 9, the operation of state machine 150 continues as before described. By the time state machine 150 reaches idle state 350, the UUT will have been successfully programmed for burst, wrap, and CAS latency parameters.

Figure 12B:
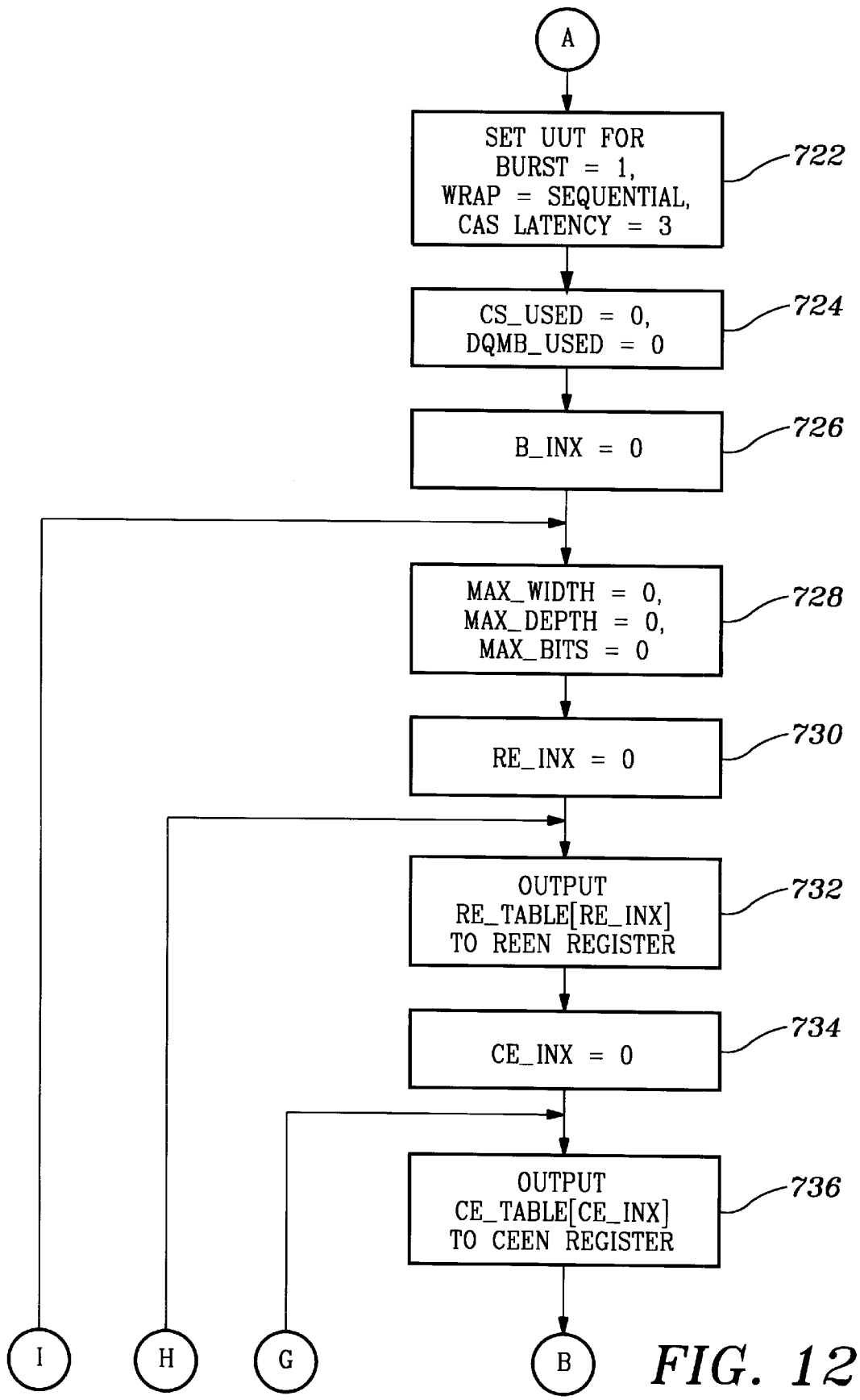

Following logic step 722 of FIG. 12b, memory module 20 is ready to accept read and write operations necessary to test the trial settings of CS lines 32, DQMB lines 33, CKE lines 34, RE lines 35, and CE lines 36 of FIG. 3. The logic flow process continues from logic step 722 of FIG. 12b to logic step 724, where variables CS_USED and DQMB_USED are reset to logic zero in preparation for use as accumulators of the CS lines 32 and the DQMB lines 33 which are used by the memory module 20.

From logic step 724, the logic flow process proceeds to logic step 726, where the variable B_INX is reset to zero for use as a loop counter, and thereafter indexed to a bank structure as will be described below in connection with the description of FIG. 17. From logic step 726, the logic flow process continues to logic step 728, where the variables MAX_WIDTH, MAX_DEPTH, and MAX_BITS are reset to zero for use as peak-value holders of the maximum width found, the maximum depth found, and the maximum number of functioning bits found in memory module 20.

From logic step 728, the logic flow process continues to logic step 730, where variable RE_INX is reset to zero for use as an index into the RE_TABLE I row enable entries which will be further explained below. The logic flow process proceeds from logic step 730 to logic step 732, where the contents of the row enable RE_TABLE I are indexed by the variable RE_INX and output by CPU 80 of FIG. 6 by way of busses 81, 82, 120, and 192 of FIGS. 6 and 7 to the RE bits of the CKE/RE/CE enable register 254 of FIG. 8. The RE lines 35 corresponding to logic 1's in the indexed RE_TABLE I thereby are enabled.

RE_TABLE I

| INDEX | BIT 7654 3210 |
|---|---|
| 0 | 0000 0001 |
| 1 | 0000 0011 |
| 2 | 0000 0000 |

CE_TABLE II

| INDEX | BIT 7654 3210 |
|---|---|
| 0 | 0000 0001 |
| 1 | 0000 0011 |
| 2 | 0000 0000 |

CS_TABLE III

| INDEX | BIT 7654 3210 |
|---|---|
| 0 | 0000 0001 |
| 1 | 0000 0010 |
| 2 | 0000 0100 |
| 3 | 0000 1000 |
| 4 | 0000 0011 |
| 5 | 0000 0101 |
| 6 | 0000 0000 |

DQMB_TABLE IV

| INDEX | BIT 7654 3210 |
|---|---|
| 0 | 0000 0001 |
| 1 | 0000 0011 |
| 2 | 0000 1111 |
| 3 | 1111 0000 |
| 4 | 0000 0000 |

PARTS_LIST V

| INDEX | RA | CA | DEPTH | DEVICE TYPE |
|---|---|---|---|---|
| 0 | 0 | 0 | 0 | "NONE" |
| 1 | 10 | 8 | 256K | "256K × 32" |
| 2 | 12 | 8 | 1M | "1M × 16" |
| 3 | 12 | 9 | 2M | "2M × 8" |
| 4 | 12 | 10 | 4M | "4M × 4" |
| 5 | 14 | 8 | 4M | "4M × 16" |
| 6 | 14 | 9 | 8M | "8M × 8" |
| 7 | 14 | 10 | 16M | "16M × 4" |

MODULE PARAMETER STRUCTURE TABLE VI

| VARIABLE | DESCRIPTION |
|---|---|
| ID_VALID | Flag initialized to FALSE value and set to TRUE when, after the completion of all nested loops, variable TOTAL_WIDTH is greater than zero. |
| TOTAL_WIDTH | Total width in bits of memory module 20. Equal to the sum of the widths of Bank 0 and Bank 1. |
| B[0] | Data structure for Bank 0. |
| B[1] | Data structure for Bank 1. |
| B[2] | Data structure for Bank 2. |
| B[3] | Data structure for Bank 3. |
| TOTAL_BANKS | Number of banks on memory module, typically 1, 2, or 4 (maximum). |
| TOTAL_DEPTH | Total depth in words of memory module 20. Equal to the sum of the depths of all banks. |
| REFRESH_MODE | Flag which holds the value BURST or value DISTRIB (distributed), representing the type of refresh cycles to perform. |
| REFRESH_PERIOD | Variable containing a value representing the number of milliseconds elapsed between refresh cycles, typically between 4 and 128. |
| PATTERN[0] | First test pattern, initialized to all hexadecimal A's. |
| PATTERN[1] | Second test pattern, initialized to all hexadecimal 5's. |
| ACCESS_TIME | Measured access time in nanoseconds of module 20. |
| BURST_TYPE | Flag which holds value SEQ (sequential) or value WRAP, representing the type of burst programmed into SDRAM ICs in module 20. |
| BURST_LENGTH | Variable containing number of successful memory burst cycles performed by module 20, typically eight (8). |
| CAS_LATENCY | Variable containing number of memory cycles which must elapse before data is valid. |
| PD_BITS_VALID | Flag initialized to FALSE value and set to TRUE upon successful read of PD memory 75. |
| PD_BITS[0] | Contents of location 0 of PD memory. |
| PD_BITS[255] | Contents of location 255 of PD memory. |
| MOD_PACKAGE | Variable indicating module packages: SO DIMM 144, DIMM 168, etc. |

PER-BANK STRUCTURE TABLE VII

| VARIABLE | DESCRIPTION |
|---|---|
| VALID | Flag initialized to FALSE value and set to TRUE in step 790 when the currently tested bank is larger than any previously tested bank is found. |
| RE_CONTROL | Variable used to hold pattern of which RE enable lines are connected to the currently tested bank. |
| CE_CONTROL | Variable used to hold pattern of which CE enable lines are connected to the currently tested bank. |
| DQMB_CONTROL | Variable used to hold pattern of which DQMB enable lines are connected to the currently tested bank. |

PER-BANK STRUCTURE TABLE VII

| VARIABLE | DESCRIPTION |
|---|---|
| CS_CONTROL | Variable used to hold pattern of which CS enable lines are connected to the currently tested bank. |
| PART_INDEX | Variable used to hold index into read-only PARTS_LIST Table V, indicating which part(s) the bank is comprised of. |
| DEPTH | Variable used to hold depth in words of the currently tested bank as determined by the CHECK DEPTH subroutine. |
| WIDTH | Variable used to hold width in bits of the currently tested bank as determined by the CHECK WIDTH subroutine. |

VARIABLE TABLE VIII

| VARIABLE | DESCRIPTION |
|---|---|
| CS_USED | Variable containing one flag per bit, initialized to all FALSE values, and flags set to TRUE corresponding to four (4) CS lines used on module 20. |
| DQMB_USED | Variable containing one flag per bit, initialized to all FALSE values, and flags set to TRUE corresponding to eight (8) DQMB lines used on module 20. |
| B_INX | Variable used to hold value of index selecting one of four (4) per-bank structures to be processed by auto-ID algorithm. Range is 0 . . . 3. |
| MAX_WIDTH | Variable used to record maximum bank width detected for any previous bank operations within auto-ID algorithm. Allowable range is 1 . . . 40. |
| MAX_DEPTH | Variable used to record maximum bank depth detected for any previous bank operations within auto-ID algorithm. |
| MAX_BITS | Variable used to record maximum number of working bits detected for any previous bank operations within auto-ID algorithm. Range is 1 . . . 40. |
| RE_INX | Variable used both as a loop counter and to hold value of index selecting one entry in the read-only RE enable table. |
| CE_INX | Variable used both as a loop counter and to hold value of index selecting one entry in the read-only CE enable table. |
| CS_INX | Variable used both as a loop counter and to hold value of index selecting one entry in the read-only CS enable table |
| DQMB_INX | Variable used both as a loop counter and to hold value of index selecting one entry in the read-only DQMB enable table. |
| FOUND | Flag initialized to FALSE value and set to TRUE value if, when scanning patterns of previously used CS and DQMB lines during the current DQMB lines trial, CS enable lines of the current trial have already been used as fagged in CS_USED, and DQMB enable lines of the current trial have already been used as flagged in DQMB_USED. |
| SCAN | Variable used to hold iteration value of loop counter. Range is 0 . . . 3. |
| PART_INX | Variable used both as a loop counter and to hold value of index selecting on entry in the read-only PART_LIST table. |
| WIDTH | Variable used to hold width in bits as determined by the CHECK WIDTH subroutine of current bank undergoing the auto-ID algorithm. Range is 1 . . . 40. |
| BITS | Variable used to hold number of working bits as determined by the CHECK WIDTH subroutine of current bank undergoing the auto-ID algorithm. Range is 1 . . . 40. |
| RESPONSE | Flag set to TRUE value or FALSE value by CHECK WIDTH and CHECK DEPTH subroutines according to whether the memory checked was responding. |
| DEPTH | Variable used to hold depth in words as determined by the CHECK DEPTH subroutine of the current bank undergoing the auto-ID algorithm. |
| ADAPTER_ID | Variable used to store the 8-bit ID code of the UUT adapter. |
| CUR_SPEED | Variable used both as a loop counter and to hold the current access time in nanoseconds within the access time measuring loop comprised of steps 852 through 866. |
| I | Variable used as temporary general-purpose loop counter, with no other significance outside of loop. |
| TIMER | Global variable incremented by processor interrupt routine at approximately 66-Hz rate. May be cleared locally by a routine and periodically sampled and compared to a limit constant by same routine checking for expiration of an arbitrary time. |
| PAGE_OK | Flag set to TRUE value or FALSE value by CHECK PAGE subroutine according to whether the memory page checked was at least as deep as indicated by the specifications for the part tested by the Auto-ID algorithm. |

CONSTANTS TABLE IX

MAX_BANKS = 4
MAX_PARTS = 6
INC_SPEED = 2 ns
MIN_ACCESS_TIME = 5 ns
MAX_ACCESS_TIME = 30 ns
REF_PERIOD = 8 ms
REF_BURST = 0
WRAP_SEQ = 0

WIDTH_TABLE XA

| INDEX | VALUE |
|---|---|
| 0 | 0 |
| 1 | 1 |
| 2 | 4 |
| 3 | 4 |
| 4 | 4 |
| 5 | 8 |
| 6 | 8 |
| 7 | 8 |
| 8 | 8 |
| 9 | 9 |
| 10 | 16 |
| 11 | 16 |
| 12 | 16 |
| 13 | 16 |
| 14 | 16 |
| 15 | 16 |

-continued

WIDTH_TABLE XA

| INDEX | VALUE |
|---|---|
| 16 | 16 |
| 17 | 18 |
| 18 | 18 |
| 19 | 32 |
| 20 | 32 |

WIDTH TABLE XB

| INDEX | VALUE |
|---|---|
| 21 | 32 |
| 22 | 32 |
| 23 | 32 |
| 24 | 32 |
| 25 | 32 |
| 26 | 32 |
| 27 | 32 |
| 28 | 32 |
| 29 | 32 |
| 30 | 32 |
| 31 | 32 |
| 32 | 32 |
| 33 | 36 |
| 34 | 36 |
| 35 | 36 |
| 36 | 36 |
| 37 | 40 |
| 38 | 40 |
| 39 | 40 |
| 40 | 40 |

The logic flow process continues from logic step 732 of FIG. 12b to logic step 734, where the variable CE_INX is reset to zero for use as an index into the column enable entries of CE_TABLE II. From logic step 734, the logic flow process proceeds to logic step 736 where the contents of CE_TABLE II are indexed by variable CE_INX and output by CPU 80 of FIG. 6 onto busses 81, 82, 120, and 193 of FIGS. 6 and 7 that lead to the CE bits of the CKE/RE/CE enable register 254 of FIG. 8. The CE lines 36 of FIG. 3 corresponding to logic 1's in the indexed CE_TABLE II thereby are enabled.

Figure 12C:
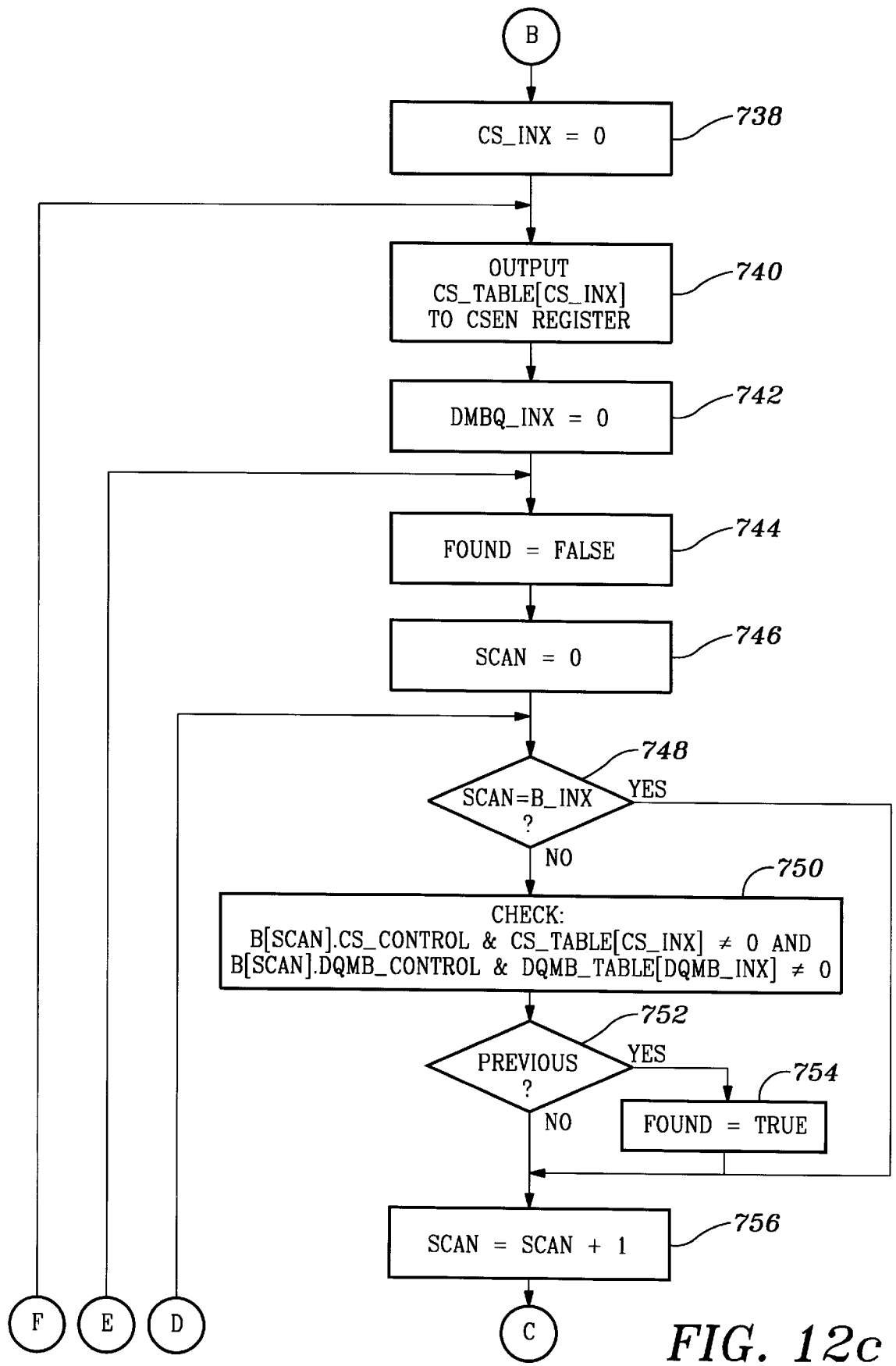

From logic step 736 of FIG. 12b, the logic flow process continues through node B to 10 logic step 738 of FIG. 12c. At logic step 738, the variable CS_INX which is stored in RAM 93 is reset to zero in preparation for use as an index into CS_TABLE III. From logic step 738, the logic flow process continues to logic step 740 where the contents of the CS_TABLE III are indexed by the variable CS_INX, and output to the CS enable register 250 of control logic 192 of FIG. 8. The CS lines 32 corresponding to logic 1's in the indexed CS_TABLE III thereby are enabled.

From logic step 740, the logic flow process continues to logic step 742 where the variable DQMB_INX stored in RAM 93 is reset to zero for use as an index into the DQMB_TABLE IV. From logic step 742, the logic flow process proceeds to logic step 744 where a flag variable "FOUND" stored in RAM 93 is reset to false. Thereafter, at logic step 746, the variable "SCAN" stored in RAM 93 is reset to zero for use as a secondary index into the SDRAM Per Bank Structures Table VII.

The logic flow process then continues to logic step 748, where a check is made to see if the bank of SDRAM ICs whose structure is about to be checked as represented by the variable SCAN, is the same as the bank of SDRAM ICs whose control lines are currently being tested, as represented by the variable B_INX stored in the RAM 93. If the structures as represented by the variables SCAN and B_INX are the same, the logic flow process proceeds to logic step 756. If not, the logic flow process continues from logic step 748 to logic step 750, where a check is made for previous use of currently tested CS lines 32 or DQMB lines 33. That is, the CS_CONTROL and DQMB_CONTROL entries of the Per-Bank Structure Table VII are examined by (1) performing a bit-wise AND of the CS_CONTROL entry of Table VII with the corresponding entry in the CS_TABLE III indexed by the variable CS_INX stored in RAM 93, and (2) performing a bit-wise AND of DQMB_CONTROL in the Per-Bank Structure Table VII with the entry in DQMB_TABLE IV indexed by the variable DQMB_INDEX stored in RAM 93. If both of the AND results are nonzero, a flag indicating that the currently tested CS and DQMB lines were previously used is set.

From logic step 750 of FIG. 12c, the logic flow process continues to logic step 752 where the flag previously set to indicate previous use at logic step 750 is sensed. If the flag is found to have been set, the logic flow process continues to logic step 754 where the variable FOUND is set to TRUE. The logic flow process then continues to logic step 756. If, on the other hand, the flag previously set in logic step 750 tests false, the logic flow process proceeds directly to logic step 756, where the variable SCAN is incremented by one. From logic step 756, the logic flow process moves through node C to logic step 758 of FIG. 12d., where the variable SCAN is compared to a constant MAX_BANKS that is stored in RAM 93. If SCAN is less than MAX_BANKS, the logic flow process loops back through node D to logic step 748 of FIG. 10 12c to begin to process a next SDRAM IC bank.

When the variable SCAN in the Variables Table VIII equals or exceeds the value of MAX_BANKS at logic step 758, the logic flow proceeds to logic step 760, where the variable FOUND of Table VIII is tested. If the variable FOUND is TRUE, the logic flow process jumps by way of node K of FIG. 12d to logic step 794 of FIG. 12f to signify that there was at least one instance found in which the current combination of CS lines 32 and DQMB lines 33 were used. Conversely, if the variable FOUND is false at logic step 760, the logic flow process continues to logic step 762, where the contents of the DQMB_TABLE IV are indexed by the variable DQMB_INX of Table VIII stored in RAM 93, and are output to the DQMB enable register 252 of control enable logic 192 of FIG. 7. The DQMB lines 33 corresponding to logic 1's in the indexed DQMB_TABLE IV thereby are enabled.

Figure 12D:
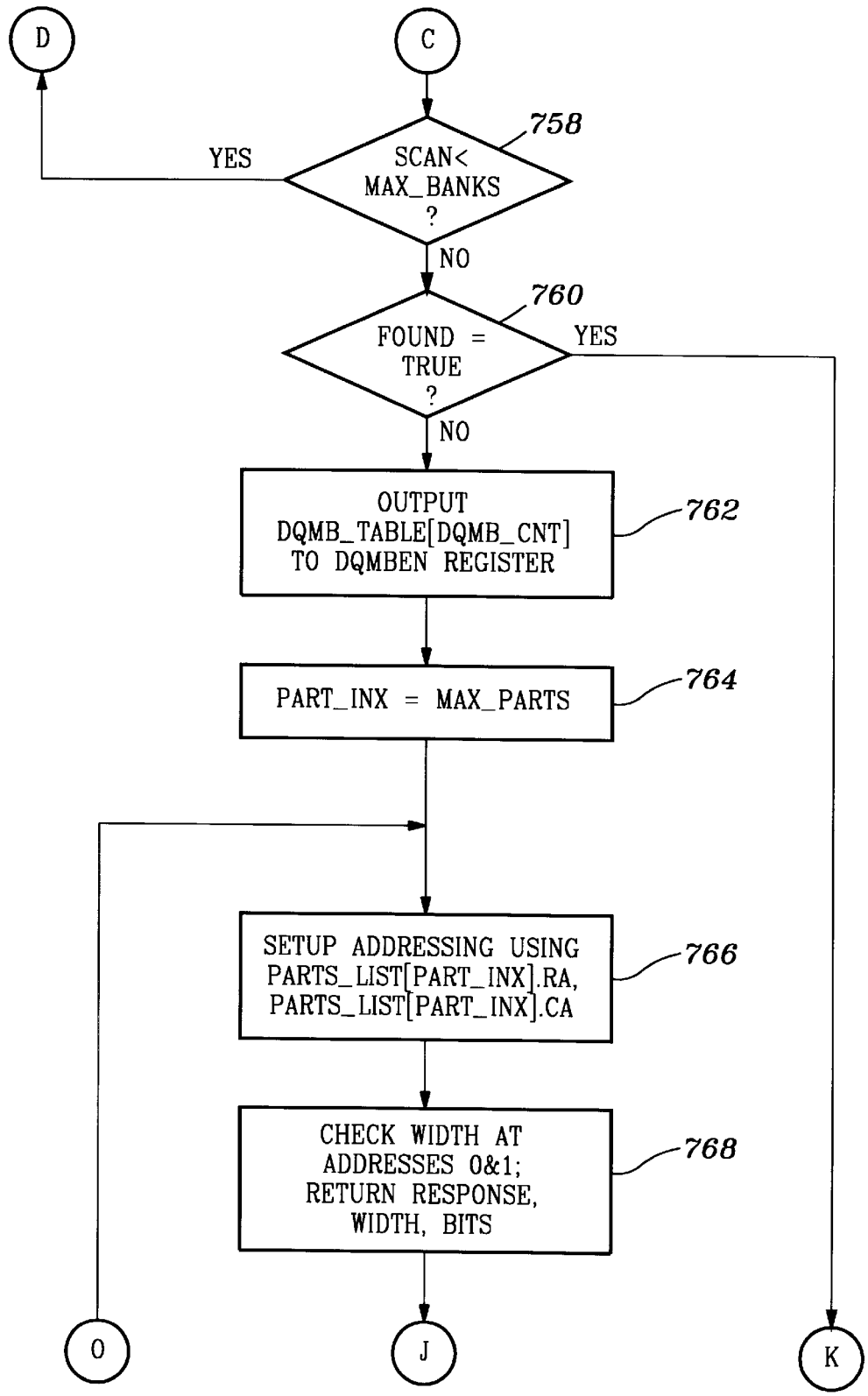

From logic step 762 of FIG. 12d, the logic flow process proceeds to logic step 764, where the variable PART_INX Table VIII that is stored in RAM 93 is initialized to the value of a constant MAX_PARTS of the Constants Table IX for use as an index into the PARTS_LIST Table V. From logic step 764 of FIG. 12d, the flow proceeds to logic step 766, where the partitioning of the multiplexed addressing is setup by using the variable PART_INX of Table VIII as an index into the PARTS_LIST Table V to both extract a value representing the number of row address bits RA, and extract a value representing the number of column address bits CA.

Logic step 766 establishes how, using a combination of software and hardware, a virtual memory word address may be generated and partitioned into variable-width row and variable-width column constituents to address SDRAMs with differing address dimensions. Referring to FIG. 11, the previously obtained number of row address bits and number of column address bits are stored into RA register 652 and CA register 654, respectively. The contents of the variable CA register 654, representing the number of column address bits, are operated upon by a bit mask processor 656, where a value is created with as many logic 1's starting from the least-significant bit (lsb) as the incoming value. For example, if the value stored in CA register 654 is a binary 9, then the output of the bit mask processor 656 is binary 0000000111111111 or hexadecimal 0.1FF. At logic AND 658, the contents of virtual column address register 650 are bit-wise AND'ed with the mask produced by the processor 656 to extract a first column address from register 660. The number of column address bits defined by variable CA register 654 are removed from the virtual column address register 650 by shift register 662. More particularly. the bits in the virtual address are shifted right by the number of places defined by the variable CA register 654, and logic 0's are shifted into the vacated positions to form a row address 664.

In accordance with JEDEC, high-order row address bit(s) as identified by reference number 666 select one of two or four SDRAM IC arrays internal to the SDRAM ICs. According to the number of row address bits in variable RA register 652, bank bits logic 668 extracts the most significant bit of the row address stored in register 664 if the contents of RA register 652 have the value 12. The bank bits logic 668 further extracts the two most significant bits of the row address stored in register 664 if the content of RA register 652 is equal to 14. The banks bit logic then performs a bit-wise logical OR of the extraction into the most significant bit(s) 670 of first column address register 660. Next, shift register 672 shifts bits of first column address register 660 left by three places, with logic 0's entering the vacated bit positions 676 to form a physical column address in register 674. Shifting left by three effectively multiplies by eight, which is necessary to address a possible 40-bit- or 5-byte-wide word spanning eight physical byte locations, with the addresses of the three most significant bytes being unused.

Bank word widths of 32 or fewer bits may be transferred in one bus cycle by the 32-bit RISC CPU 80. However, bank word widths greater than 32 bits, such as 40 bits, necessitate an extra bus cycle for a single word to be written or read. When it is necessary to address the bits in a word greater than 32 bits, variable adjustment register 678 contains the value 4, which is added by the binary adder 680 to the content of the physical column address register 676. The output of binary adder 680 is stored in column address register 684. By numbering the bits in the second column address register 684, and assigning $A_0$ to the lsb and counting leftward, access of the bits in a word above 32 bits in length is signified. Bits $A_0$ and $A_1$ allow hardware byte addressing within a 32-bit word and are ignored by the hardware system 682.

Returning to FIG. 12d, the logic flow process continues from logic step 766 to logic step 768, where the width of the SDRAM IC bank defined by the trial settings of the CS lines 32, DQMB lines 33, CKE lines 34, RE lines 35, and CE lines 36 of FIG. 3 is sensed by a CHECK_WIDTH logic flow as described in connection with the description of FIG. 13 below. From logic step 768 of FIG. 12d, the logic flow process moves through node J to logic step 770 of FIG. 12e, where the result of the operation of the CHECK_WIDTH logic is tested to determine if any response from the memory module 20 has been detected. If not, the logic flow process jumps from logic step 770, through node N to logic step 792 of FIG. 12f. Conversely, if a response is detected at logic step 770, the logic flow process continues to logic step 772.

At logic step 772, the variable WIDTH of a module is determined by executing the logic flow of FIG. 13 as will be explained in more detail below, and if the WIDTH is found to be greater than the variable MAX_WIDTH of Table VIII, the logic flow process continues to logic step 774. Otherwise, if the trial settings of the control lines of a bank of SDRAM ICs have not been found to be larger than the variable MAX_WIDTH, the logic flow process jumps through node L to logic step 784 of FIG. 12f. Logic step 772 thus assists in detecting a new bank of SDRAM ICs by recognizing a larger width attribute.

At logic step 774, the logic flow process determines the depth (number of words) of the bank as defined by the trial settings of the CS lines 32, DQMB lines 33, CKE lines 34, RE lines 35, and CE lines 36 of FIG. 3, and as measured by the CHECK_DEPTH logic flow of FIG. 14 by using the variable DEPTH of PARTS_LIST Table V indexed by the variable PART_INX. Upon execution of the logic steps of FIG. 14, the logic flow process returns to logic step 774 of FIG. 12e. From logic step 774, the logic flow process continues to logic step 776 to determine whether there was a response from the bank of ICs under test during the execution of logic step 774. If there was a response, the logic flow process proceeds to logic step 778, where the variable DEPTH of Table VIII is overwritten with the DEPTH entry of the PARTS_LIST Table V indexed by the variable PART_INX of Table VIII. Conversely, if there was no response, the logic flow process proceeds directly from logic step 778 to logic step 780.

At logic step 780, a determination is made whether a response from the bank of ICs under test occurred during the execution of logic step 774, whether the variable DEPTH is greater than the variable MAX_DEPTH, whether the variable WIDTH is greater than the variable MAX_WIDTH, or whether the variable BITS is greater than the variable MAX_BITS. From logic step 780, the logic flow proceeds to logic step 782, where the result of the logic step 780 determinations is tested. If no response was detected from the bank of ICs under test, and none of the tested parameters were greater than the variables to which they were compared, the logic flow process jumps by way of node L to logic step 784 of FIG. 12f. Conversely, if any of the results of logic step 780 were true, the logic flow process proceeds through node M to logic step 788 of FIG. 12f. Logic step 782 thus aids in recognizing a bank with greater depth, width or number of working bits.

From either the false response from logic step 772, or the false response of logic step 782, the logic flow process enters logic step 784, where the variable PART_INX of Table VIII is decremented by one. The logic flow continues to logic step 786, where a determination is made whether the variable PART_INX is greater than zero. If true, the logic flow process loops back through node O to logic step 766 of FIG. 12d for a next iteration. When the variable PART_INX is decremented to zero at logic step 784, the logic flow process will proceed from logic step 786 to logic step 792.

Figure 12E:
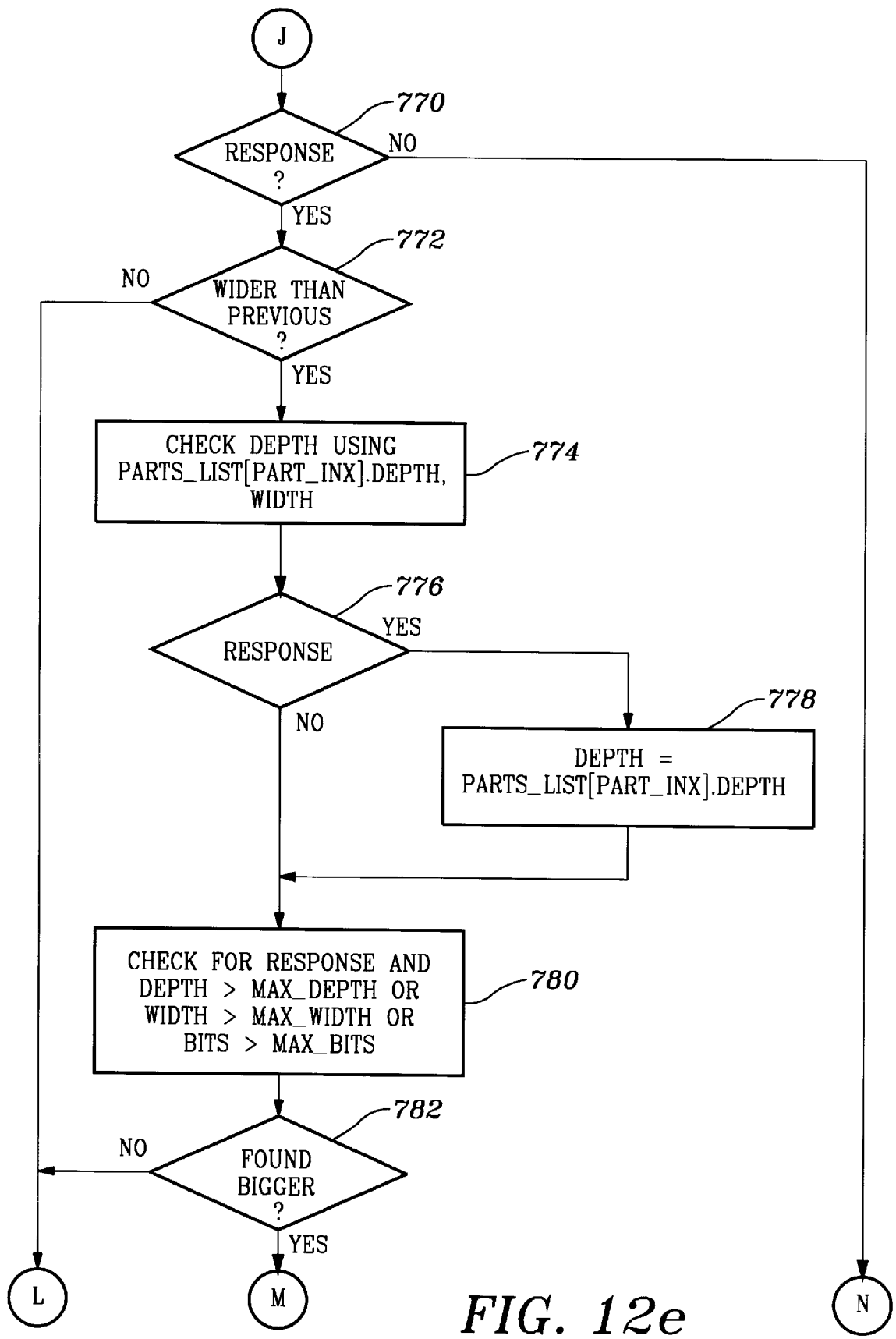
Figure 12F:
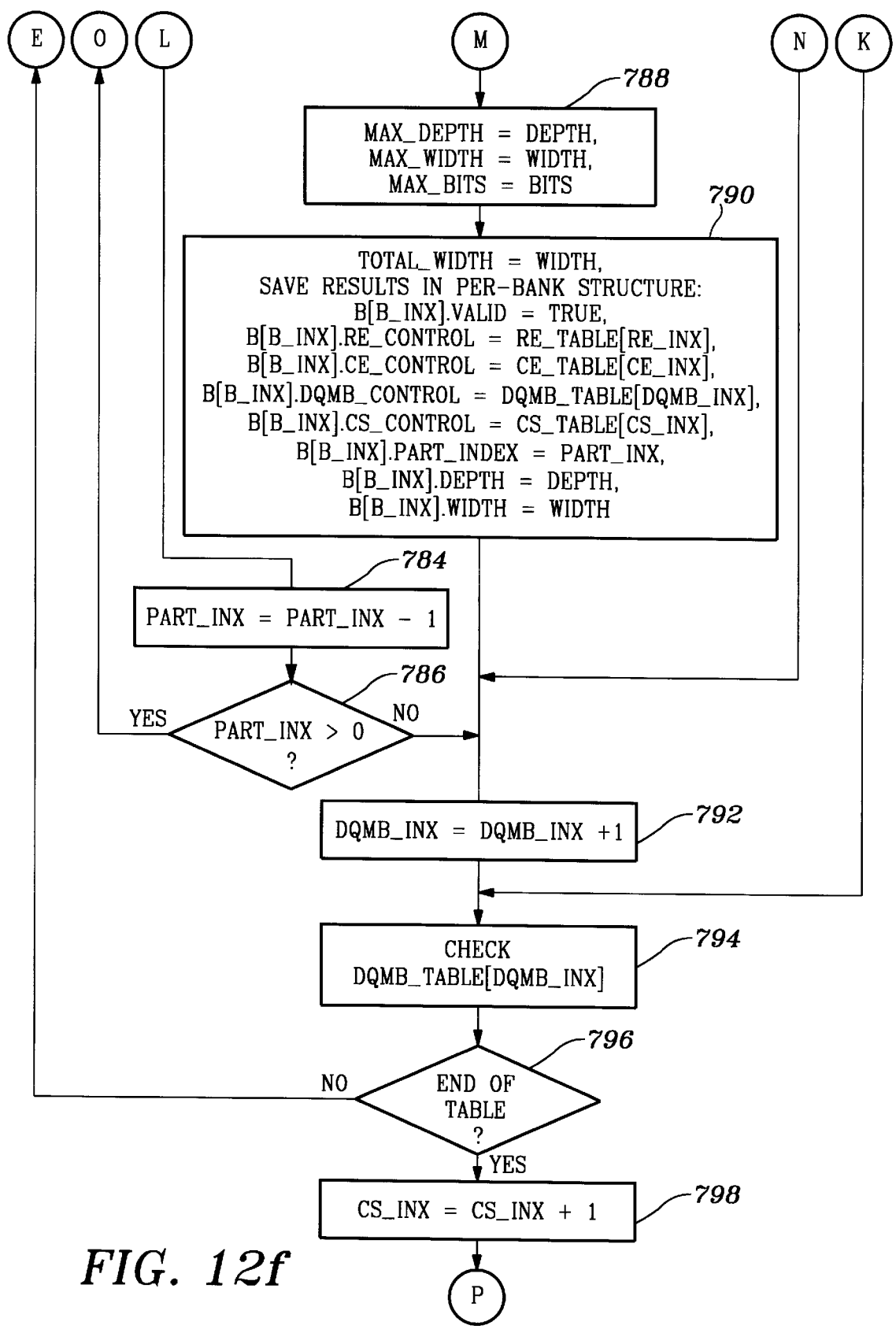

When a larger bank of SDRAM ICs is found at logic step 782 of FIG. 12e, the logic flow process continues to logic step 788 of FIG. 12f, where the variables DEPTH, WIDTH, and BITS are stored in the variables MAX_DEPTH, MAX_WIDTH, and MAX_BITS of Table VIII, respectively. Logic step 788 causes the largest dimensions of any bank that is checked to be retained in RAM 93.

From logic step 788, the logic flow process continues to logic step 790, where the variable TOTAL_WIDTH of The Module Parameter Structure Table VI is set to the entry WIDTH of Table VIII, and the Per-Bank Structure Table VII for the bank of SDRAM ICs currently being checked (B[B_INX])is flagged valid and loaded with the current trial parameter settings for the RE, CE, DQMB, CS, PART, DEPTH, and WIDTH variables. The variable B_INX serves as the index to a particular per-bank structure of Table VII. More particularly, the element VALID of Table VII is set to TRUE; element RE_CONTROL is set to the contents of the RE_TABLE I indexed by the variable RE_INX; element CE_CONTROL is set to the contents of the CE_TABLE II indexed by the variable CE_INX; element DQMB_CONTROL is set to the contents of the DQMB_TABLE IV indexed by the variable DQMB_INX; element CS_CONTROL is set to the contents of the CS_TABLE III indexed by the variable CS_INX; element PART_INDEX is set to the contents of the variable PART_INX of Table VIII; the element DEPTH is set to the contents of the variable DEPTH of Table VIII; and the element WIDTH is set to the contents of the variable WIDTH of Table VIII.

From logic step 790 of FIG. 12f, the logic flow process continues to logic step 792 where the variable DQMB_INX of Table VIII is incremented by one. The logic flow process then continues to logic step 794, where a determination is made whether the variable DQMB_INX of Table VIII has indexed the null entry of the DQMB_TABLE of Table IV. If not, the logic flow process indicates that an end of table condition does not exist by proceeding through logic step 796, and looping back by way of node E to logic step 744 of FIG. 12c for a next iteration. Conversely, if the end of the DQMB_TABLE is sensed, the logic flow continues from logic step 796 to logic step 798, where the variable CS_INX of Table VIII is incremented by 1.

Figure 12G:
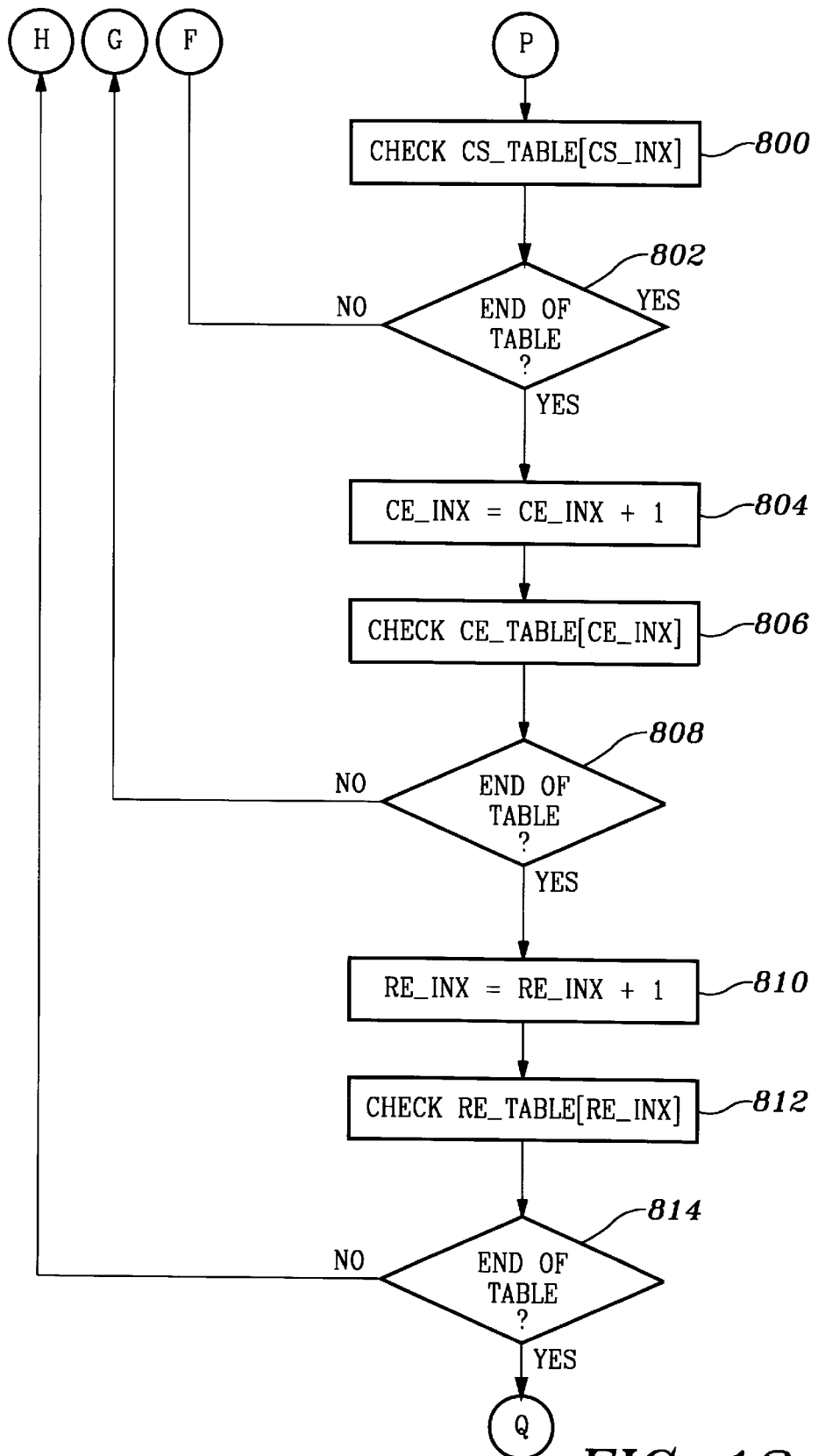

From logic step 798 the logic flow continues through node P to logic step 800 of FIG. 12g, where a check is made to see if variable CS_INX of Table VIII has indexed the null entry of the CS_TABLE III. If not, the logic flow process loops back from logic step 802 to node F leading to logic step 740 of FIG. 12c for a next iteration. Conversely, if the end of CS_TABLE III is sensed at logic step 802, the logic flow process proceeds from logic step 802 to logic step 804, where the variable CE_INX of Table VIII is incremented by 1.

The logic flow then continues from logic step 804 to logic step 806, where a determination is made whether the variable CE_INX of Table VIII has indexed the null entry in the CE_TABLE II. From logic step 806, the logic flow continues to logic step 808 where a detection for an end of table condition again is made. If the logic flow process is not at the end of the CE_TABLE, the logic flow loops back through node G to logic step 736 of FIG. 12b for a next iteration. Conversely, if a end-of-table condition is detected at logic step 808, the logic flow continues to logic step 810 where the variable RE_INX of Table VIII is incremented by 1.

The logic flow process then continues to logic step 812, where a determination is made as to whether the variable RE_INX has indexed the null entry in the RE_TABLE I. From logic step 812 the logic flow continues to logic step 814, where an end-of-table condition is indicated if the null entry has been indexed, and the logic flow process proceeds through node Q to logic step 816 of FIG. 12h. If no null entry is detected at logic step 812, an end-of-table condition is not indicated at logic step 814, and the logic flow process loops back through node H to logic step 732 of FIG. 10b for a next iteration.

Figure 12H:
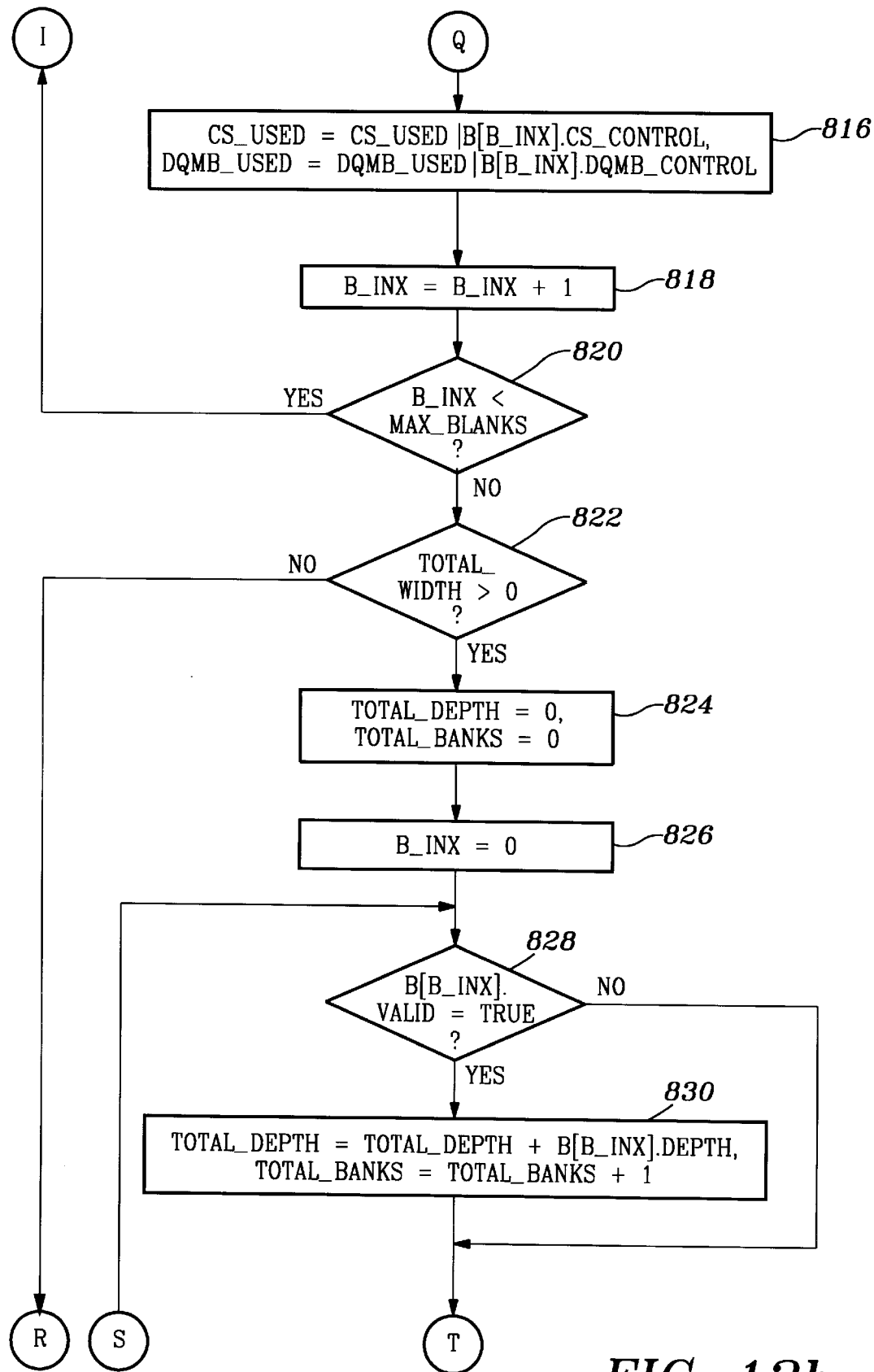

At logic step 816 of FIG. 12h, the contents of element CS_CONTROL of the Per-Bank Structure Table VII is indexed by the variable B_INX, and OR'ed in a bit-wise fashion with the variable CS_USED of Table VIII. Likewise, the contents of element DQMB_CONTROL of the Per-Bank Structure Table is indexed by the variable B_INX of Table VIII, and OR'ed in a bit-wise fashion with the variable DQMB_USED of Table VIII. In the logic flow diagram of FIG. 12h, the vertical-bar symbol "1" represents a bit-wise "OR" operation. Logic step 816 keeps track of used CS lines 32 and used DQMB lines 33, and prevents previously identified banks of SDRAM ICs from being re-identified.

From logic step 816 of FIG. 12h, the logic flow process continues to logic step 818, where the variable B_INX of Table VII is incremented by 1. The logic flow then continues to logic step 820 of FIG. 12h, where the variable B_INX is compared to a constant MAX_BANKS in Table IX. If B_INX is less than MAX_BANKS, logic flow loops back through node I to logic step 728 of FIG. 12b to begin the process of analyzing a next bank of SDRAM ICs. Conversely, if the variable B_INX is equal to MAX_BANKS, the logic flow proceeds from logic step 820 to logic step 822.

At logic step 822 of FIG. 12h, a determination is made whether the element TOTAL_WIDTH of Table VI is greater than zero. If not, the logic flow branches by way of node R to logic step 874 of FIG. 12k to signify that no valid banks of SDRAM ICs were found. Conversely, if TOTAL_WIDTH is greater than zero, the logic flow continues from logic step 822 to logic step 824, where the variables TOTAL_DEPTH and TOTAL_BANKS of the Module Parameter Structure Table VI are reset to zero.

The logic flow then continues to logic step 826, where the variable B_INX of Table VIII is reset to zero in preparation for use as a table index and loop counter. From logic step 826, the logic flow continues to logic step 828 where the element VALID of the Per-Bank Structure Table VI is indexed by the variable B_INX, and a determination is made whether a valid SDRAM IC bank was successfully identified. If not the logic flow skips to logic step 830. Conversely, if the SDRAM IC bank under test is determined to be valid at logic step 828, the logic flow continues to logic step 830 where the element TOTAL_DEPTH Table VI is used to accumulate the contents of element DEPTH of Table VII indexed by the variable B_INX, and the variable TOTAL_BANKS of Table VI is incremented by 1.

Figure 12I:
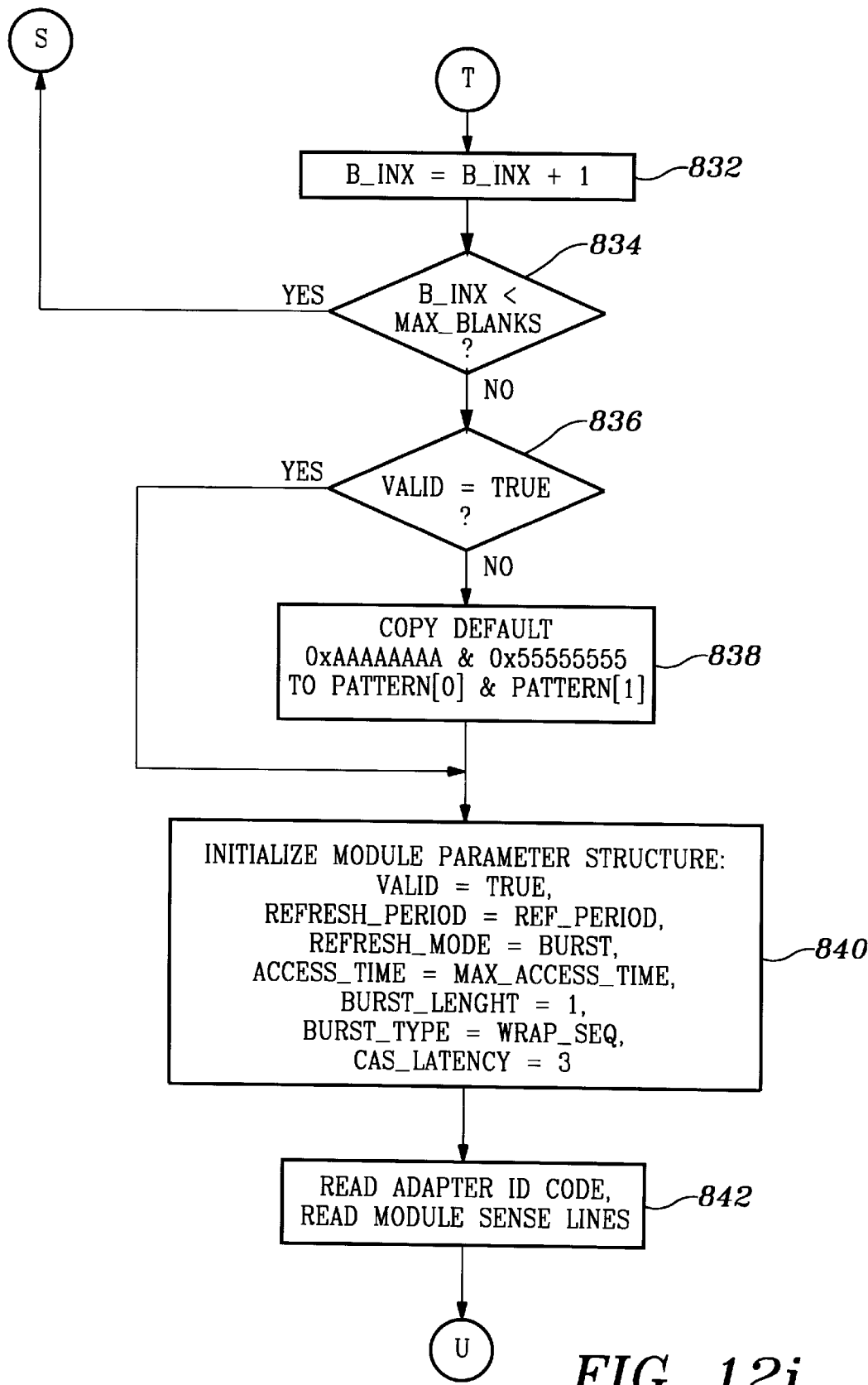

From logic step 830 the logic flow continues through node T to logic step 832 of FIG. 12i, where the variable B_INX is incremented by 1. The logic flow then continues to logic step 834, where the variable B_INX of Table VIII is compared to the constant MAX_BANKS of Table IX. If B_INX is less than MAX_BANKS, the logic flow loops back through node S to logic step 828 of FIG. 12i for a next iteration. Conversely, when B_INX is equal to or greater than MAX_BANKS, the logic flow proceeds to logic step 836.

At logic step 836, a determination is made whether the module identification which has been made thus far is valid. More particularly, the element ID_VALID of the Module Parameter Structure Table VI is examined, and if true the logic flow skips around logic step 838 to logic step 840. The contents of the module identification (which may have been customized by the operator) thereby are preserved. Conversely, if ID_VALID is not a true condition, the logic flow continues to logic step 838 where an all-A's pattern is copied to element PATTERN[0] of Table VI, and an all-5's pattern is copied to the element PATTERN[1].

From either logic step 838, or logic step 836 for valid setups, the logic flow continues at logic step 840 where other elements in the Module Parameter Structure Table VI are initialized. More particularly, element ID_VALID is set to TRUE; element REFRESH_PERIOD is initialized with the constant REF_PERIOD of Table IX; element REFRESH_MODE is initialized with the constant REF_BURST; element ACCESS_TIME is initialized with the constant MAX_ACCES_TIME; element BURST_LENGTH is initialized to 1; element BURST_TYPE is initialized with the constant WRAP_SEQ; and element CAS_LATENCY is initialized to 3.

From logic step 840, the logic flow continues to logic step 842, where logic levels reflecting the adapter ID code strapping 86 of FIG. 6*b* are conveyed by way of bus 85 to the I/O interface 101 of FIG. 6*a* and thereafter to CPU 80 for storage in the variable ADAPTER_ID location of Variable Table VIII. Sense (MS) lines 73*a* and 73*b* of module 20 of FIGS. 6*a* and 6*b* indicate occupancy of UUT sockets 11*a* and 11*b*, respectively. Such information is applied through PD voltage level translator 109 to I/O interface 101 by way of bus 83 of FIG. 6*a*. CPU 80 thereafter stores the information as a package-type code in the variable MOD_PACKAGE location of the Module Parameter Structure Table VI.

Figure 12J:
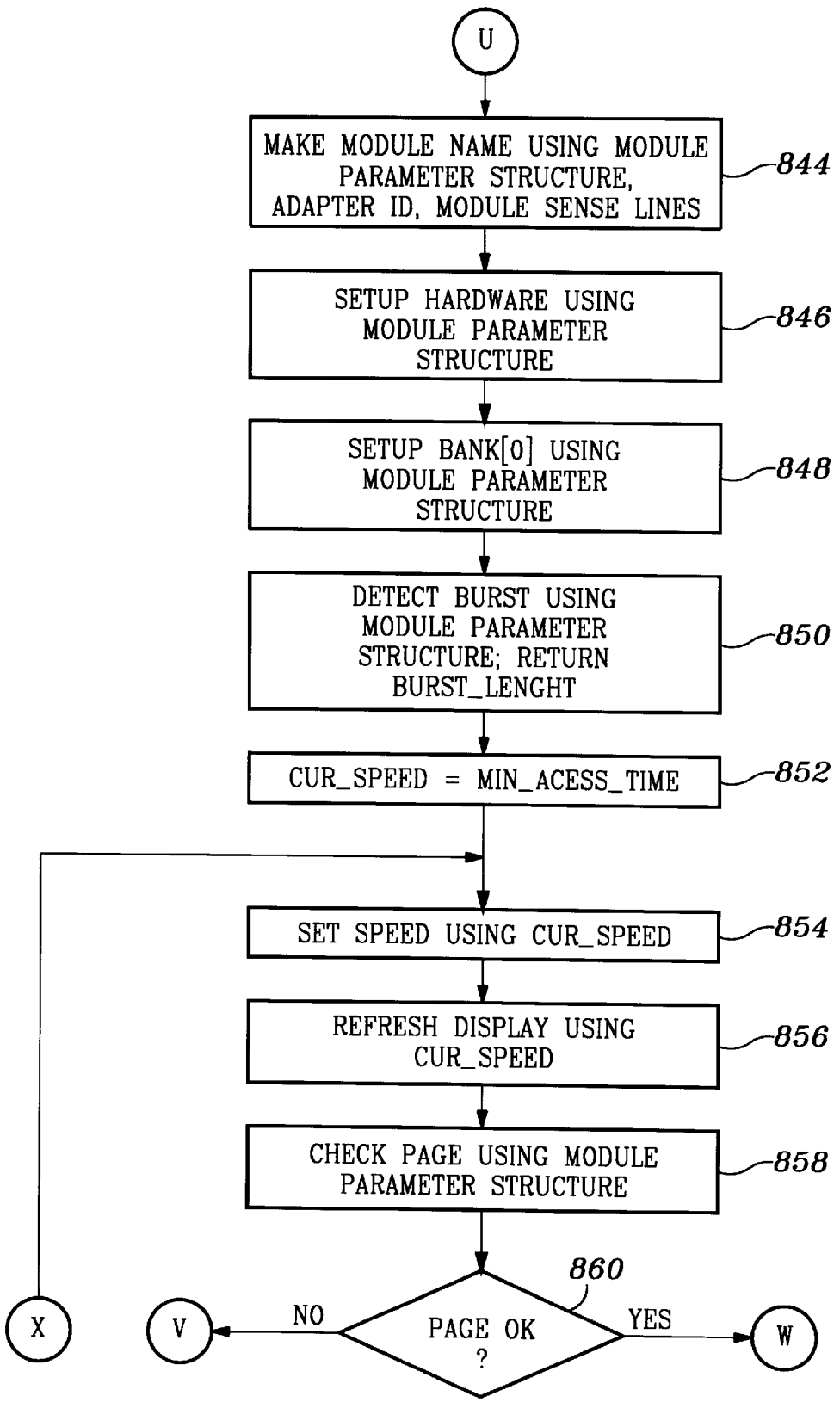

From logic step 842 the logic flow continues through node U to logic step 844 of FIG. 12*j*, where the code stored in the variable ADAPTER_ID location is used to determine whether the UUT adapter 14 hosts a single kind of module package or two different kinds of module packages. In the case of UUT adapter 14 hosting plural module packages, the code in the variable MOD_PACKAGE location reflects which UUT socket 11 is being occupied. Thus, part of the SDRAM module name may be identified as "SO DIMM 144", "DIMM 168", etc. The logic flow continues through node U to logic step 844 of FIG. 12*j*, where the Module Parameter Structure Table VI is used to make a memory module name. For example, if a module is comprised of four banks of SDRAM ICs, and each bank is 32 bits wide and 1 megaword or 1,048,576 words deep, and the module access time is 10 nanoseconds, then a module name may include the following: "2M×64 10 ns". If the memory module is a 168 pin dual inline memory module (DIMM), the memory module name may be more completely represented as "2M× 64 DIMM 10 ns". It is to be understood that the present memory module test system also may accommodate 144 pin SO DIMMs, where "SO" is an acronym for "small outline" The memory test system 10 identifies a memory module as being a DIMM or a SO DIMM by sensing pin 1 of the module to detect a ground condition.

From logic step 844 of FIG. 12*j*, the logic flow process continues to logic step 846 where the memory test controller 116 is initialized from the contents of the Module Parameter Structure Table VI. More particularly, the oscillator 141 of FIG. 6 generates a 3.6864 MHz signal which causes refresh timer 140 to interrupt the CPU 80 in time increments determined by the variable REFRESH_PERIOD Table VI. Upon the interrupt occurring, the CPU 80 tests the REFRESH_MODE variable of the table to determine the mode of operation (burst or distributed mode). Thereafter, the CPU 80 initializes the program delay line 114 with the value ACCESS_TIME, for the purpose of allowing enough time to elapse before data from the UUT received by way of the data VLT 113 is stored in data latches 118. When consistent responses are received from the UUT, the value of ACCESS_TIME in Table VI will be the access time of the memory module under test. The CPU 80 further loads the Mode & LC Register 172 with BURST_TYPE, BURST_LENGTH, and CAS_LATENCY of Table VI to program the UUT by way of address multiplexer 196.

The logic flow process of FIG. 12*j* thereafter continues to logic step 848, where the CPU 80 loads all elements of the Per-Bank Structure Table VII into the B[0] memory location of Table VI. Further, all parameters of CS enable logic 250 and DQMB enable logic 252 are respectively loaded from CS_CONTROL and DQMB_CONTROL of the Per-Bank Structure Table VI, and all parameters except CKEEN[0] and CKEEN[1] are loaded from RE_CONTROL and CE_CONIROL of the table. CKEEN[0] and CKEEN[1] are hard-coded constants.

The PART_INDEX element of Table VI is used as an index into the PARTS_LIST Table V to retrieve the elements RA and CA for storage respectively in the RA register 652 and the CA register 654 of FIG. 11 to construct memory addresses as previously described. Mode register 172 of FIG. 7 is initialized using bits from elements BURST_TYPE, BURST_LENGTH, and CAS_LATENCY of the Module Parameter Structure Table VI.

From logic step 848 of FIG. 12*j*, the logic flow continues to logic step 850 where the maximum burst length of the SDRAM module 20 is detected by CPU 80 in accordance with the step-by-step logic flow diagram of FIG. 18, as will be further described below. The logic flow thereafter proceeds to logic step 852, where the variable CUR_SPEED of the VARIABLES TABLE VIII is initialized with the constant MIN_ACCESS_TIME to estimate the speed of the SDRAM module 20. From logic step 852 of FIG. 12*j*, the logic flow proceeds to logic step 854, where the value of the variable CUR_SPEED is determined through use of a slope and intercept function, and loaded into programmable delay line 114. From logic step 854, the logic flow continues to logic step 856 where display 12 of FIG. 6 is refreshed to show the current memory module speed being checked.

Figure 15:
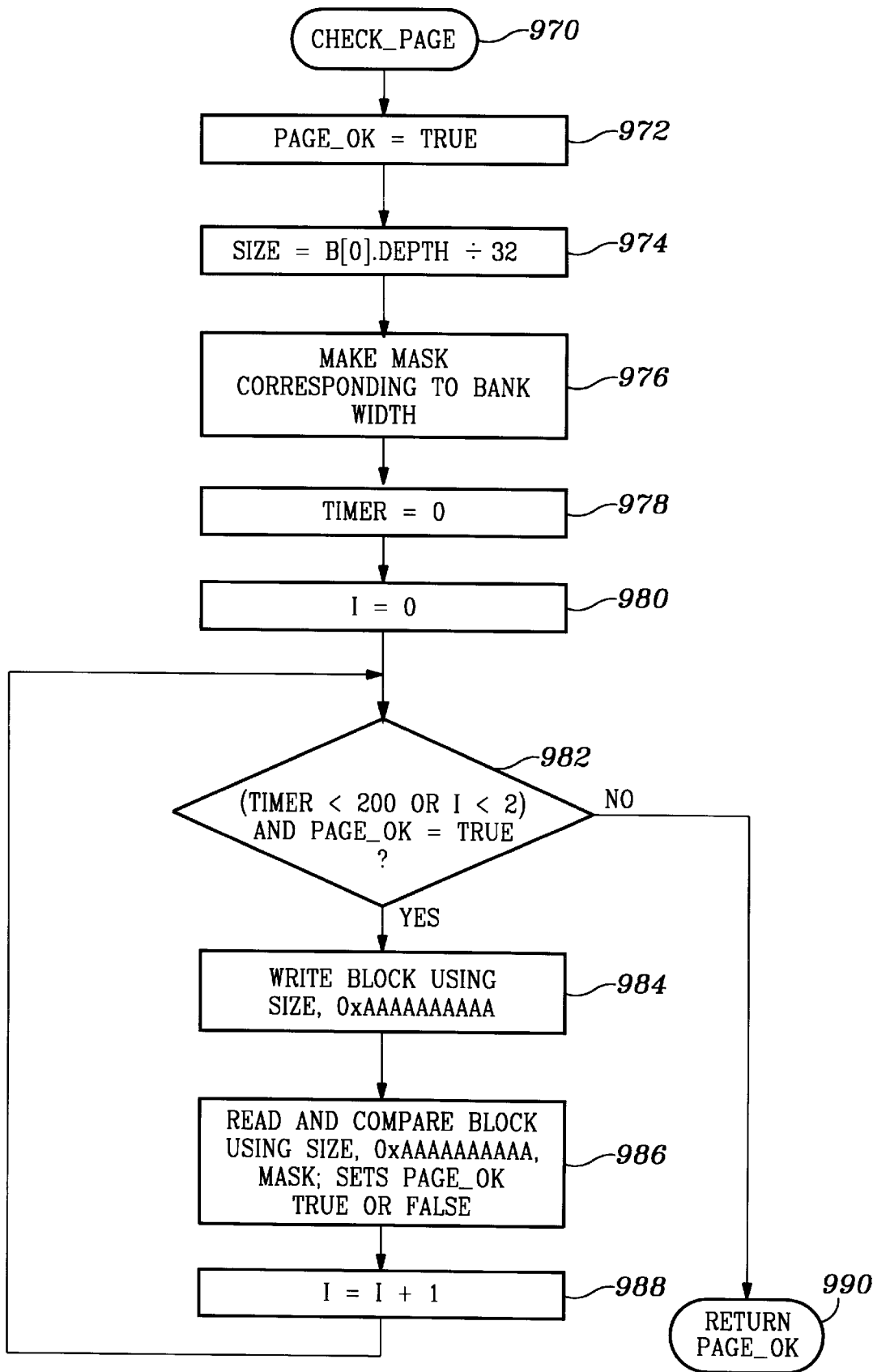
FIG. 15 is a logic flow diagram of a test software program executed by the memory test system 10 to determine whether a trial combination of control lines is valid.

The logic flow process of FIG. 12*j* then continues to logic step 858 where the CHECK_PAGE logic flow illustrated in FIG. 15 is performed with use of elements of the Module Parameter Structure Table VI to determine whether the address lines specified by the RA and CA registers of FIG. 11 correctly address the memory module under test. It is to be understood that the only variable at this time of the logic flow process is ACCESS_TIME. All other parameters of the memory module have been set.

Figure 12K:
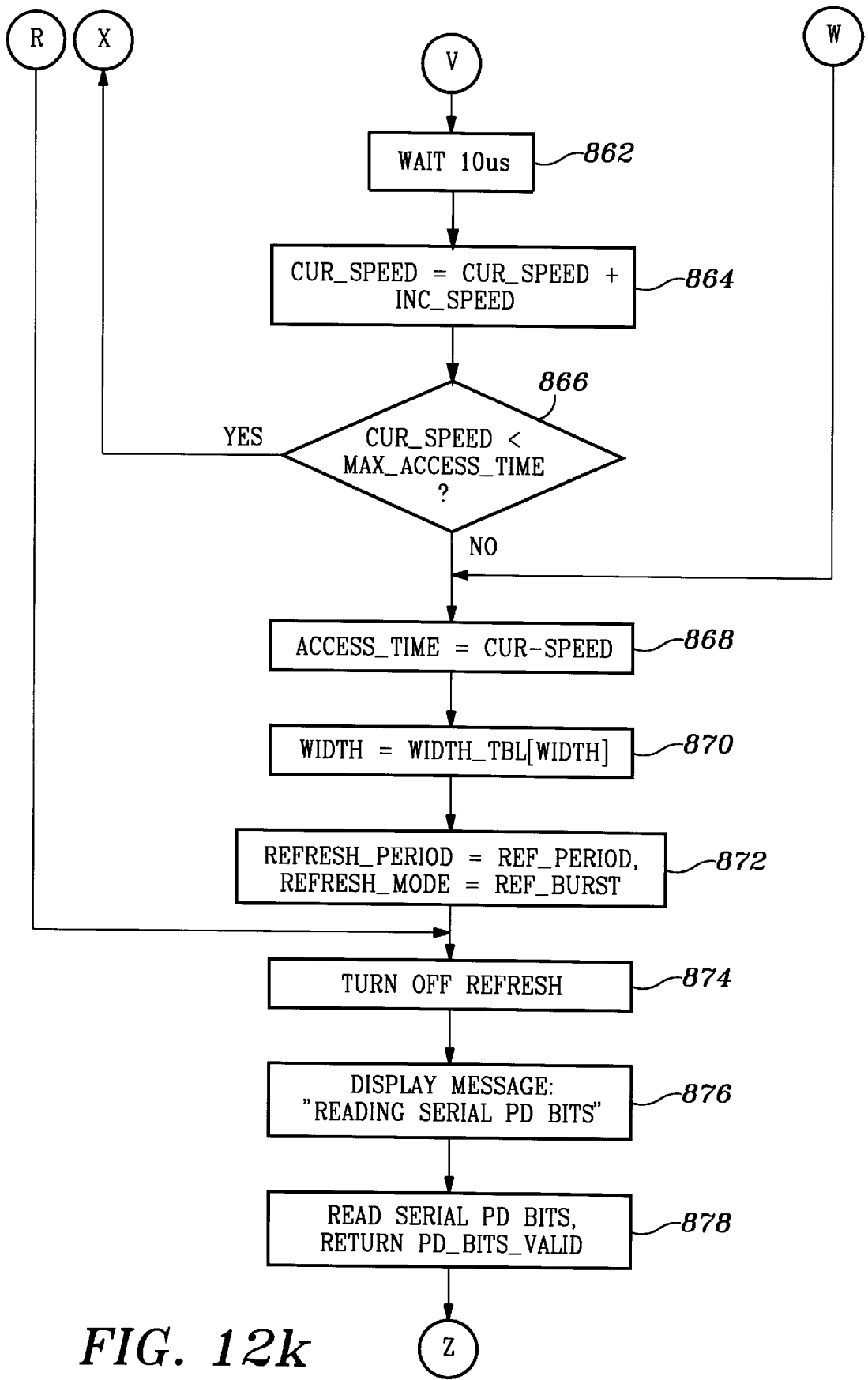
Figure 121:
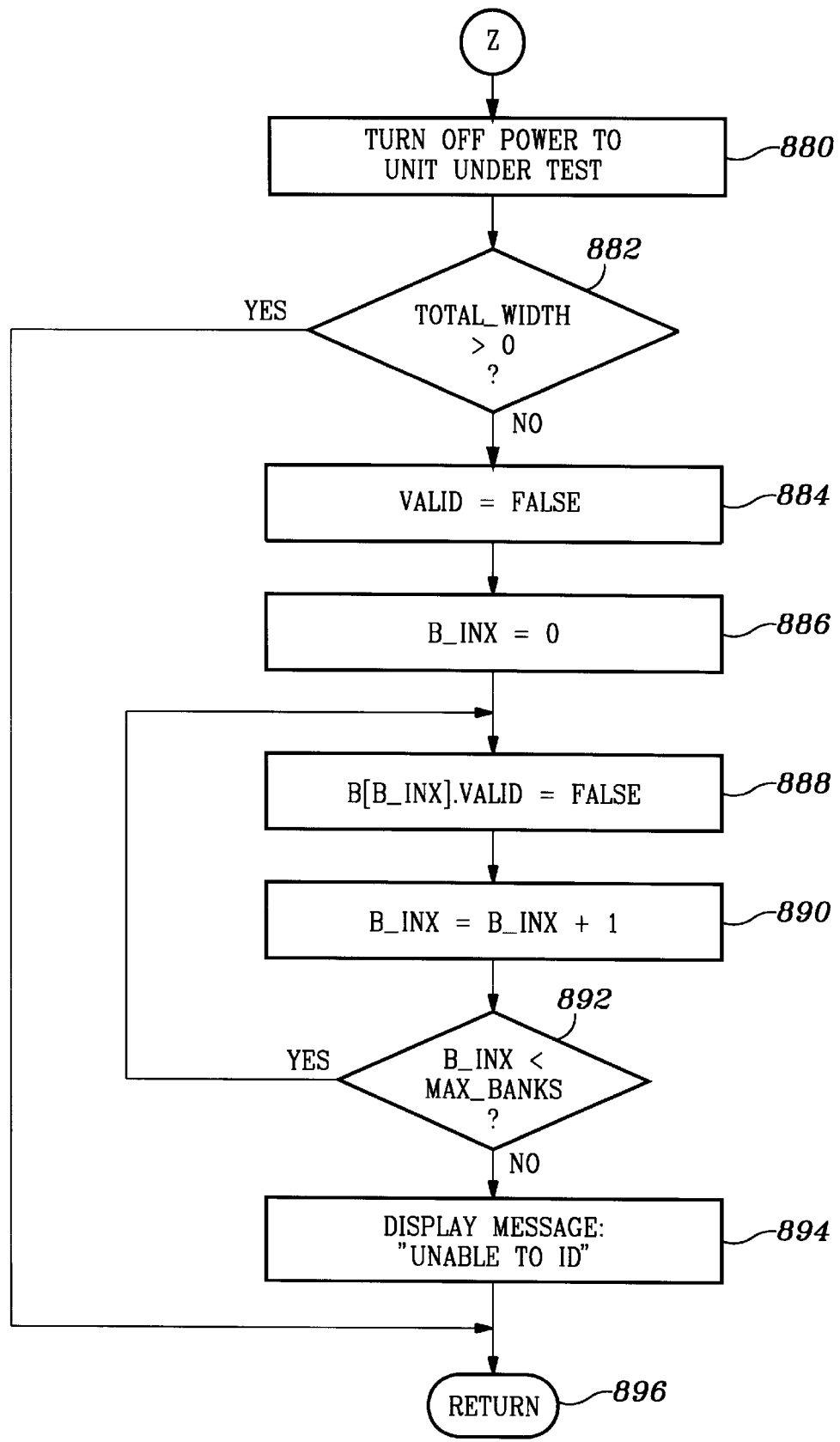

From logic step 858, the logic flow proceeds to logic step 860 where, if the results of the CHECK_PAGE process of logic step 858 indicate proper addressing of the memory module, the logic flow branches through node W to logic step 868 of FIG. 12*k*. Otherwise, the logic flow proceeds through node V to logic step 862 of FIG. 12*k*.

At logic step 862, the logic flow process is suspended for 10 μs by executing "no-op" instructions in a loop to allow the electronics of the memory test system to settle. From logic step 862, the logic flow continues to logic step 864 where the variable CUR_SPEED of Table VIII is incremented by the constant INC_SPEED of Table IX in increments of 2 nanoseconds. From logic step 864, the logic flow process continues to logic step 866 where the variable CUR_SPEED is compared to the constant MAX_ACCESS_TIME of Table IX. If CUR_SPEED is less than MAX_ACCESS_TIME, the logic flow loops back through node X to logic step 854 of FIG. 12*j* for a next iteration. Conversely, if CUR_SPEED is equal to or greater than MAX_ACCESS_TIME, the logic flow continues from logic step 866 to logic step 868.

From either the "yes" branch of logic step 860 or the "no" branch of logic step 866, the logic flow proceeds to logic step 868, where the access time of SDRAM module 20 is known and the variable ACCESS_TIME of Table VI is set to the contents of the variable CUR_SPEED of Table VIII. The logic flow continues from logic step 868 to logic step 870, where the variable WIDTH is used as an index into the WIDTH_TABLE X for a replacement WIDTH value. Logic step 870 provides a means of identifying the width of SDRAM module 20 when some of the bits have failed.

The logic flow continues to logic step 872, where the variable REFRESH_PERIOD of the Module Parameter Structure Table VI is initialized with the constant REF_PERIOD of Table IX, and the variable REFRESH_MODE of Table VI is initialized with the constant REF_BURST. From either the "no" branch of logic step 822 or logic step 872, the logic flow process continues to logic step 874 where memory refresh is turned off. Thus, no further interrupts to CPU 80 are issued by the refresh timer 140 of FIG. 6.

From logic step 874, the logic flow proceeds to logic step 876 where the message "Reading Serial PD Bits" is posted to display 100. The logic flow then continues to logic step 878 where the contents of the PD memory 75 of FIG. 5 are read into the 256-byte array, PD_BITS, of the Module Parameter Structure Table VI, and the variable PD_BITS_VALID is set to TRUE.

The logic flow process thereafter proceeds through node Z to logic step 880 of FIG. 12l, where the program controlled power supply 106 is commanded by the CPU 80 to turn off power to the UUT 11. From logic step 880, the logic flow continues to logic step 882 where the variable TOTAL_WIDTH of Table VI is compared to zero, and if greater, the auto-ID process of identifying a memory module has been a success. The logic flow thereupon branches to logic step 896, where the auto-ID process is exited and control returns to the user interface program stored in ROM 90 of FIG. 6 Conversely, if TOTAL_WIDTH is less than or equal to zero, the auto-ID process was unsuccessful, and the logic flow continues to logic step 884, where the variable ID_VALID of the Module Parameter Structure Table VI is reset to FALSE.

The logic flow continues to logic step 886 of FIG. 12l, where the variable B_INX of the Variables Table of Table VIII is reset to zero for use as a loop counter and index. From logic step 886, the logic flow continues to logic step 888 where the variable VALID of the Per-Bank Structure Table VII as indexed by the variable B_INX is reset to FALSE. It is to be understood that a table such as Table VII exists for each of the banks comprising the memory module under test. Thus, the variable B_INX indicates which of the tables is selected for the particular bank under test. From logic step 888, the logic flow continues to logic step 890 where the variable B_INX is incremented by 1. The logic flow then continues to logic step 892 where the variable B_INX is compared to the constant MAX_BANKS, which indicates the number of banks that constitute the memory module under test. If B_INX is less than MAX_BANKS, the logic flow loops back to logic step 888. Conversely, when the variable B_INX is equal to MAX_BANKS, the logic flow proceeds to logic step 894 to display the message "Unable to ID" on display 100. From logic step 894, the logic flow continues to logic step 896 where control returns to the user interface program stored in ROM 64.

The following descriptions are directed to the special function logic flows which are executed by the CPU 80 during the auto-ID process of FIGS. 12a–12l.

Figure 13:
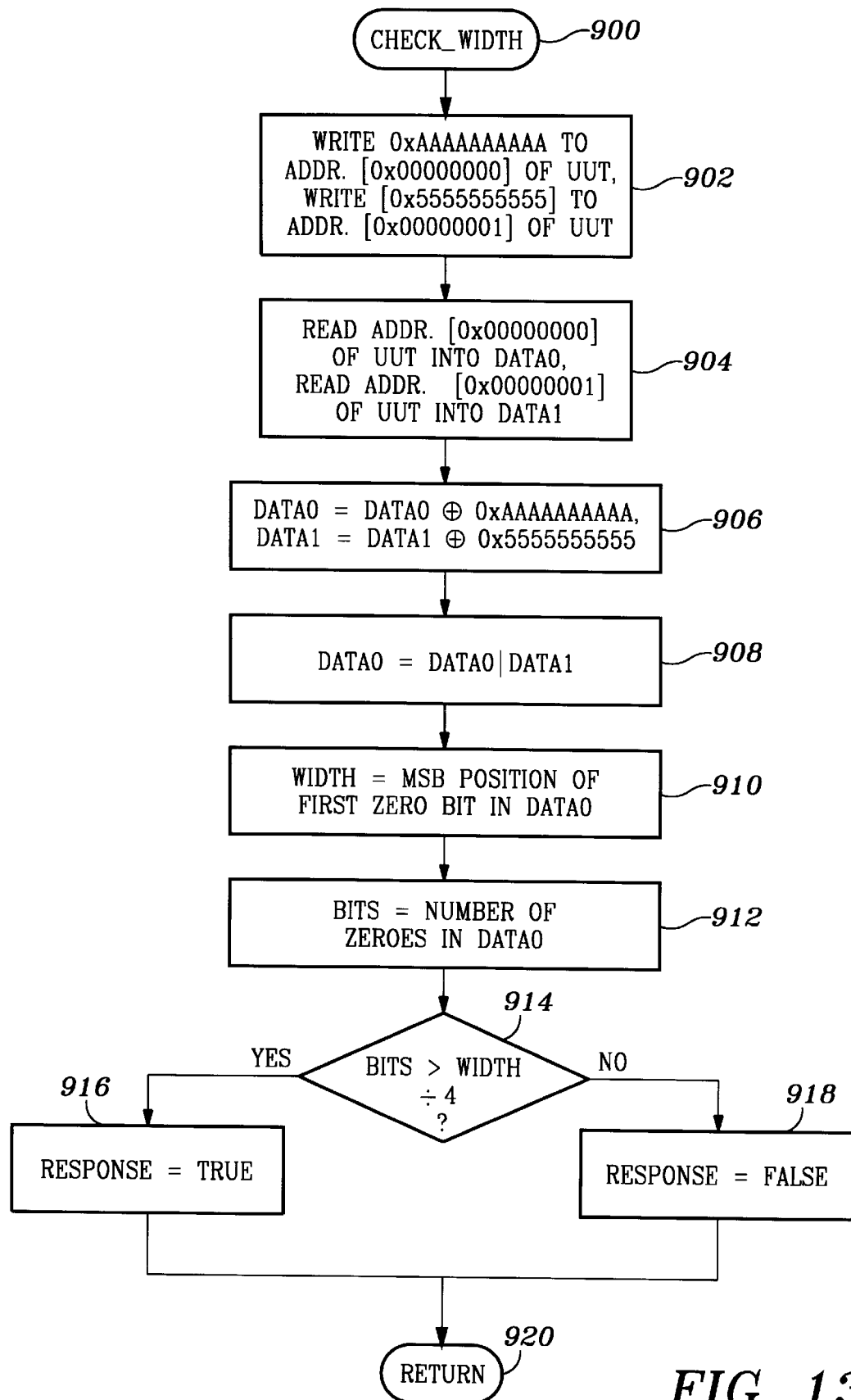
FIG. 13 is a logic flow diagram of a test software program executed by the memory test system 10 to determine the width in bits of a synchronous memory under test.

Referring to FIG. 13, the logic flow enters at logic step 900 from the memory module identification logic flow of FIGS. 12a–12l. From logic step 900, the logic flow continues to logic step 902 where a test pattern of all A's is written to address [0] of the unit under test (UUT), and a test pattern of all 5's (which is the binary complement of the all A's pattern) is written to address [1]. Patterns which are binary complements of each other, such as all A's and all 5's, are the minimum number of patterns necessary to determine which data lines are active. All A's and all 5's also have the property of resisting false responses due to adjacent bits being electrically shorted together.

The process of writing to a memory location within the UUT causes memory test controller 116 to issue a data strobe signal over line 125 to bi-directional data latches 118.

From logic step 902 of FIG. 13, the logic flow continues to logic step 904 where address [0] of the UUT is read into local variable DATA0, and address [1] of the UUT is read into local variable DATA1. Local variables DATA0 and DATA1 are sufficient in bit length to store the maximum width in bits of the memory bank under test.

References to a "local variable" in the descriptions refer to a variable which is created for the logic flow diagram being described, but which is not addressed outside of that logic flow diagram.

The logic flow continues from logic step 904 to logic step 906, where local variable DATA0 is bit-wise exclusive-OR'ed with a pattern of all-A's, and local variable DATA1 is bit-wise exclusive-OR'ed with a pattern of all-5's. From logic step 906, the logic flow continues to logic step 908 where the contents of local variable DATA1 is bit-wise OR'ed with local variable DATA0. Performing a bit-wise exclusive-OR operation between the original pattern written to a given memory location, and the pattern read from the identical location, yields a result that is all-0's when bit lines are connected to a working memory. Where the bit lines are unconnected, logic one's appear. Therefore, by using a pair of complementary binary patterns, and performing a bit-wise OR of the two exclusive-OR results, a new pattern is created which shows lines connected to working memory as logic 0's and lines not connected to working memory as logic 1's.

From logic step 908, the logic flow continues to logic step 910 where local variable DATA0 is scanned bit-by-bit from the most significant bit (MSB) to the least significant bit (LSB), until the first logic 0 is encountered. Numbering the LSB as bit 0, a logic 1 is added to the bit position of the first logic 0 found, and placed into the variable WIDTH of the Variables Table VIII.

The logic flow of FIG. 13 continues from logic step 910 to logic step 912, where the number of zeroes in the local variable DATA0 are counted and stored in the variable BITS of the Variables Table VIII to indicate the number of working bits (usually the same value as WIDTH). From logic step 912 of FIG. 13, the logic flow continues to logic step 914, where a test is made to determine whether the value in BITS is at least one-fourth (¼) of the value in WIDTH. If true, the logic flow branches to logic step 916 where the variable RESPONSE of the Variables Table is set to TRUE. Conversely, if the value in BITS is less than one-fourth of WIDTH, the logic flow branches to logic step 918 where the variable RESPONSE is reset to FALSE. The logic step 914 allows damaged SDRAM modules to be correctly identified.

From either logic step 916 or logic step 918, the logic flow process continues to logic step 920 where control returns to the point in the logic flow diagram of FIGS. 12a–12l from which a CHECK_WIDTH function was required.

Figure 14A:
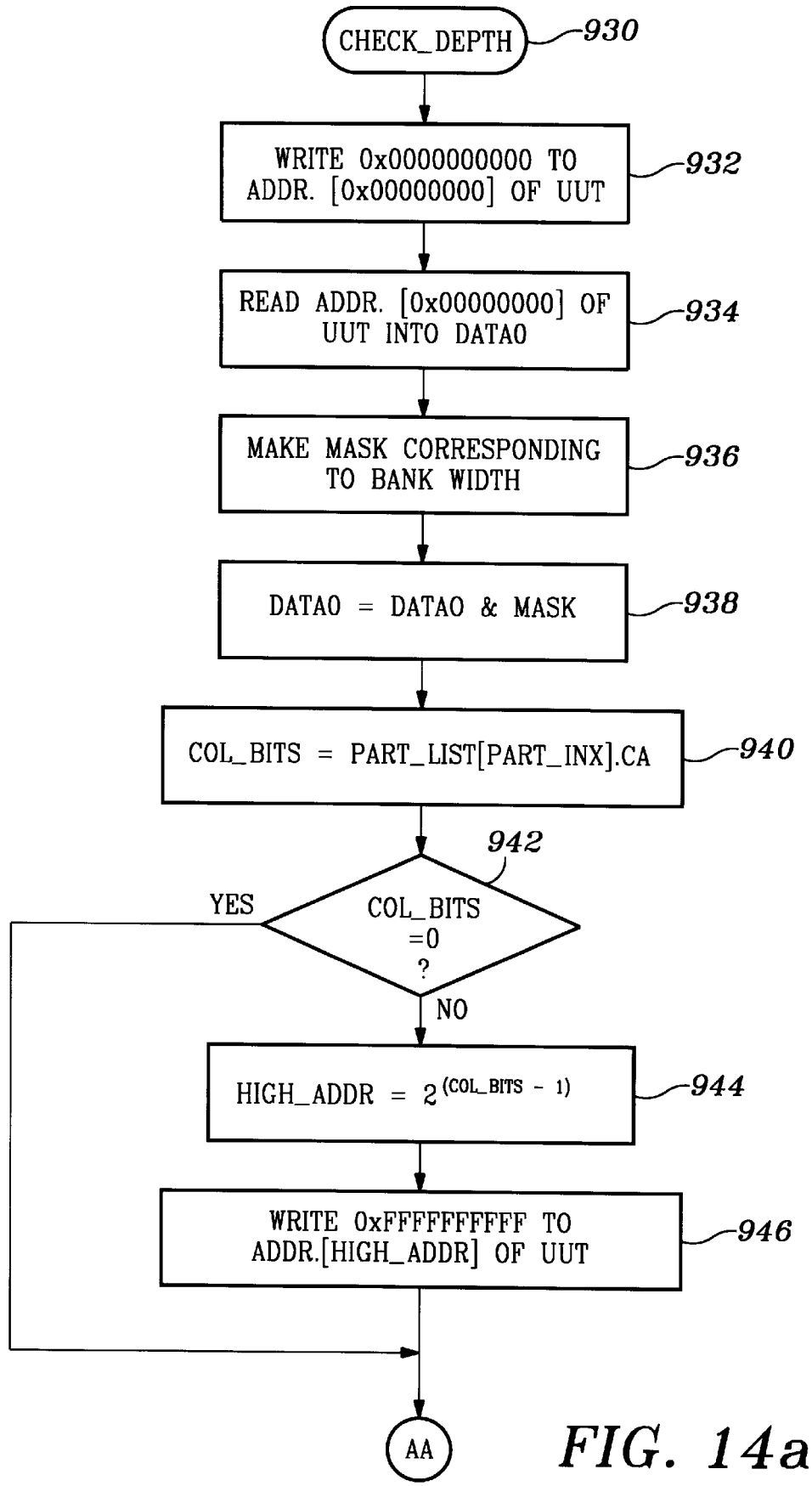
FIGS. 14a–14b constitute a logic flow diagram of a test software program executed by the memory test system 10 to determine the depth of a synchronous memory under test.

When the auto-ID logic system depicted in FIGS. 12a–12l requires that the depth of a bank of SDRAM ICs in a memory module be determined, the logic flow process flow branches to logic step 930 of FIG. 14a. From logic step 930, the logic flow continues to logic step 932 where a pattern of all logic 0's is written to address [0] of a UUT. From logic step 932, the logic flow continues to logic step 934 where the contents of address [0] are read and stored in local variable DATA0.

From step logic 934, the logic flow continues to logic step 936 where the variable WIDTH of Table VIII is used to create a local variable MASK, with logic 1's in the bit positions corresponding to the working bits of the memory module. From logic step 936, the logic flow continues to logic step 938 where local variable MASK is bit-wise AND'ed into local variable DATA0, to allow unused bits to be ignored when word width is less than 40 bits.

From logic step 938, the logic flow continues to logic step 940 where column CA of Table V is indexed by variable PART_INX of Table VIII, and the value so addressed is stored in local variable COL_BITS to represent the number of column address bits. From logic step 940, the logic flow continues to logic step 942 where, if local variable COL_BITS is zero the logic flow proceeds to node AA. If at logic step 942 the local variable COL_BITS is not zero the logic flow proceeds to logic step 944 where the address corresponding to the middle column of the page is calculated and stored in local variable HIGH_ADDR. The number 2 is raised to the power represented by the contents of local variable COL_BITS decremented by 1, and stored in local variable HIGH_ADDR, to yield an address which is in the middle of the row of the SDRAM IC array 444 if the bank under test is as deep as the number represented by COL_BITS. If the actual depth of the bank checked is smaller than the trial value defined by the number of column address bits, then the addressing wraps, and writing to the address represented by the logic local variable HIGH_ADDR is the same as writing to address [0]. From logic step 944, the logic flow proceeds to logic step 946 where a write of hexadecimal F's is made to the address calculated in logic step 944.

Figure 14B:
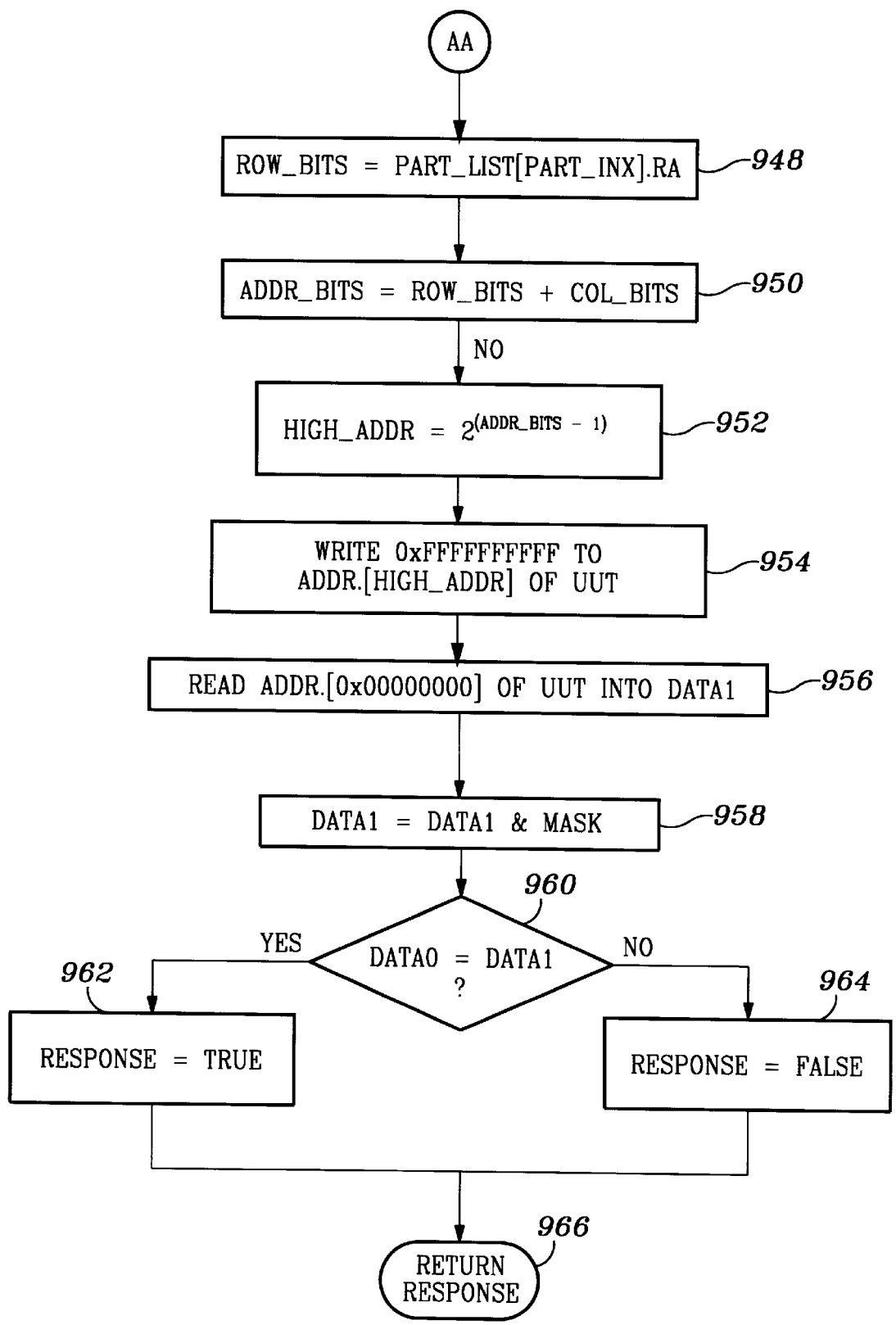

From either the "YES" branch of logic step 942 or logic step 946, the logic flow continues through node AA to logic step 948 of FIG. 14*b*, where column RA of Table V is indexed by the variable PART_INX of Table VIII, and the value addressed is stored in local variable ROW_BITS, to indicate the number of row address lines. From logic step 948, the logic flow proceeds to logic step 950, where the total number of address lines for the bank currently tested is calculated as the sum of the number of row lines and column lines and stored in local variable ADDR_BITS.

From logic step 950, the logic flow proceeds to logic step 952 where the address corresponding to half-of-the-depth is calculated and stored in local variable HIGH_ADDR. The logic flow thereafter proceeds from logic step 952 to logic step 954 where a write of hexadecimal F's is made to the address calculated in logic step 952.

The logic flow continues from logic step 954 to logic step 956 where the contents of address [0] of the UUT are read and stored in local variable DATA 1. From logic step 956, the logic flow continues to logic step 958 where the contents of local variable DATA1 is bit-wise AND'ed into local variable MASK From logic step 958, the logic flow continues to logic step 960 where the contents of local variable DATA0 is compared to the contents of local variable DATA1. If DATA0 is equal to DATA1, the logic flow branches to logic step 962. Conversely, if DATA0 and DATA1 are not equal, the logic flow branches to step 964. At logic step 962 the variable RESPONSE of Table VIII is set to TRUE. At logic step 964 the variable RESPONSE is reset to FALSE. From either logic step 962 or logic step 964, the logic flow process proceeds to logic step 966 where the variable RESPONSE is returned to the logic step of FIGS. 12*a*–12*l*, which required that the depth of a bank be determined.

Refering to FIG. 15, the logic flow process enters the CHECK_PAGE logic flow diagram at logic step 970, and proceeds to logic step 972, where the variable PAGE_OK of Table VIII is set to TRUE. From logic step 972, the logic flow continues to logic step 974 where a local variable SIZE is set to 1/32nd of the value of the variable DEPTH in Table VII. By the time that the CHECK_PAGE logic of FIG. 15 is executed, the logic flow of FIGS. 14*a* and 14*b* will have been executed to initialize the variable DEPTH of the Table VIII. The variable DEPTH is expected to be the same for all banks of a memory module. A representative fraction of the bank depth is used to make the identification time reasonable.

From logic step 974 of FIG. 15, the logic flow continues to logic step 976, where the variable WIDTH of the Variables Table VIII is used to create a local variable MASK with logic 1's in the bit positions corresponding to the working bits of the bank under test. The logic flow of FIG. 15 continues to logic step 978 where a global variable TIMER of the Table VI is reset to 0. The global variable TIMER is incremented by a timer interrupt routine approximately 66 times per second to measure elapsed time. The logic flow then continues to logic step 980 where a local variable I is set to zero to initialize a loop counter.

From logic step 980 the logic flow continues to logic step 982 where a determination is made whether (1) either the TIMER is less than 200 or the loop counter I is less than 2 and (2) the variable PAGE_OK of Table VIII is set TRUE. If so, the logic flow continues to logic step 984 where all A's are written to a block of memory beginning with address [0] and comprised of a number of words defined by local variable SIZE. Conversely, if variable PAGE_OK is FALSE, or either the global variable TIMER is equal to or greater than 200 or the local variable I is equal to or greater than 2, the logic flow continues from logic step 982 to logic step 990 where the logic flow process returns to logic step 860 of FIG. 12*j*.

From logic step 984 of FIG. 15, the logic flow proceeds to logic step 986 where the identical block previously written at logic step 984 is read and compared within the MASK of logic step 976 to a pattern of all A's. If an equivalence is indicated, the variable PAGE_OK is set TRUE. Otherwise, PAGE_OK is set FALSE.

The logic flow process proceeds from logic step 986 to logic step 988, where local variable I is incremented by 1, and the logic flow loops back to logic step 982 for a next iteration. Logic step 982 provides a means of exiting the loop if the variable PAGE_OK is FALSE, if two iterations are successfully performed, or if tht global variable TIMER reaches 200. A TIMER count of 200 corresponds to approximately a 13 second test of a UUT.

Figure 16:
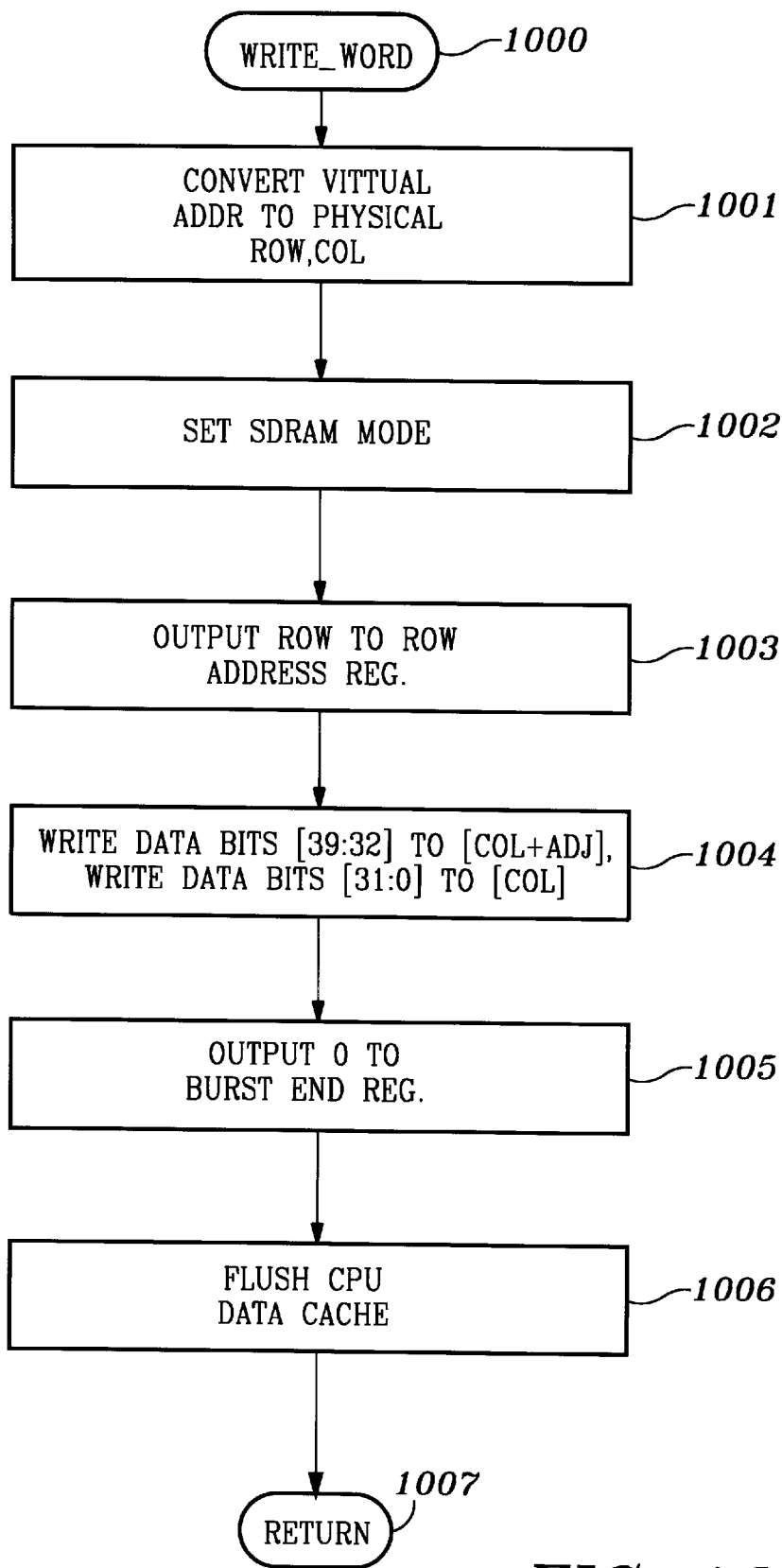
FIG. 16 is a logic flow diagram of a test software program executed by the memory test system 10 to write a word into a synchronous memory module under test.

Referring to FIG. 16, a logic flow diagram illustrates the steps performed by the CPU 80 when the state machine logic of FIGS. 12*a*–12*l* requires that information be written to a UUT. The logic flow process enters at logic step 1000 and proceeds to logic step 1001, where a virtual address created sequentially in the memory test system pursuant to the logic diagrams of FIGS. 12*a*–12*l*, and 13–15, is converted by the logic of FIGS. 10 and 11 to a physical row and column of the memory array 444. From logic step 1001, the logic flow continues to logic step 1002 where a mode command from register 172 of FIG. 7 is written to the SDRAM devices of the UUT. The SDRAMs thereby are configured for a CAS latency of 3, sequential burst addressing, and a burst length of 1, as previously described at logic step 722. The logic flow continues to logic step 1003 where the row address generated at step 1001 is output by CPU 80 of FIG. 6 to row address register 191, and row activate latch 151 and precharge latch 153 internal to the state machine 150 are set.

From logic step 1003, the logic flow continues to logic step 1004, where CPU 80 first writes to data latches 118 the upper 8 bits of 40 bits of data generated during execution of the function represented by one of logic diagrams 13, 14a–14b and 15.

INTRODUCON TO FIGS. 20–26

Referring to FIG. 9, states 00 at 350, 0A at 362, 0B at 363, 0D at 358, 0F at 359, 10 at 367, and 1B at 365 all have state-hold indications (looped-back arrows), denoting states which may persist for more than one cycle of memory clock signal 121 during a wait for an event external to the state machine 150. Notations a, b, c . . . following state reference numbers denote different clock cycles within the same state. Ellipsis ( . . . ) notations following state numbers on timing diagrams FIGS. 20–26 denote a state-hold condition of state machine 150, where control signal outputs do not change while the state machine awaits an external event such as the assertion or release by CPU 80 of a processor write overead signal, etc. All other states including state 01 at 356, 02 at 351, 03 at 352, 04 at 353, 05 at 357, 06 at 360, 07 at 366, 08 at 355, 09 at 354, 0C at 361, 0E at 364, and 11 at 368, persist for exactly one cycle of the memory clock signal 121.

Figure 20:
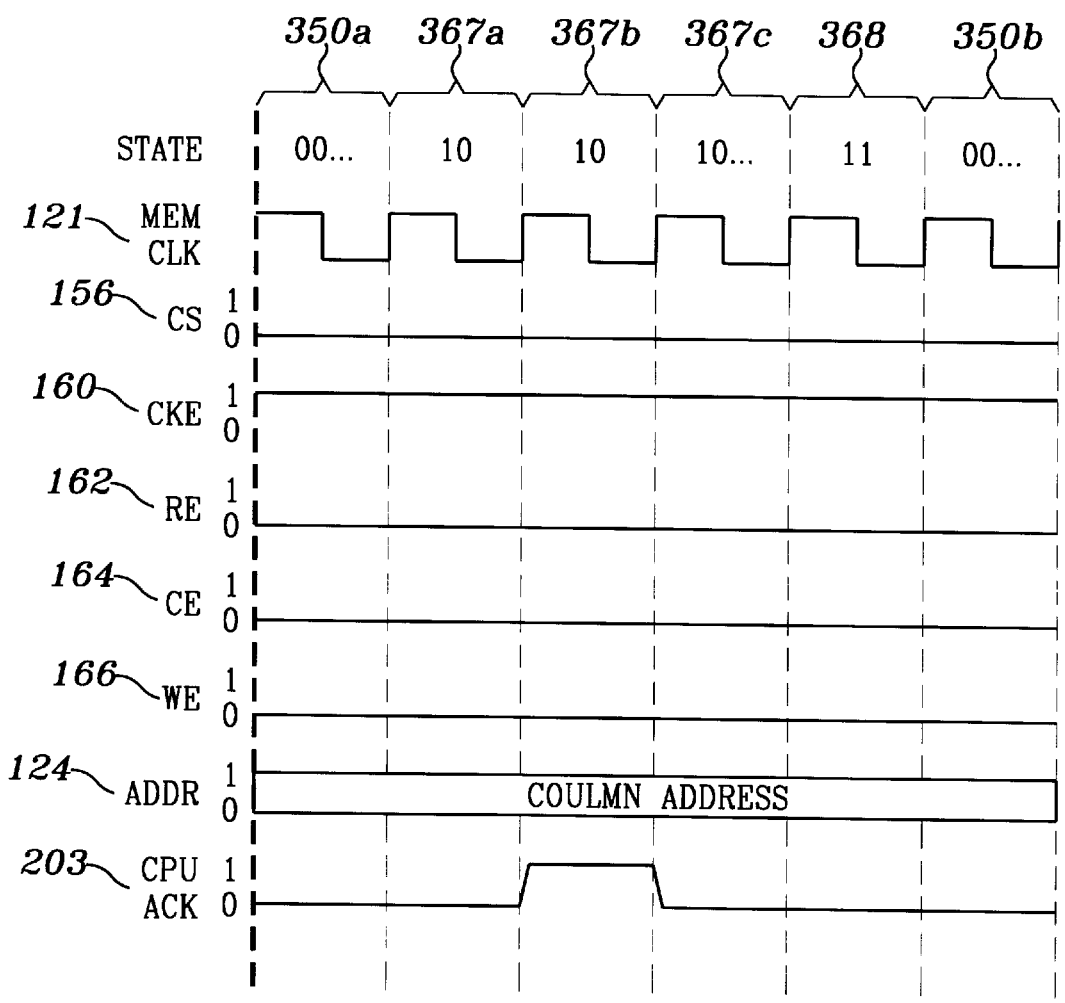
FIG. 20 is a graphical illustration of the timing signals generated by the memory test system 10 in a write to the upper eight bits of a word in synchronous memory.

Referring to FIGS. 9 and 20, and concurrently with the writing of data to the upper 8 bits of data Latches 118, state machine 150 exits idle state 00 at 3501a, and upon the next cycle of the memory clock on line 121 enters state 10 at 367a. Upon the next cycle of the memory clock on line 121, state machine 150 remains in state 10 at 367b and asserts a CPU acknowledge signal on line 203. Upon the next cycle of the memory clock on line 121, state machine 150 de-asserts the CPU acknowledge signal on line 203, and waits in state 10 at 367c until CPU 80 has completed the write cycle. State machine 150 then advances to state 11 at 368. Upon the next cycle of the memory clock on line 121, state machine 150 re-enters idle state 00 at 350b to await the next command. The sequence of states 00-10-11-00 exists solely for providing acknowledgment over line 203 to CPU 80, and causes no change in state of the UUT control signals CS 156, CKE 160, RE 162, CE 164, WE 166, or the selection of the address multiplexor 196 of FIG. 7.

Figure 21:
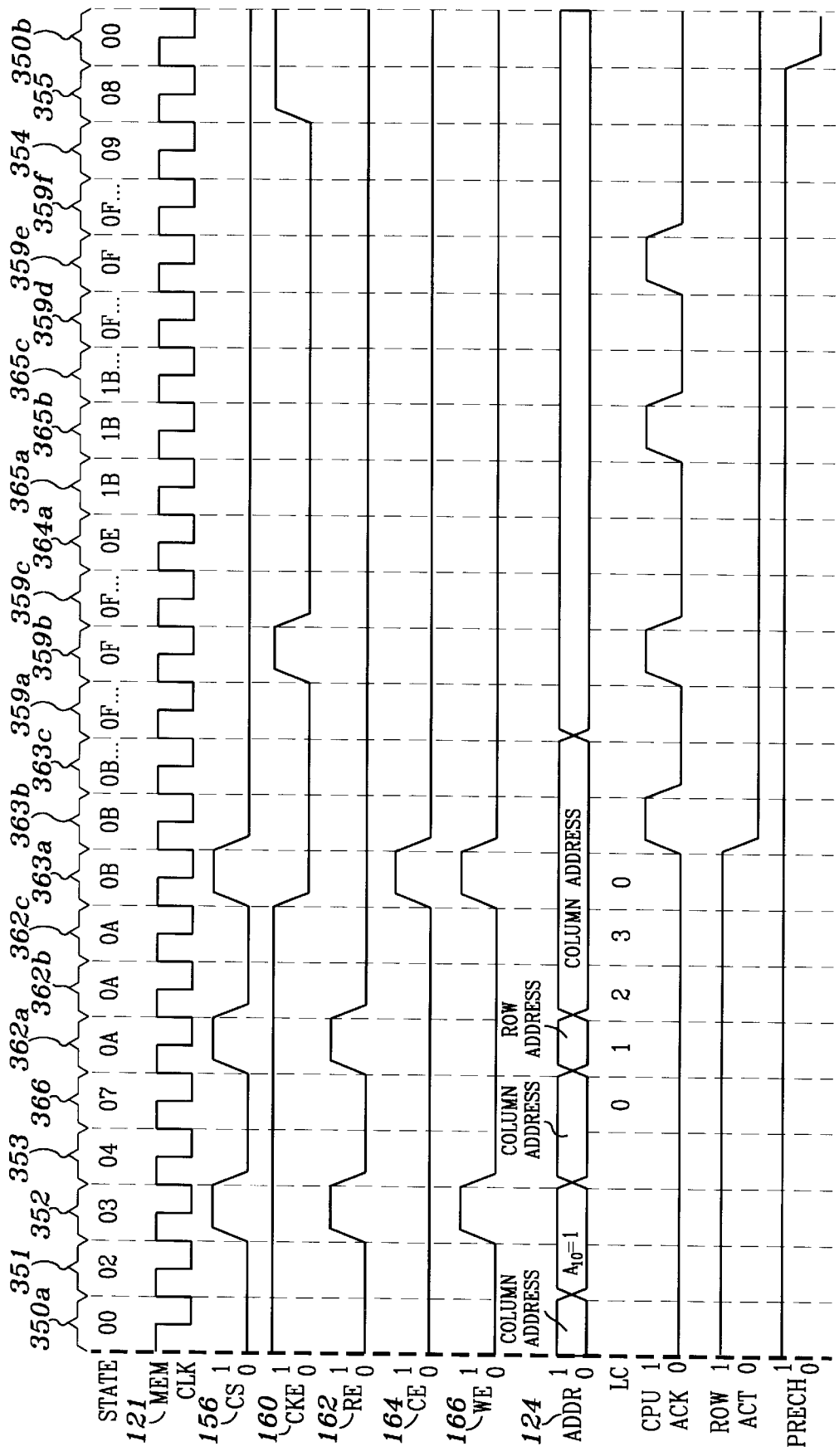
FIG. 21 is a graphical illustration of the timing signals generated by memory test system 10 in a write to the lower 32 bits of a word in synchronous memory.

Continuing at logic step 1004 of FIG. 16, CPU 80 next writes to the UUT the lower 32 bits of the 40 bits of data in data latches 118. Referring to FIGS. 9 and 21, because a row address operation was performed at logic step 1003, the row activate latch 151 and precharge latch 153 within state machine 150 are already set, thus causing the state machine 150 to enter state 02 at 351 and the address multiplexor 196 to output a precharge address pattern with bit $A_{10}$=1. Upon the next cycle of the memory clock on line 121, the state machine 150 enters state 03 at 352 to effect a precharge operation on the UUT. Further, state decoder 154 asserts CS 156, RE 162, and WE 166. Upon the next cycle of the memory clock on line 121, the state machine 150 enters state 04 at 353 and UUT control lines resume their states in idle state 00 at 350. Upon the next cycle of the memory clock on line 121, the state machine enters state 07 at 366 where the UUT control lines remain unchanged from state 04 at 353.

Upon the next cycle of the memory clock signal on line 121, the state machine 150 enters state 0A at 362a to effect a row activate operation on the UUT. The latency counter and comparator 170 is incremented from count 0 to count 1, and the state decoder asserts CS 156 and RE 162. The address multiplexor 196 is directed to route the contents of row address register 191 to the multiplexed address bus 124.

With the next cycle of the memory clock on line 121, state machine 150 remains in state 0A at 362b, and increments the latency counter and comparator 170 from count 1 to count 2. State decoder 154 de-asserts CS 156, and RE 162, and directs the address multiplexor 196 to resume routing of the column address on 202 to the multiplexed output address bus 124. Upon the next cycle of the memory clock on line 121, state machine 150 again remains in state 0A at 362c, increments the latency counter and comparator 170 from count 2 to count 3, and leaves the UUT control lines in the idle state. When the next cycle of the memory clock signal occurs, the latency counter and comparator 170 has reached the setting previously programmed into the Mode & LC register 192 at step 1002, the latency counter and comparator 170 has issued an equality signal on line 138, and the state machine 150 has entered state 0B at 363a. The state decoder 154 thereupon asserts CS 156, CE 164, and WE 166, and de-asserts CKE 160, thus stalling the UUT until the next memory write transfer from CPU 80 to the UUT. Simultaneously, the column address of the multiplexed address bus is loaded into the address multiplexor 196, and 40 bits of write data in data latches 18 is loaded into the UUT.

Upon the next cycle of the memory clock on line 121, state machine 150 remains in state 0B at 363b of FIG. 9, clears the internal row activate latch 151 of FIG. 7, and provides an acknowledgment over line 203 of FIG. 7 to CPU 80. State decoder 154 de-asserts CS 156, CKE 160, CE 164, and WE 166. State machine 150 remains in state 0B at 363 of FIG. 9 and at 363c of FIG. 21, until CPU 80 has completed the write cycle. UUT control lines remain unchanged from the previous memory clock cycle. During this time, CPU 80, having received an acknowledgment over line 203, de-asserts the UUT physical address.

Upon the next cycle of the memory clock signal on line 121, state machine 150 enters state 0F at 359 of FIG. 9 and logic step 359a of FIG. 21, where state machine 150 waits either for another write operation in the case of a multi-word burst, or for a burst-end command.

From logic step 1004, the logic flow proceeds to logic step 1005 where CPU 80 performs an output or write instruction to the address designated as the burst-end command, as will be described in more detail in the description of FIG. 17. From logic step 1005, the logic flow proceeds to logic step 1006, where the CPU 80's data cache is flushed to ensure that any subsequent read of the same location in the UUT will not be from the CPU's data cache memory.

From logic step 1006, the logic flow proceeds to step 1007 where control returns to the logic step of FIGS. 12a–12l which required a write to the UUT. When the Mode & LC Register 172 is programmed for a burst count greater than 1, software executes the necessary sequences of writing the high 8 bits followed by writing the low 32 bits to data latches 118 to satisfy the requirements of the programmed burst count. Referring to FIGS. 7 and 21, state machine 150 remains in state 0F at 359 and issues a CPU acknowledgment over line 203 during the write of the high 8 bits to data latches 118, and traverses the sequence of states 0F-0E-1B-0F once for each of the aforementioned writes of the low 32 bits.

Figure 17:
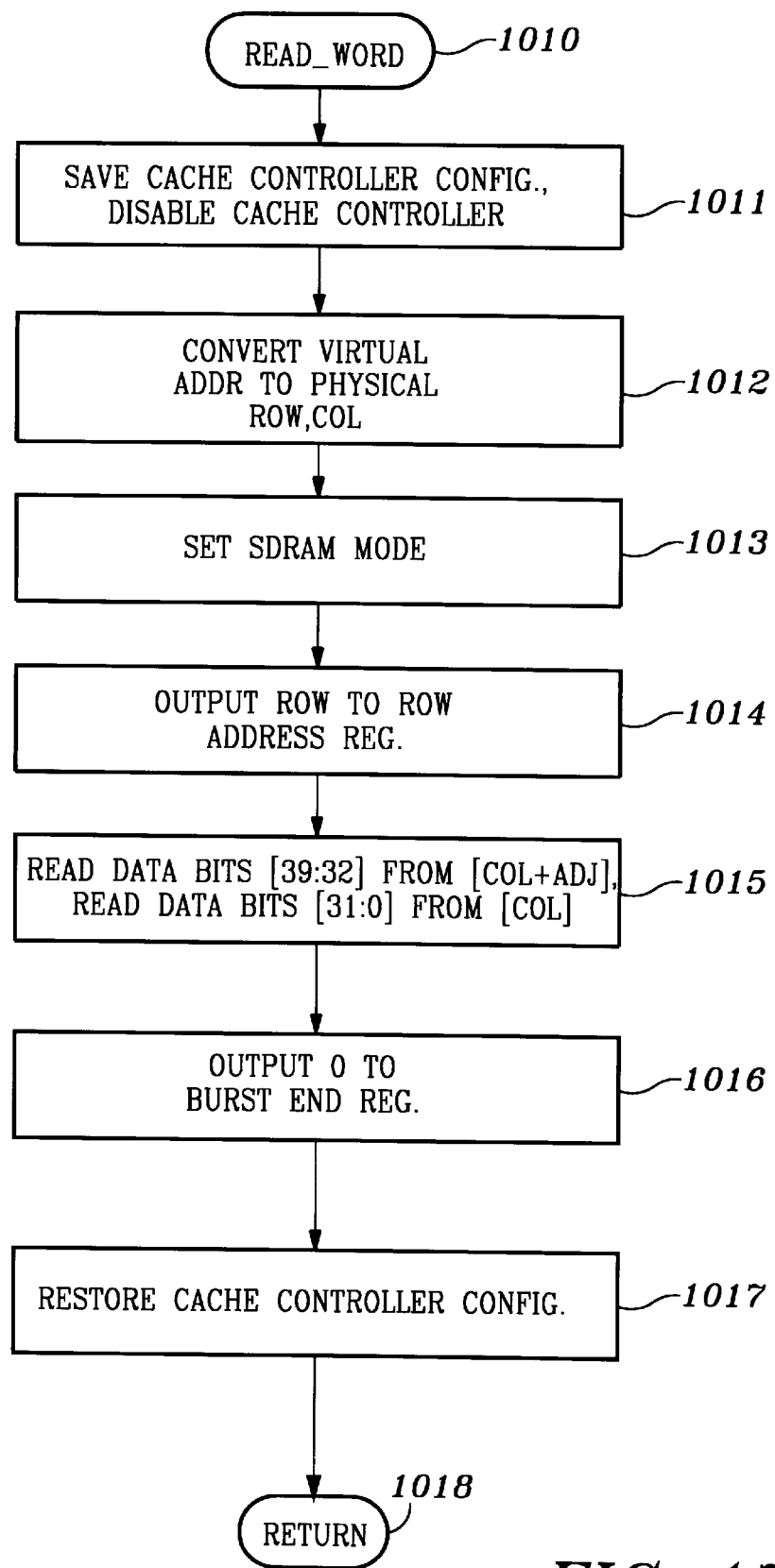
FIG. 17 is a logic flow diagram of a test software program executed by the memory test system 10 to read a word from a synchronous memory under test.

Whenever it is desired to read a memory location from the UUT, the logic flow enters the READ_WORD logic flow diagram at logic step 1010 of FIG. 17. From logic step 1010, the logic flow proceeds to logic step 1011 where the contents of the CPU 80 cache controller configuration are first saved in a local temporary variable before being reconfigured to disable the cache controller. The cache controller is disabled to guarantee that the CPU performs an operation from the physical memory of the UUT, rather than from internal CPU cache memory.

From logic step 1011, the logic flow proceeds to logic step 1012 where the virtual address is translated to a physical row address and physical column address as before described in a connection with the description of logic step 1001 of FIG. 16. The logic flow proceeds from logic step 1012 to logic step 1013, where the mode registers of the SDRAM ICs of the UUT are initialized simultaneously to establish a burst size of one (1), sequential address wrapping, and a CAS latency of three (3) as previously described in step 722.

From logic step 1013, the logic flow continues to logic step 1014 where the row address generated at logic step 1012 is output to row address register 191 of FIG. 7, and the row activate 151 and precharge 153 latches internal to the state machine 150 are set as previously described. From logic step 1014 the logic flow proceeds to logic step 1015, where the lower 32 bits of the 40 bits of data latches 118 are read to cause CPU 80 to generate an address over address control line 202 within the range of the UUT. The state machine 150 thereby is triggered to perform a read cycle as described in detail below. However, before CPU 80 can complete the read of the lower 32 bits, memory test controller 116 withholds its acknowledgment to CPU 80 and performs a multi-step operation to load all 40 bits of data latches 118 before transmitting an acknowledgment over line 203 to CPU 80.

Figure 24:
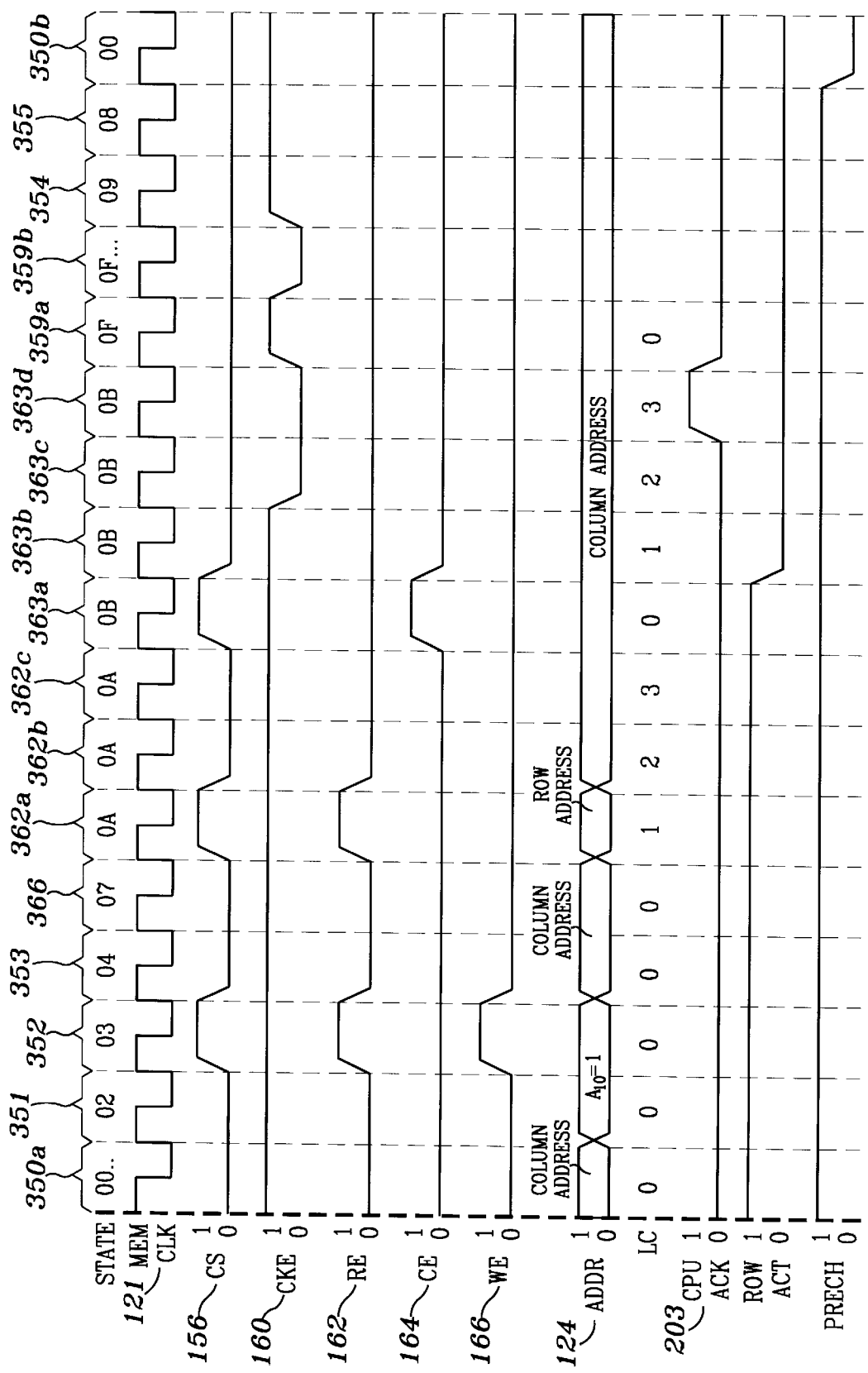
FIG. 24 is a graphical illustration of the timing signals generated by memory test system 10 in a read from synchronous memory.

Referring to the state diagram in FIG. 9 and the read cycle timing diagram of FIG. 24, state machine 150 begins in idle state 00 at 350 with CKE 160 asserted. Upon the next cycle of the memory clock signal on line 121, the state machine branches to state 02 at 351 in response to the precharge latch 153 within state machine 150 having been set by the previous writing to the row address register 191 at logic step 1014 of FIG. 17. During state 02, state decoder 154 sets the address multiplexor control line 168 to drive the address bus 124 with bit A10 to a logic 1, and to drive all remaining address bits to a logic 0 to signify a precharge command to the SDRAMs of the UUT.

When the next cycle of the memory clock signal on line 121 occurs, state machine 150 enters state 03 at 352 of FIG. 9 to maintain the same address selection, and assert signals CS 156, RE 162, and WE 166 in accordance with SDRAM requirements for performing a precharge operation. Upon the next cycle of the memory clock signal on line 121, state machine 150 enters state 04 at 353 of FIGS. 9 and 24, and returns all outputs of state decoder 154 to their idle states. When the next cycle of the memory clock signal on line 121 occurs, state machine 150 enters state 07 at 366 of FIG. 9 with all outputs remaining as in state 04. Upon the next cycle of the memory clock signal on line 121, state machine 150: enters state 0A at 362*a* of FIGS. 9 and 24; increments the latency counter and comparator 170 of FIG. 7 from count 0 to count 1; and asserts CS 156 and RE 162, and sets the address multiplexor control line 168 to select row address register 191. Address bus 122 thereby is driven in accordance with SDRAM requirements for loading the row address. Subsequent clock cycles provide a latency between the loading of row address and the loading of column address in accordance with SDRAM addressing requirements. Upon the next cycle of the memory clock signal on line 121, state machine 150 remains in state 0A at 362*b* of FIGS. 9 and 24, increments latency counter and comparator 170 from count 1 to count 2, de-asserts CS 156 and RE 162, and sets the address multiplexor control line 168 to select the column address line 198. Upon the next cycle of the memory clock signal on line 121, state machine 150 remains in state 0A at 362*c* of FIGS. 9 and 24; increments the latency counter and comparator 170 from count 2 to count 3 where the count value equals the CAS latency value previously programmed into the Mode & LC register 172 at logic step 1013 of FIG. 17; and causes latency counter and comparator 170 of FIG. 7 to assert an LC equality signal on line 138 back to state machine 150.

Upon the next cycle of the memory clock signal on line 121, state machine 150 enters state 0B at 363 of FIG. 9 and at 363*a* of FIG. 24; clears latency counter and comparator 170 of FIG. 7 to zero; and asserts CS 156 and CE 164. Upon the next cycle of the memory clock signal on line 121, state machine 150 remains in state 0B at 363*b* of FIGS. 9 and 24; increments latency counter and comparator 170 from count 0 to count 1; de-asserts CS 156 and CE 164; and clears row activate latch 151 internal to state machine 150. When the next cycle of the memory clock signal on line 121 occurs, state machine 150 remains in state 0B at 363*c* of FIGS. 9 and 24; increments latency counter and comparator 170 from count 1 to count 2; de-asserts CKE 160; and asserts the delay trigger line 117. At the completion of the delay programmed into programmable delay line 114 of FIG. 6, delay completion line 119 of FIG. 7 is asserted by state machine 150 to cause data latches 118 of FIG. 6 to sample the 40 bits of data coming from the UUT.

Upon the next cycle of the memory clock signal on line 121, state machine 150 remains in state 0B at 363*d* of FIGS. 9 and 24; increments latency counter and comparator 170 of FIG. 7 from count 2 to count 3; makes count value equal to the CAS latency value previously programmed into the Mode & LC Register 172 of FIG. 7; and causes the latency counter and comparator 170 to assert an LC equality signal on line 138 back to state machine 150, with no change in state of the control lines from the previous memory clock cycle. When the programmed CAS latency timing requirement has been met, an acknowledgment is returned over line 203 to CPU 80 to allow the CPU to resume control following the just-completed data read instruction.

Upon the next cycle of the memory clock signal on line 121, state machine 150 enters state 0F at 359*a* of FIGS. 9 and 24, where CKE 160 is asserted. When the next cycle of the memory clock signal occurs, state machine 150 remains in state 0F at 359*b* of FIGS. 9 and 24 where CKE 160 is de-asserted, thereby stopping the clocking internal to the SDRAM on the UUT. The state machine thereafter waits until either the upper 8 bits of the UUT word are read or the burst end command is received.

Referring again to logic step 1015 of FIG. 17, the upper 8 bits of the UUT are read. State machine 150 recognizes read and write data operations in the upper 8 bits of a UUT word whenever physical address bit A2 at 692 of FIG. 11 is a logic 1. However, data operations to the upper 8 bits cause no UUT control signals to be generated. Only an acknowledgment is returned over line 203 to CPU 80, and data bits [7 . . . 0] of the data bus 126 are transferred to bits [39 . . . 32] of data latches 118 of FIG. 6.

Had the Mode & LC Register 172 been programmed for a burst count greater than 1, a subsequent read of the lower 32 bits of a UUT word by CPU 80 would cause state machine 150 to enter state 0E of FIG. 9. Upon the next cycle of the memory clock signal on line 121, state machine 150 enters state 1B of FIG. 9 and remains there until the read signal from CPU 80 is de-asserted. State machine 150 thereupon returns to state 0F at 359 of FIG. 9, where CKE 160 is asserted to allow the next word in the burst sequence to be read from the UUT. The state machine 150 thereafter continues as described above.

It should be noted that any UUT burst length may be handled by CPU 80 by performing multiple iterations of reading the low 32 bits, followed by the high 8 bits of a 40 bit data word which is to be read from the UUT, and after the last set issuing a burst-end command.

From logic step 1015, where both the lower 32 bits and the upper 8 bits of data to be transferred from the UUT is read, the logic flow proceeds to logic step 1016 where CPU 80 executes a write instruction to the address designated as the burst end command. This command is decoded inside memory test controller 116 by port address decoder 175 and sent over line 179 to state machine 150, where it is acted upon as detailed below.

Upon the next cycle of the memory clock signal on line 121, the state machine 150 exits state 0F at 359b of FIG. 24 and enters state 09 at 354 of FIGS. 9 and 24, where CKE 160 is asserted with all other memory control signals in the inactive state. When the next cycle of the memory clock signal on line 121 occurs, the state machine 150 enters state 08 at 354 of FIG. 24 with no change in the state of the control lines. Upon the next cycle of the memory clock signal on line 121, idle state 00 at 350b of FIG. 24 is entered, and the precharge latch 153 internal to the state machine 150 is cleared.

From logic step 1016, the logic flow continues to logic step 1017 where the previously saved contents of the CPU cache controller configuration are restored. Normal data cache operations thereby are enabled. From logic step 1017, the logic flow process proceeds to logic step 1018, where control returns to the logic step requiring a read of the UUT such as occurs at logic steps 904, 934, 944 or 986. Due to the similarity of state machine operation between burst write and burst read operations, either operation may reference the sequence of states including state 0F at 359, state 0E at 364, state 1B at 365, and state 0F at 359 of FIG. 9. In the write cycle timing diagram of FIG. 21 the same sequence is illustrated as state 0F at 359a, 359b, and 359c, state 0E at 364, state 1B at 365a, 365b, and 365c, and state 0F at 359d.

Figure 18A:
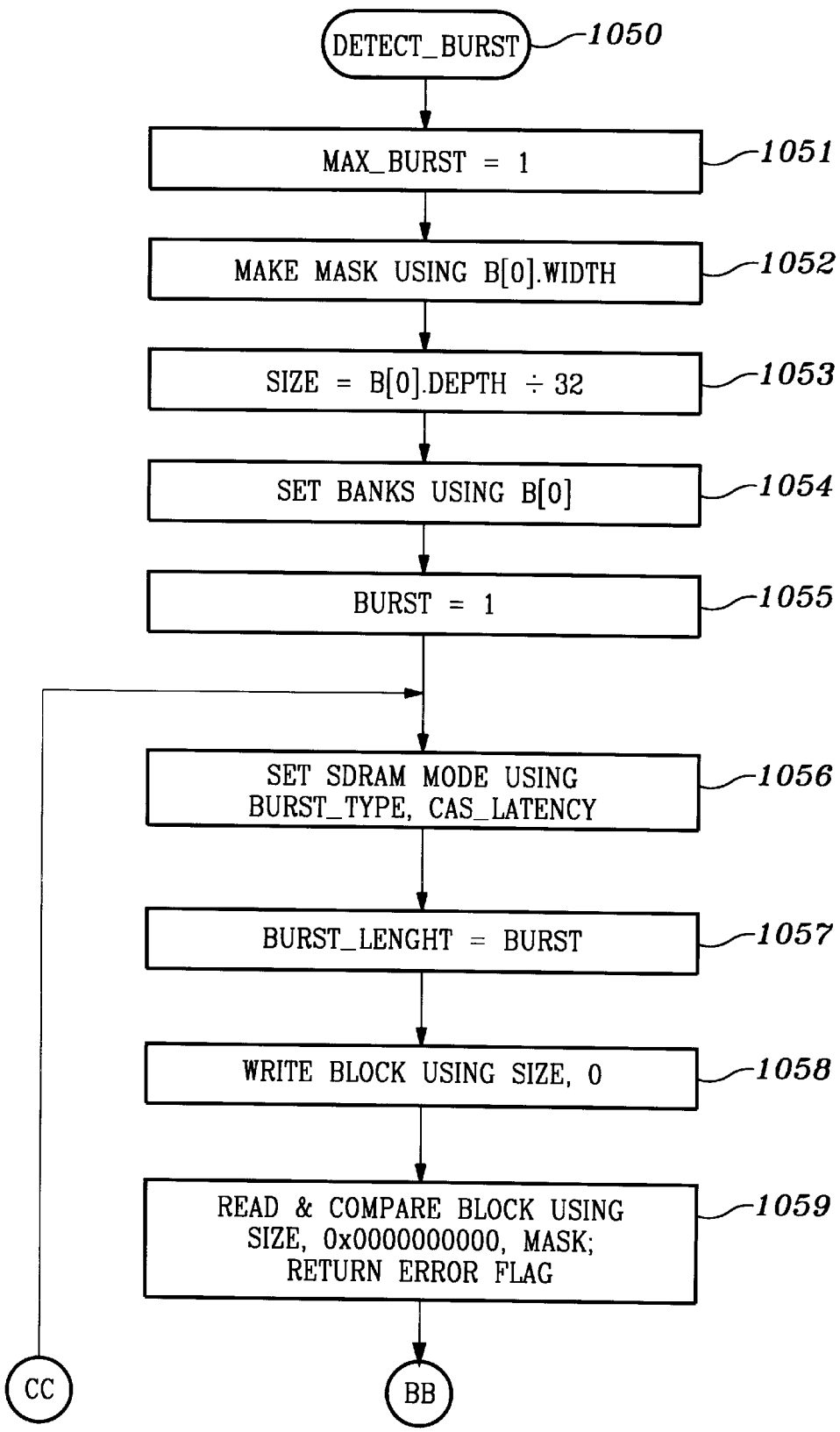
FIGS. 18a–18b constitute a logic flow diagram of a test software program executed by the memory test system 10 to determine the burst capability of a synchronous memory under test.

From logic step 850 of FIG. 12j of the auto-ID logic flow diagrams, the logic flow process jumps to logic step 1050 of the DETECT_BURST logic flow diagram of FIG. 18a. The logic flow then proceeds from logic step 1050 to logic step 1051, where local variable MAX_BURST is initialized to a logic 1 to represent the smallest possible burst length value. From logic step 1051, the logic flow continues to logic step 1052, where the variable WIDTH of Per-Bank Structure Table VII is used to create a local variable MASK with logic 1's in the bit positions corresponding to working bits of a functioning memory module. From logic step 1052, the logic flow continues to logic step 1053 where a local variable SIZE is set to ⅟₃₂nd of the value of the element DEPTH in Table VII indexed by [0]. A representative fraction of the bank depth is used to make the identification time reasonable.

From logic step 1053, the logic flow continues to logic step 1054, where memory test controller 116 of FIG. 6 is initialized using the elements in Table VI previously described in logic step 848 of FIG. 12j. The logic flow thereafter continues to logic step 1055 of FIG. 18a where a local variable BURST is initialized to the value 1 to serve as a loop counter. From logic step 1055, the logic flow continues to logic step 1056 where mode registers of the SDRAM ICs of the UUT are initialized concurrently to establish a burst size using the local variable BURST. to cause an address wrapping using the variable BURST_TYPE of the module parameter structure Table VI, and to establish a CAS latency using variable CAS_LATENCY of Table VI.

From logic step 1056, the logic flow continues to logic step 1057 where the variable BURST_LENGTH of Table VI is set to the contents of local variable BURST to represent the current length of burst under test. The logic flow thereafter continues to logic step 1058 where a WRITE BLOCK operation is performed using a local variable SIZE as the number of words to write, and all bits 0 at logic as the pattern to write. From logic step 1058, the logic flow continues to logic step 1059, where the identical block previously written at logic step 1058 is read and compared using local variable MASK with a pattern of all logic 0's, and the local variable ERROR is set to TRUE if the operation was successful. Otherwise, ERROR is set to FALSE.

Figure 18B:
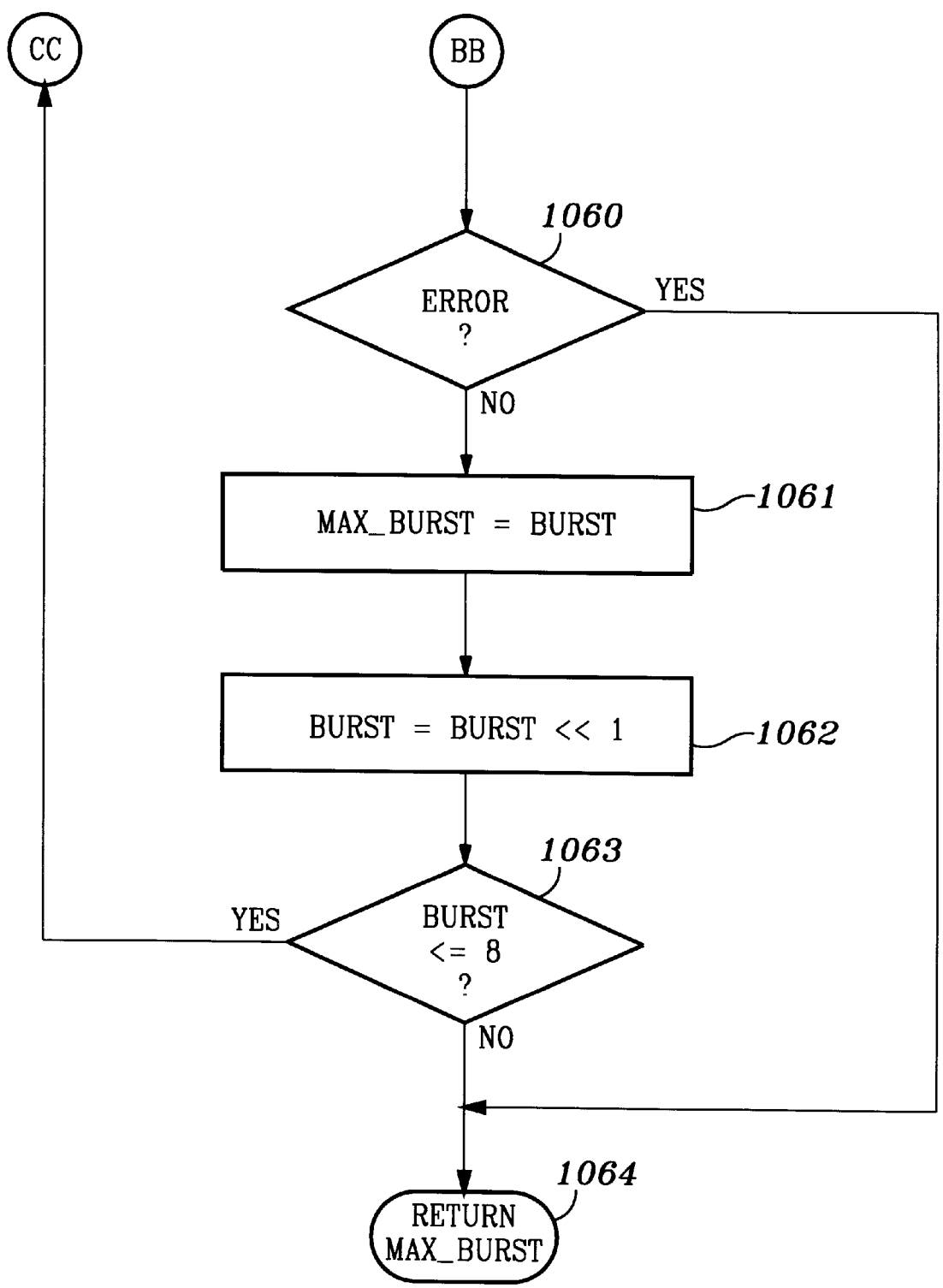

From logic step 1059, the logic flow continues through node BB to logic step 1060 of FIG. 18b, where contents of local variable ERROR are examined. If TRUE, the logic flow branches to logic step 1064 to return the last setting of local variable MAX_BURST to the logic step of FIGS. 12a–12j which required that the DETECT_BURST function be executed. Conversely, if the variable ERROR is FALSE, there was no error, and the logic flow continues to logic step 1061 where local variable MAX_BURST is set to the contents of the local variable BURST to represent the highest successfully tested burst length. From logic step 1061, the logic flow continues to step 1062 where the contents of local variable BURST are shifted left by 1 bit to effectively double its value. The logic flow thereafter proceeds to logic step 1063 where the contents of local variable BURST are compared to 8, and if less than or equal to 8, the logic flow loops back through node CC to logic step 1056 for the next iteration. If, however, the local variable BURST is greater than 8, the logic flow exits the loop to logic step 1064 where local variable MAX_BURST is returned to the calling logic step.

Figure 19:
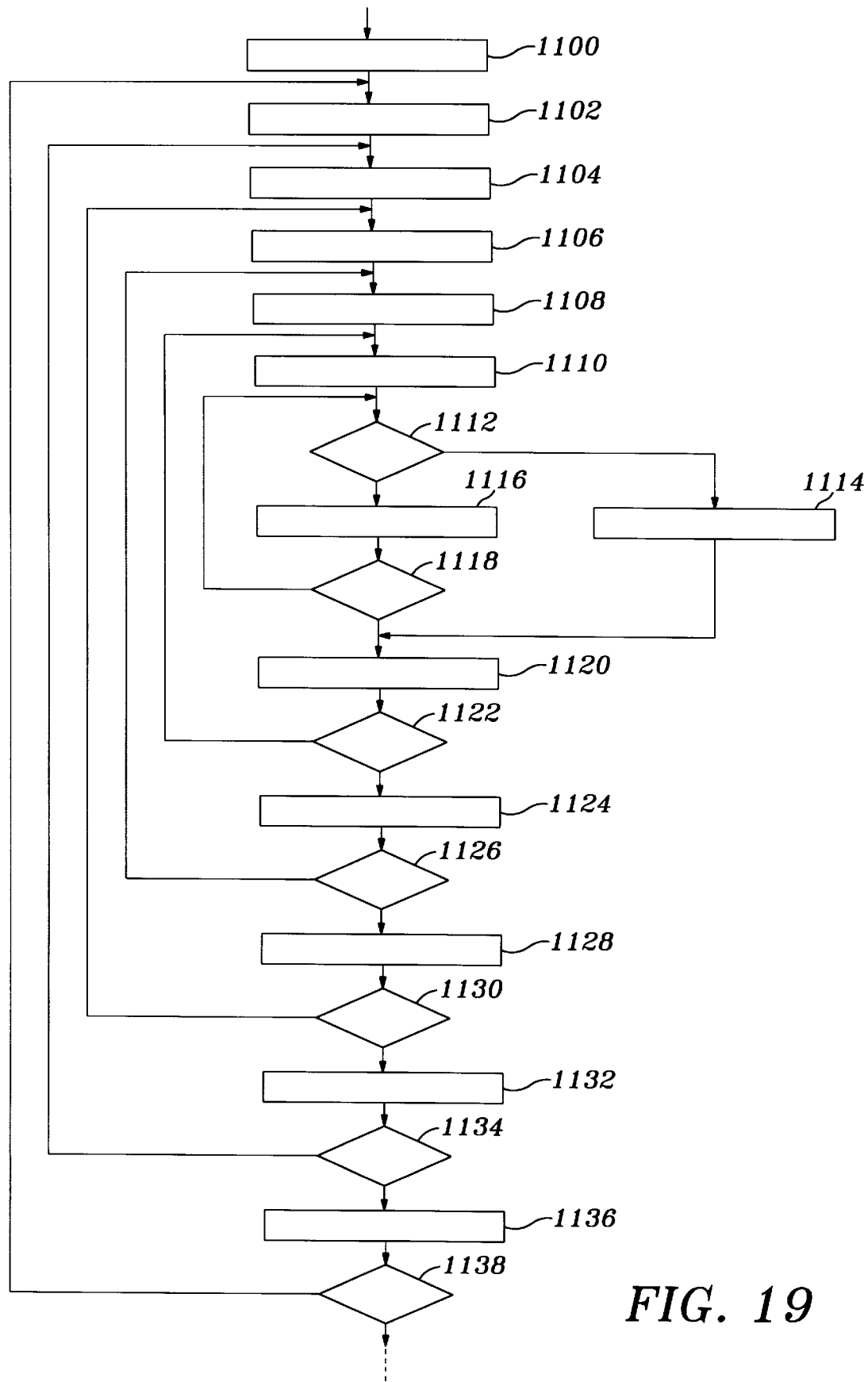
FIG. 19 is a logic flow diagram of a nested loop architecture for an automated identification process executed by the memory test system 10 to identify a synchronous memory under test.

FIG. 19 is a simplified flow diagram showing the nested loop construction of the auto-ID method as illustrated by the logic flow diagrams of FIGS. 12a–12l. Within the outermost bank loop, the five inner loops' index step by step through their respective tables stored in ROM 90 of FIG. 6. The tables for control lines RE, CE, CS, and DQMB contain entries of bits, each bit enabling or disabling a respective control line. Further, the order of the entries within tables are critical such that for any given entry in the table, the later occurring entries are either supersets or non-intersecting, and every entry preceding a given entry is either a subset or non-intersecting. Further, the tables are sparse in that only valid control line combinations are included so as to reduce the total number of possibilities from over 4 billion to 112. It can be shown that with fast processors taking 10 μs to evaluate a trial control line combination, 4 billion combinations would take over 10 hours. By way of contrast, the Auto-ID method disclosed herein with sparse tables takes only a few seconds. Additionally, use of a table of known parts allows go/no-go testing of parameters instead of sweeping all possible values with the attendant time penalty.

Following initialization of the tester hardware, the flow proceeds to logic step 1100 of FIG. 19 where initialization for the bank loop is performed at logic steps 724–726 of FIG. 12b.

The logic flow proceeds from logic step 1100 of FIG. 19 to logic step 1102 where initialization of the RE control line loop is performed at logic steps 728–730 of FIG. 12b.

After logic step 1102 of FIG. 19, the logic flow proceeds to logic step 1104 where the CPU outputs the current setting for the RE control lines to the memory test controller, and initializes the CE control line loop at logic steps 732–734 of FIG. 12b.

From step 1104, the logic flow proceeds to logic step 1106 where the CPU outputs the current setting for the CE control lines to the memory test controller 116, and initializes the CS control line loop. These functions are performed at logic steps 736–738 of FIGS. 12b and 12c.

After logic step 1106, the logic flow proceeds to logic step 1108 where the CPU outputs the current setting for the CS control lines to the memory test controller 116, and initializes the DQMB control line loop at logic steps 740–742 of FIG. 12c. The CS and DQMB loops are inner loops because their arrangements vary the most among SDRAM modules.

From logic step 1108, the logic flow proceeds to logic step 1110 where a scan of all previously tested banks is performed to ensure that the CS and DQMB control lines are not reused, that the CPU outputs the current setting for the DQMB control lines to the memory test controller 116, and that the initialization for the part loop is performed at logic steps 744–764 of FIGS. 12c and 12d.

The logic process thereafter proceeds from logic step 1110 to logic step 1112 of FIG. 19, where width and depth of the current bank under test are checked, and if wider and/or deeper than all previously found banks, the logic flow proceeds to logic step 1114. Logic step 1112 comprises steps 766–782 of FIGS. 12d and 12e. If, conversely, the width or depth is not greater than all previously found banks, the logic flow proceeds to logic step 1116 of FIG. 19 where the part loop index is decremented at logic step 784 of FIG. 12f.

After logic step 1116, the logic flow proceeds to logic step 1118 where the part loop is tested for an end-of-table condition, and if the condition is not present, the logic flow loops to logic step 1112 for the next part loop iteration. Logic step 1118 comprises logic step 786 of FIG. 12f. Logic step 1114 of FIG. 19 saves the new maximum values for width and depth, and all parameters necessary for describing the most recently identified bank. Logic step 1114 comprises logic steps 788–790 of FIG. 12f. From either the terminal count exit of logic step 1118 or from logic step 1114, the logic flow proceeds to logic step 1120 of FIG. 19 where the DQMB loop index is incremented. Logic step 1120 is comprised of logic step 792 of FIG. 12f.

After logic step 1120 of FIG. 19, the logic flow proceeds to logic step 1122 where the DQMB loop is tested for an end-of-table condition, and if the condition is not present, the logic flow loops to logic step 1110 for the next DQMB control line iteration. Logic step 1122 is comprised of logic steps 794–796 of FIG. 12f.

The logic flow thereafter proceeds from logic step 1122 to logic step 1124 of FIG. 19 where the CS loop index is incremented. Logic step 1124 is comprised of logic step 798 of FIG. 12f.

After logic step 1124 of FIG. 19, the logic flow proceeds to logic step 1126 where the CS loop is tested for an end-of-table condition, and if the condition is not present, the logic flow loops to logic step 1108 for the next CS control line iteration. Logic step 1126 is comprised of steps 800–802 of FIG. 12g.

The logic flow process continues from logic step 1126 of FIG. 19 to logic step 1128 where the CE loop index is incremented. Logic step 1128 is comprised of logic step 804 of FIG. 12g.

From logic step 1128 of FIG. 19, the logic flow proceeds to logic step 1130 where CE loop is tested for end-of-table condition, and if the condition is not present, the logic flow loops to logic step 1106 for the next CE control line iteration. Logic step 1128 is comprised of steps 806–808 of FIG. 12g.

After logic step 1130 of FIG. 19, the logic flow proceeds to logic step 1132 where an RE loop index is incremented. Logic step 1132 is comprised of logic step 810 of FIG. 12g.

The logic flow proceeds from logic step 1132 of FIG. 19 to logic step 1134 where the RE loop is tested for an end-of-table condition, and if the condition is not present, the logic flow loops to logic step 1104 for the next RE control line iteration. Logic step 1134 is comprised of steps 812–814 of FIG. 12g.

After logic step 1134 of FIG. 19, the logic flow proceeds to logic step 1136 where the CS and DQMB lines of the current bank are flagged as used for subsequent reference, and the bank loop index is incremented. Logic step 136 is comprised of logic steps 816–818 of FIG. 12h.

Following logic step 1136, the logic flow proceeds to logic step 1138 of FIG. 19 where the bank loop is tested for an end-of-table condition, and if the condition is not present, the logic flow loops to logic step 1102 for the next bank iteration. Logic step 1138 is comprised of step 820 of FIG. 12h.

From logic step 1138 of FIG. 19, the logic flow proceeds to housekeeping functions necessary for ordering the parameters in the structure, and for performing access speed and serial PD bits identification functions in logic steps 822–896 of FIGS. 12h–12l.

Figure 22:
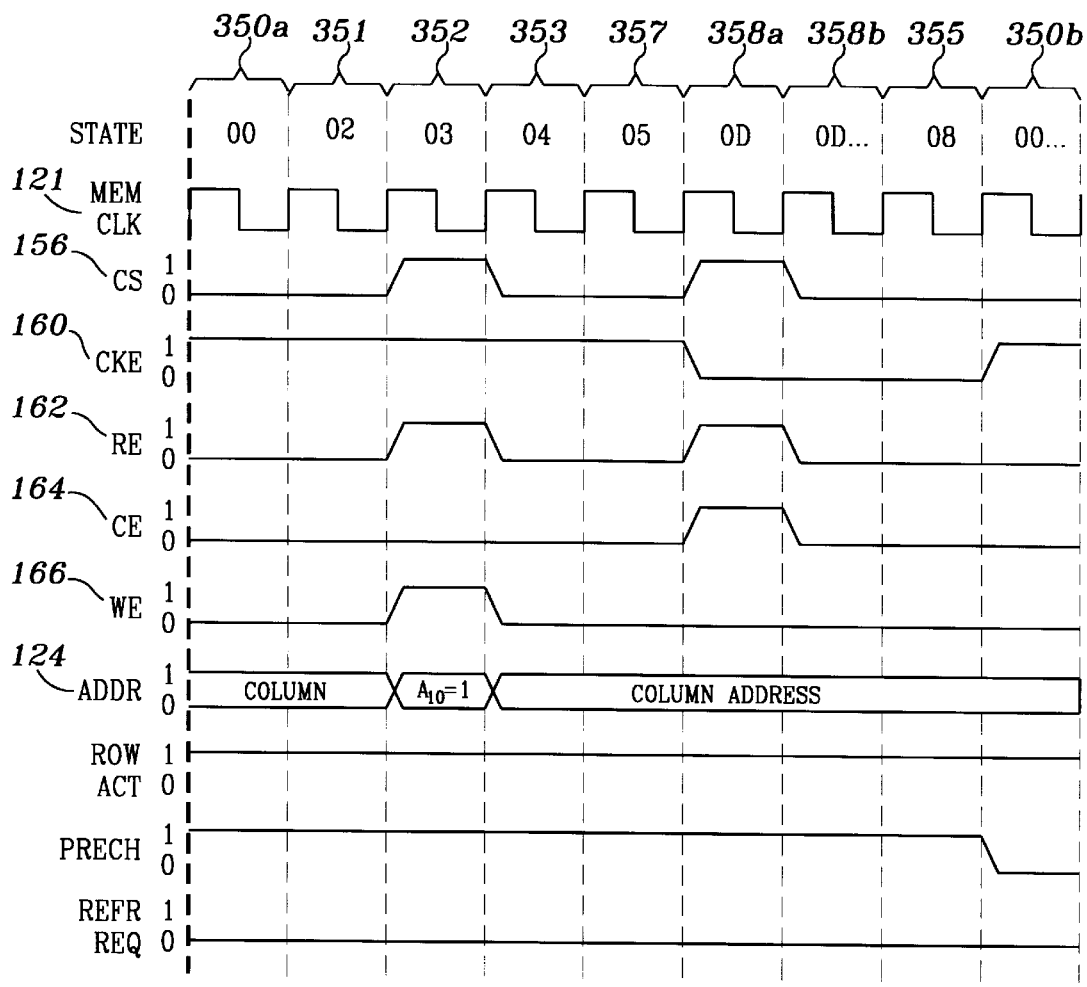
FIG. 22 is a graphical illustration of the timing signals generated by memory test system 10 during a self-refresh operation on synchronous memory.

Referring to FIG. 22 which illustrates the timing signals of the memory test system 10 that are generated during a self-refresh operation, all state changes occur in sync with the memory clock on line 121. To place the UUT into a self-refresh mode, CPU 80 of FIG. 6 issues a self-refresh command by performing an output or write instruction of data bit $D_0=1$ to the address designated as the self-refresh command. The set self-refresh command is decoded inside memory test controller 116 by port address decoder 175, and sent over line 178 to state machine 150.

State machine 150 exits the idle state 00 at 350 of FIG. 9 and at 350a of FIG. 24, and enters state 02 at 351 of FIGS. 9 and 24 where the precharge latch 153 of FIG. 7 is set and the state of the control lines remains unchanged from that of idle state 00. State machine 150 next enters state 03 at 352 of FIGS. 9 and 24, where state decoder 154 of FIG. 7 asserts CS 156, RE 162, and WE 166, and address multiplexor 196 selects a constant value with address bit $A_{10}=1$ to signify a precharge command in accordance with SDRAM specifications. From state 03 and at 352 of FIGS. 9 and 24, state 04 at 353 of FIGS. 9 and 24 is entered where state decoder 154 of FIG. 7 de-asserts CS 156, RE 162, and WE 166, and returns the address multiplexor 196 to its default selection of the CPU address bus 198.

State machine 150 next enters state 05 at 357 of FIGS. 9 and 24, where UUT control lines are unchanged from the previous state. State machine 150 continues to state 0D at 358 of FIG. 9 and 358a of FIG. 24, where state decoder 154 asserts CS 156, CKE 160, and RE 162, and asserts CE 164 in accordance with SDRAM requirements for entering the self-refresh mode. Upon the next cycle of the memory clock signal on line 121 of FIG. 6, state decoder 154 of FIG. 7 de-asserts CS 156, RE 162, CE 164, and WE 166, and remains in state 0D at 358 of FIG. 9 and at 358b of FIG. 24 until a next command is received.

When it is desired to exit the self-refresh mode, a second set of self-refresh commands are written by CPU 80 with data bit $D_0=0$, whereupon state machine 150 enters state 08 at 353 of FIGS. 9 and 24. Upon the next cycle of the memory clock signal on line 121, the state machine 150 enters idle state 00 at 350 of FIG. 9 and at 350b of FIG. 24, where CKE 160 is asserted and the precharge latch 153 of FIG. 7 is cleared.

Figure 23:
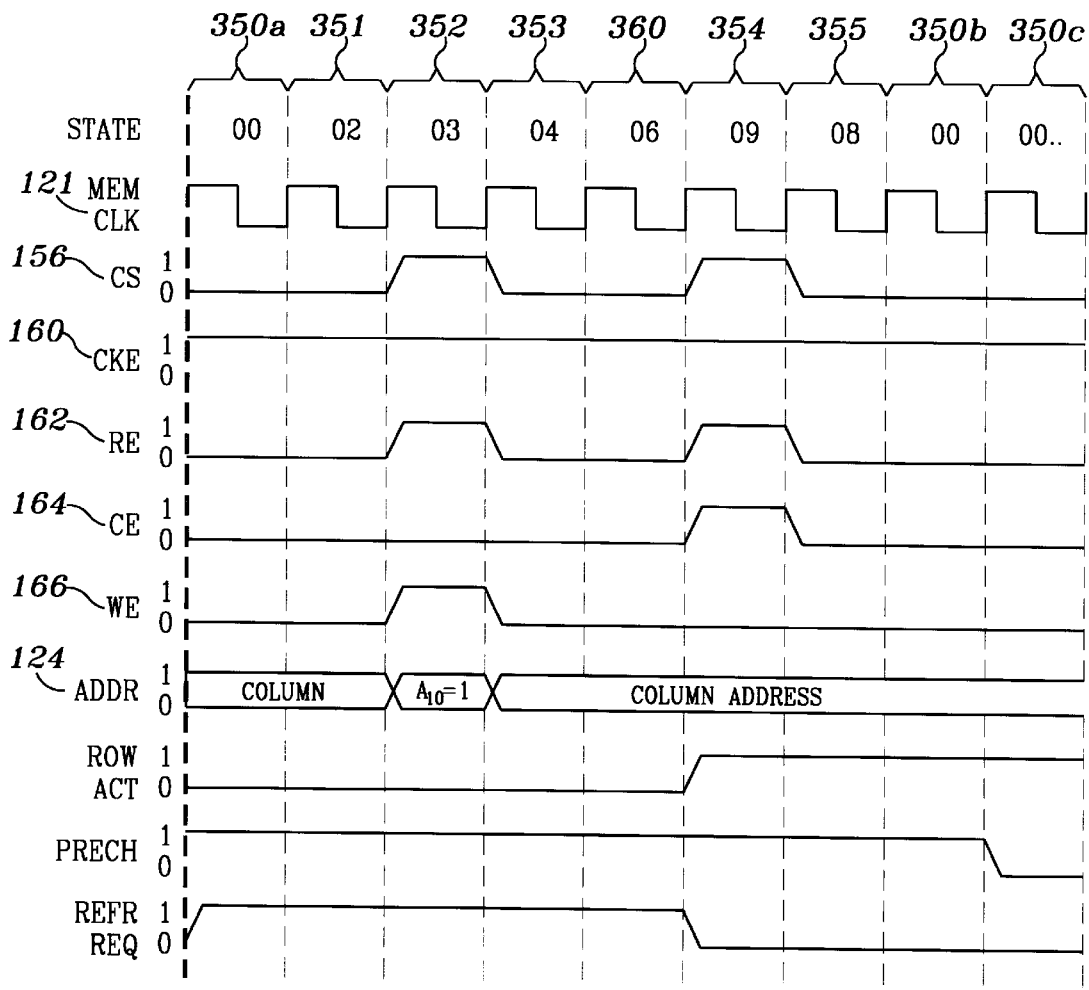
FIG. 23 is a graphical illustration of the timing signals generated by memory test system 10 during a CBR refresh operation on synchronous memory.

Referring to FIG. 23, the timing signals generated by the memory test system 10 to perform a memory refresh operation on the UUT are illustrated. By executing an Interrupt routine initiated by refresh timer 140, CPU 80 issues a set refresh command by performing an output or write instruction to the address so designated. This command is decoded inside memory test controller 116 of FIG. 7 by port address decoder 175, and sent over line 180 to state machine 150 where the refresh request latch 155 is set.

Referring to FIGS. 9 and 23, state machine 150 exits idle state 00 at 350 of FIG. 9 and 350a of FIG. 24, and enters state 02 at 351 where the precharge latch 153 of FIG. 7 is set and the state of the control lines remains unchanged from idle state 00. State machine 150 next enters state 03 at 352 of FIGS. 9 and 24, where state decoder 154 asserts CS 156, RE 162, and WE 166, and the address multiplexor 196 selects a constant value with address bit $A_{10}=1$ to signify a precharge command in accordance with SDRAM specifications. From state 03, the state machine 150 enters state 04 at 353 of FIG. 9 where state decoder 154 de-asserts CS 156, RE 162, and WE 166, and the address multiplexor 196 of FIG. 7 is returned to its default selection of the CPU address bus.

State machine 150 next enters state 06 at 360 of FIGS. 9 and 24, where the refresh request latch 155 is cleared. UUT control lines are unchanged from the previous state. State machine 150 next enters state 09 at 354 of FIGS. 9 and 24 where row activate latch 151 is set for reference by subsequent read and write commands; and state decoder 154 asserts CS 156, RE 162, and CE 164 in accordance with SDRAM requirements for the refresh mode. Upon the next cycle of the memory clock signal on line 121, state machine 150 enters state 08 at 355 of FIGS. 9 and 24 where decoder 154 de-asserts CS 156, RE 162, and CE 164. Upon the next cycle of the memory clock signal on line 121, the state machine 150 remains in idle state 00 at 350 of FIG. 9 and 350b of FIG. 24, where signal lines remain unchanged from the previous memory clock cycle. Upon the next cycle of the memory clock signal on line 121, the state machine 150 remains in idle state 00 at 350 of FIG. 9 and 350c of FIG. 24 where the precharge latch 153 is set.

ALTERNATIVE SGRAM EMBODIMENT

Figure 27:
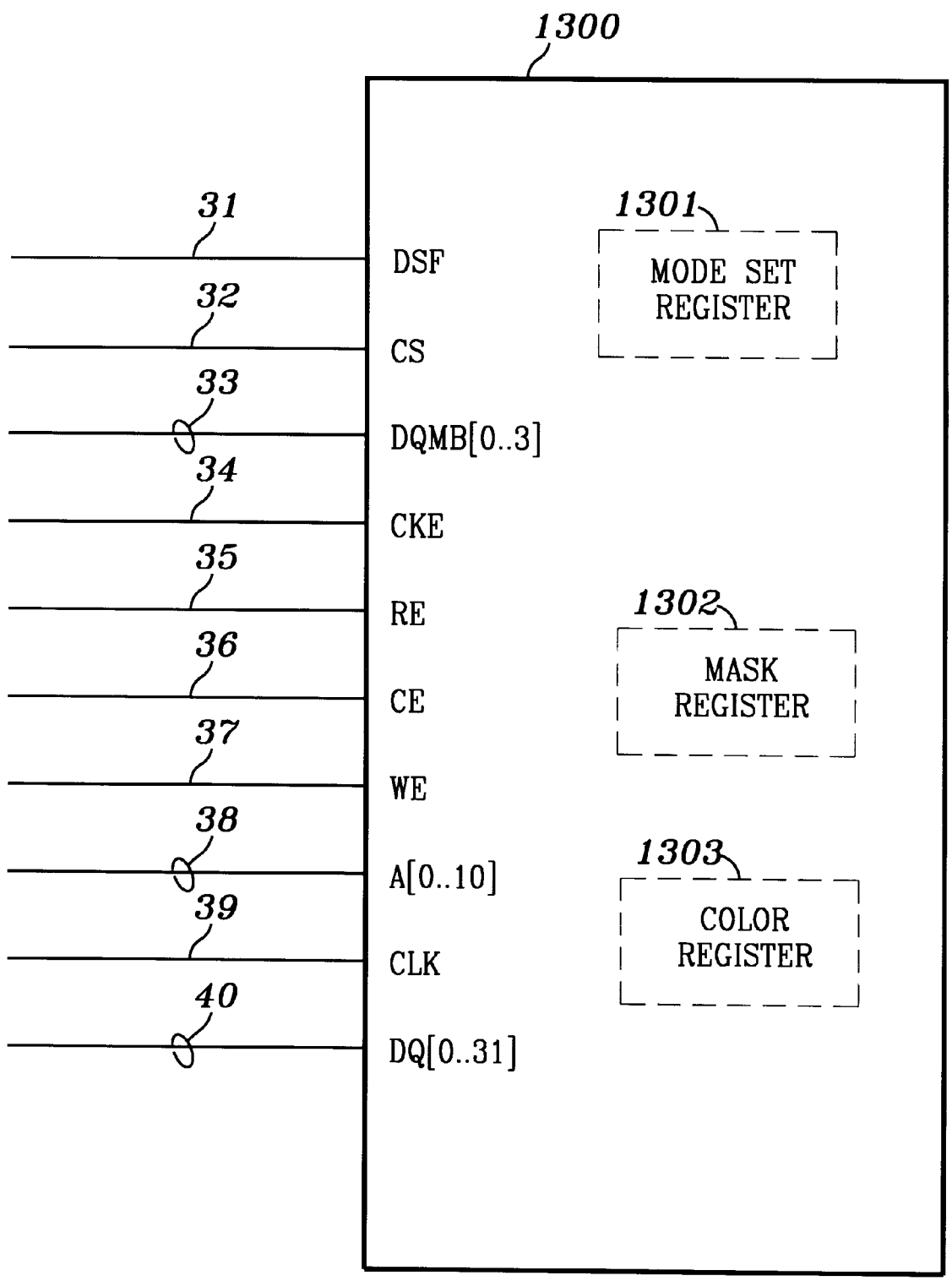
FIG. 27 is a graphic illustration of the internal registers and control lines of a SGRAM IC.

Synchronous Graphics RAMs (SGRAMs) have been proposed by JEDEC as an extension of SDRAMs. SGRAMs are distinguished from conventional SDRAMs by the inclusion of a mode set register 1301, a mask register 1302, and a color register 1303 as depicted in FIG. 27. The mode set register 1301 is accessible to the address bus when the signal DSF 31 is asserted. Asserting control signals DSF 31, CS 32, RE 35, CE 36, WE 37, and address bit $A_5$ of bus 38 in the same cycle of a CLK 39 signal causes the mask register 1302 in the SGRAM to be loaded with the contents of the DQ lines of the data bus 40. The mask register 1302 provides bit granularity of control in writing a word to memory in the same manner as the DQMB lines 33 provide byte granularity. Similarly, by asserting control signals DSF 31, CS 32, RE 35, CE 36, WE 37, and address bit $A_6$ of bus 38 in the same cycle of a CLK 39 signal causes the color register 1303 in the SGRAM to be loaded with the contents of the DQ lines of the data bus 40. During subsequent write cycles to SGRAM, the color register 1303 provides the data masked by the contents of the DQ lines of the data bus 40.

Several different methods may be employed to identify SGRAMs. For example, SGRAM-unique UUT adapters with SGRAM-specific adapter ID codes may be used. When the CPU 80 detects a SGRAM-unique adapter ID code, the CPU may cause the WPB & SP register 169 to be programmed, and the word "SGRAM" to be displayed to the operator. Thereafter, the auto-ID process can proceed as with SDRAMs.

Originally, SGRAM modules had the same physical packaging as 144 pin SO DIMM SDRAM modules. However, an industry study found signal integrity to be poor, and JEDEC redefined signal routing for SGRAMs to improve signal integrity. Further, the connector shape of the SGRAM module was changed to preclude accidentally plugging a SGRAM module into a socket designed for SDRAM modules. Therefore, the socket for the 144 pin SO DIMM SGRAM is different from the 144 pin SO DIMM SDRAM, thereby allowing unambiguous sensing of a plugged-in SGRAM module. An SGRAM further may be identified by using a UUT socket in which only a SGRAM will fit.

SGRAM identification also may occur by performing a trial setting of the WPB & SP register 169, and check for the existence of the write-per-bit and color mask registers of a SGRAM IC by exercising the register functions. More particularly, known patterns may be programmed into the write-per-bit and color registers of the SGRAM, and other known patterns may be written into the memory and read from same locations. If the data read is identical to the data written, then the memory is either a SDRAM or a SGRAM with its DSF line electrically disabled. Otherwise, a properly operating SGRAM will have applied the contents of the write-per-bit and color registers to the data written. If the DSF line is disabled, certain SGRAMs may still be detected if the combination of the number of row and column address lines of the UUT match the entry flagged as SGRAM.

PARTS_LIST TABLE XI

| INDEX | RA | CA | DEPTH | DEVICE | TYPE: G/D |
|---|---|---|---|---|---|
| 0 | 0 | 0 | 0 | "NONE" | 0 0 |
| 1 | 10 | 8 | 256K | "256K × 32" | 1 0 |
| 2 | 12 | 8 | 1M | "1M × 16" | 0 1 |
| 3 | 12 | 9 | 2M | "2M × 8" | 0 1 |
| 4 | 12 | 10 | 4M | "4M × 4" | 0 1 |
| 5 | 14 | 8 | 4M | "4M × 16" | 0 1 |
| 6 | 14 | 9 | 8M | "8M × 8" | 0 1 |
| 7 | 14 | 10 | 16M | "16M × 4" | 0 1 |

The PARTS_LIST TABLE XI above illustrates how a typical SGRAM may be accommodated by the enhancement of the PARTS_LIST TABLE V to include a row 1 with the number 10 stored as the number of row address lines (RA), the number 8 stored as the number of column address lines (CA), 256K stored as the depth in words, and "256K×32" as the text description. Further, a "TYPE" column is added which includes flags G (for SGRAM) and D (for SDRAM). Thus, for example, if the DSF line of a SGRAM has been disabled, the SGRAM will perform as a SDRAM and be correctly identified by the Nested Loop method.

The Type G and D flags become formal test parameters which are used by the auto-ID software. Thus, when memory test software senses the type G flag, tests specific to SGRAMs are invoked, such as the exercise of the write-per-bit and color register functions.

The PARTS_LIST TABLE XI gives rise to a fourth method of identifying SGRAMs. That is, an SGRAM may be differentiated from a SDRAM when it matches address parameters which are flagged in the PARTS_LIST TABLE XI as unique to SGRAMs. As SGRAM devices continue to grow in capacity, it is possible that an SGRAM may be manufactured with addressing parameters identical to a given SDRAM. In this case both type G and D flags will be set for a same entry, and the SGRAM identification process proceeds as before described. Further, as other types of memory devices are developed around the SDRAM core, the TYPE column can be enhanced with other corresponding flags.

Figure 28:
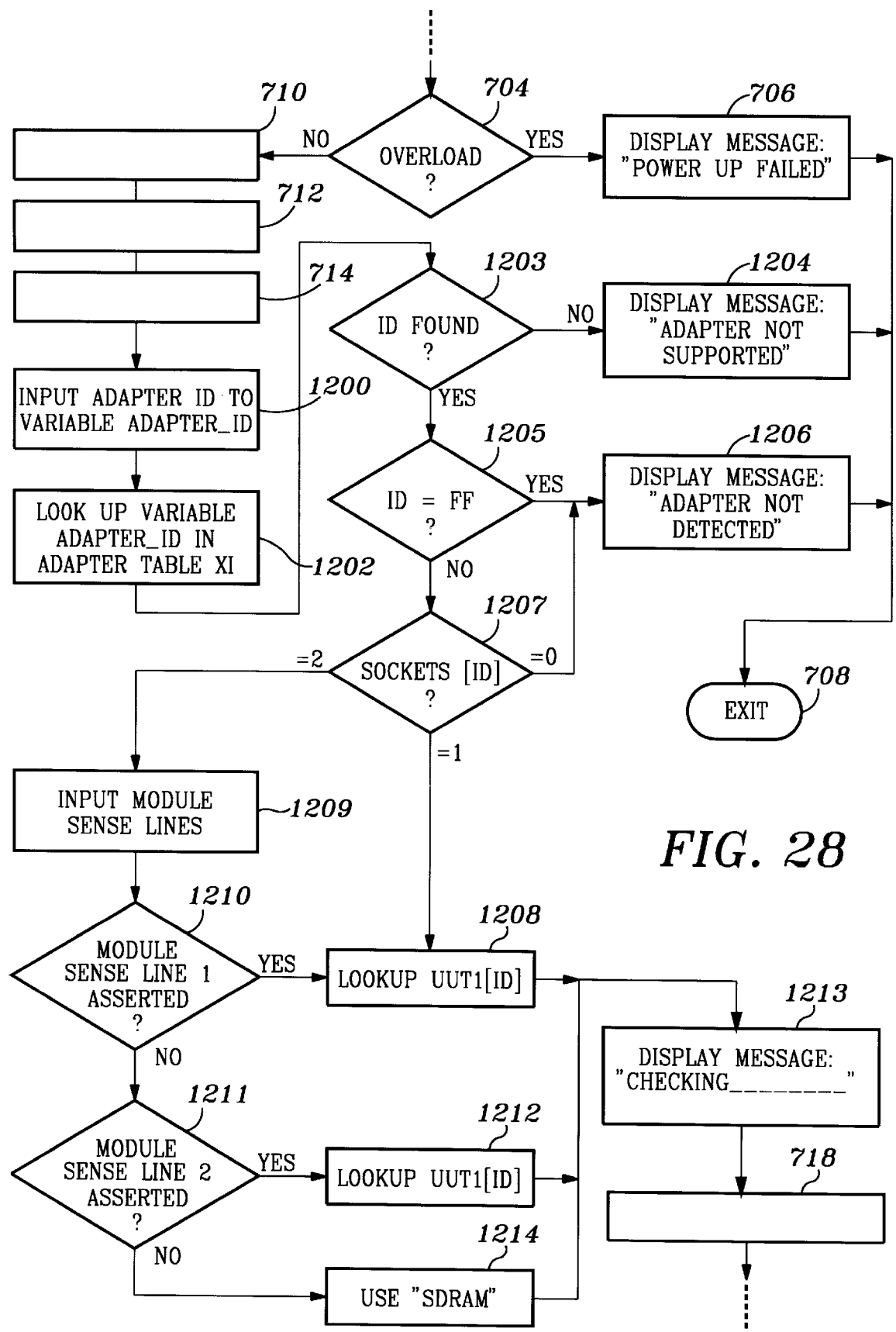
FIG. 28 is a logic flow diagram which illustrates the changes which must be made to the logic flow diagram of FIG. 12a to accommodate the identification of SGRAMs.

In order to accommodate the identification of SGRAMs revisions are required to be made to the logic flow diagrams of FIGS. 12a–12l. For example, logic step 716 of FIG. 12a is deleted, and the logic steps occurring between logic step 704 and logic step 718, and between logic step 704 and logic step 708, become that illustrated in FIG. 28. Thus, at logic step 1200, the adapter ID code indicated by UUT adapter 14 supplied by way of buses 85 and 86 of FIG. 6b is I/O interface 101 to CPU 80, which in turn stores the code into the ADAPTER_ID location of VARIABLE TABLE VIII. The logic flow then proceeds to logic step 1202 where the adapter ID is looked up in ADAPTER TABLE XII below. At logic step 1203, if the adapter ID was not found, the logic flow branches to logic step 1204 where a message "ADAPTER NOT SUPPORTED" is displayed. An adapter ID may not be found, by way of example, if tester software was not updated to support newly developed UUT adapter hardware. From logic step 1204, the logic flow continues to logic step 708 to exit the auto-ID process.

If the adapter ID were found at logic step 1203, the flow would continue to logic step 1205 where the adapter ID is compared to a constant hexadecimal FF. If equal, the logic flow branches to logic step 1206 where a message "ADAPTER NOT DETECTED" is displayed. A UUT adapter 14 would not detected, for example, if the adapter was left unplugged. From logic step 1206, the logic flow continues to logic step 708 to exit as before described.

The adapter ID is assumed to be valid if it is found in ADAPTER TABLE XII, and it is not equal to FF hexadecimal. In that event the adapter ID is used as an index to the SOCKETS column of ADAPTER TABLE XII. If the SOCKETS entry is equal to zero, the logic flow branches to logic step 1206 where message "ADAPTER NOT DETECTED" is displayed and the logic flow continues as before described. If the SOCKETS entry is equal to one, however, the corresponding UUT1 entry is accessed at logic step 1208 and is used as a message string. The logic flow thereafter continues to logic step 1213 where the message "CHECKING __" is displayed with the aforementioned message string being inserted into the blank space.

If, at logic step 1207, the number of UUT sockets is determined to be equal to two, the logic flow branches to logic step 1209 where module sense lines 73a and 73b are sensed. The logic flow then continues to logic step 1210 to determine whether line 73a is being asserted to indicate whether a module 20 has been inserted into UUT socket 11a. If so, the logic flow branches to logic step 1208 where the message string corresponding to UUT1 of ADAPTER TABLE XII, as indexed by the adapter ID, is looked up. The logic flow then continues as before described. If no module has been inserted into UUT socket 11a, the module sense line 73b for UUT socket 11b is sened, and if asserted, the logic flow branches to logic step 1211 where the message string corresponding to UUT2 of ADAPTER TABLE XII, indexed by the adapter ID, is looked up. The logic flow then continues to logic step 1213 as before described. If neither of the module sense line 73a and 73b are asserted, the logic flow continues to logic step 1214 where the message "SDRAM" is used as the default message string. Alternatively, the message string "NO MODULE DETECTED" could be displayed. From logic step 1214, the logic flow process proceeds to logic step 213 where the message "CHECKING__" is displayed with the default message string being inserted in the blank space.

ADAPTER TABLE XII

| ID Hex | SOCKETS | UUT1 | UUT2 |
|---|---|---|---|
| 51 | 2 | "SDRAM" | "SDRAM" |
| 53 | 1 | "SGRAM" | |
| 55 | 2 | "SDRAM" | "SGRAM" |
| FF | 0 | | |

A change to the logic flow diagrams of FIGS. 12a–12l which is required to is the inclusion of a logic step 1215 between logic steps 766 and 768 of FIG. 12d.

Figure 29:
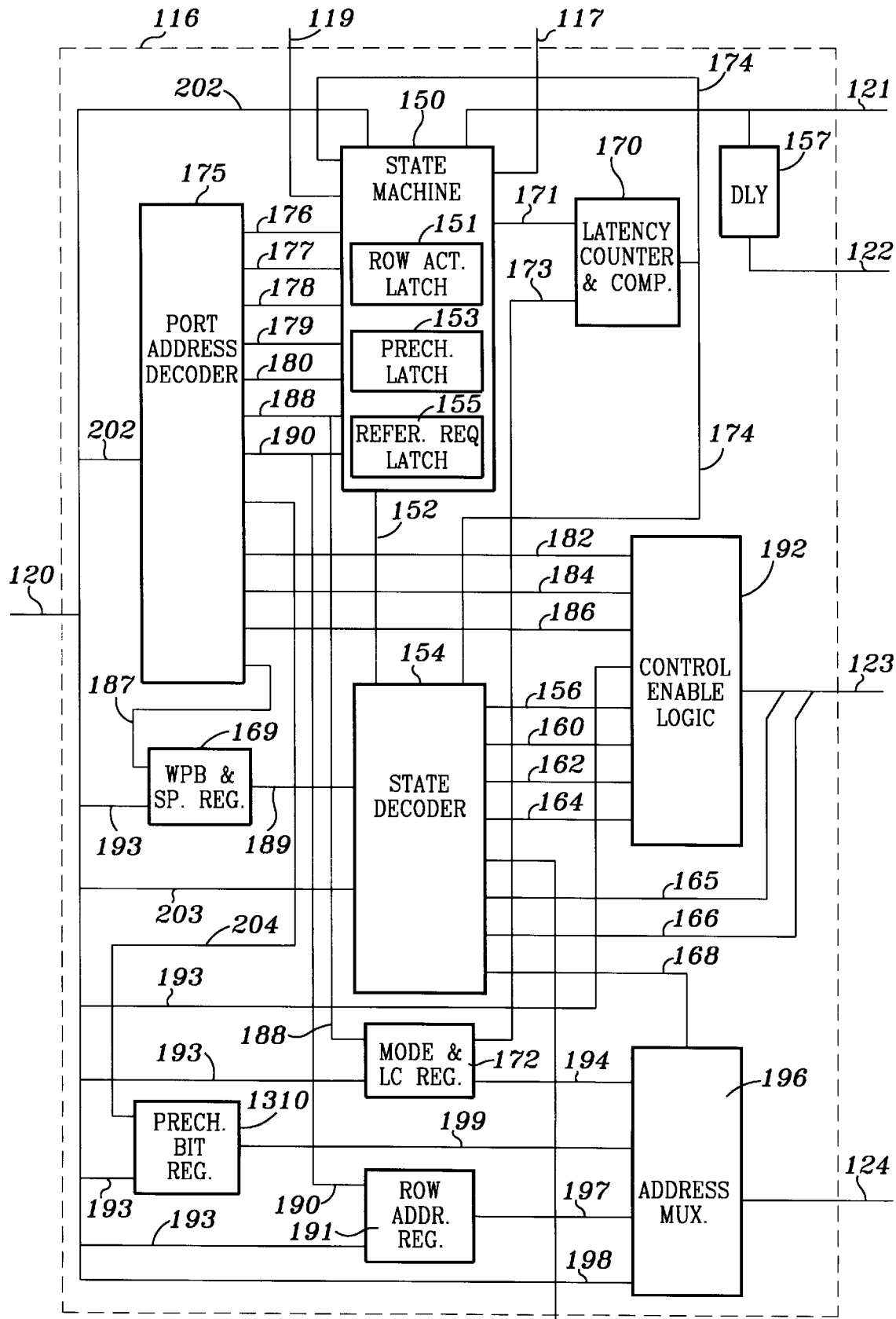
FIG. 29 illustrates the addition of a precharge bit, register to the functional block diagram of FIG. 7 to accommodate the identification of SGRAMs.

At logic step 1215, the PART_INX value in VARIABLE TABLE VIII is used as an index into the PARTS_LIST TABLE XIII below. The indexed entry in the PRECH column of the Table thereupon is loaded into a precharge bit register 1300 as illustrated in FIG. 29. FIG. 29 is identical to FIG. 7, with the exception that the precharge bit register 1300 has been added.

Referring to FIG. 29, precharge bit register 1300 is added to the memory test controller 116 to provide a means for selecting the correct precharge bit in accordance with SDRAM specifications and various manufacturer specifications. The precharge bit register 1300 functions to substitute its $A_8$, $A_9$, $A_{10}$, or (in anticipation of larger synchronous memory IC designs) $A_{11}$ bit outputs for the before described $A_{10}$ constant output.

When it is desired to program the precharge bit register 1300, the CPU 80 applies the precharge bit register address and control signals to bus 120 and bus 202, and the data of the PRECH column of the PARTS_LIST TABLE VIII as indexed by PART_INX to bus 193. The port address decoder 175 recognizes the address of the precharge bit register on bus 202, and sends a strobe signal on line 204 to load the data on bus 193 into the register.

The output of the precharge bit register 1300 is applied by way of lines 197 and 199 to data inputs of the address multiplexer 196 to replace the $A_{10}$=1 data input for SDRAMs.

PARTS_LIST TABLE XIII

| INDEX | RA | CA | DEPTH | DEVICE | PRECH. | TYPE: G/D |
|---|---|---|---|---|---|---|
| 0 | 0 | 0 | 0 | "NONE" | 0 | 0 0 |
| 1 | 10 | 8 | 256K | "256K × 32" | 8 | 1 0 |
| 2 | 11 | 8 | 512K | "512K × 32" | 8 | 1 0 |
| 3 | 11 | 8 | 512K | "512K × 32" | 9 | 1 0 |
| 4 | 12 | 8 | 1M | "1M × 16" | 10 | 0 1 |
| 5 | 12 | 9 | 2M | "2M × 8" | 10 | 0 1 |
| 6 | 12 | 10 | 4M | "4M × 4" | 10 | 0 1 |
| 7 | 14 | 8 | 4M | "4M × 16" | 10 | 0 1 |
| 8 | 14 | 9 | 8M | "8M × 8" | 10 | 0 1 |
| 9 | 14 | 10 | 16M | "16M × 4" | 10 | 0 1 |

The logic step 1215 was added to configure the memory controller 94 for precharge bits on a part by part basis before any access is made to UUT adapter 14.

From logic step 1215, the logic flow of FIG. 12d continues to logic step 768 to proceed as before described.

When the nested loop process has determined the addressing, width, and depth of the memory module being identified, all SDRAM parameters except speed have been established, and the PART_INDEX variable in the Per-Bank Structure Table VII for bank 0 is initialized as an index into the PARTS_LIST Table XI. More specifically, in the event that a "graphic" type synchronous memory device is identified, the TYPE G flag of the PARTS_LIST Table XI will be a logic "1".

Figure 30A:
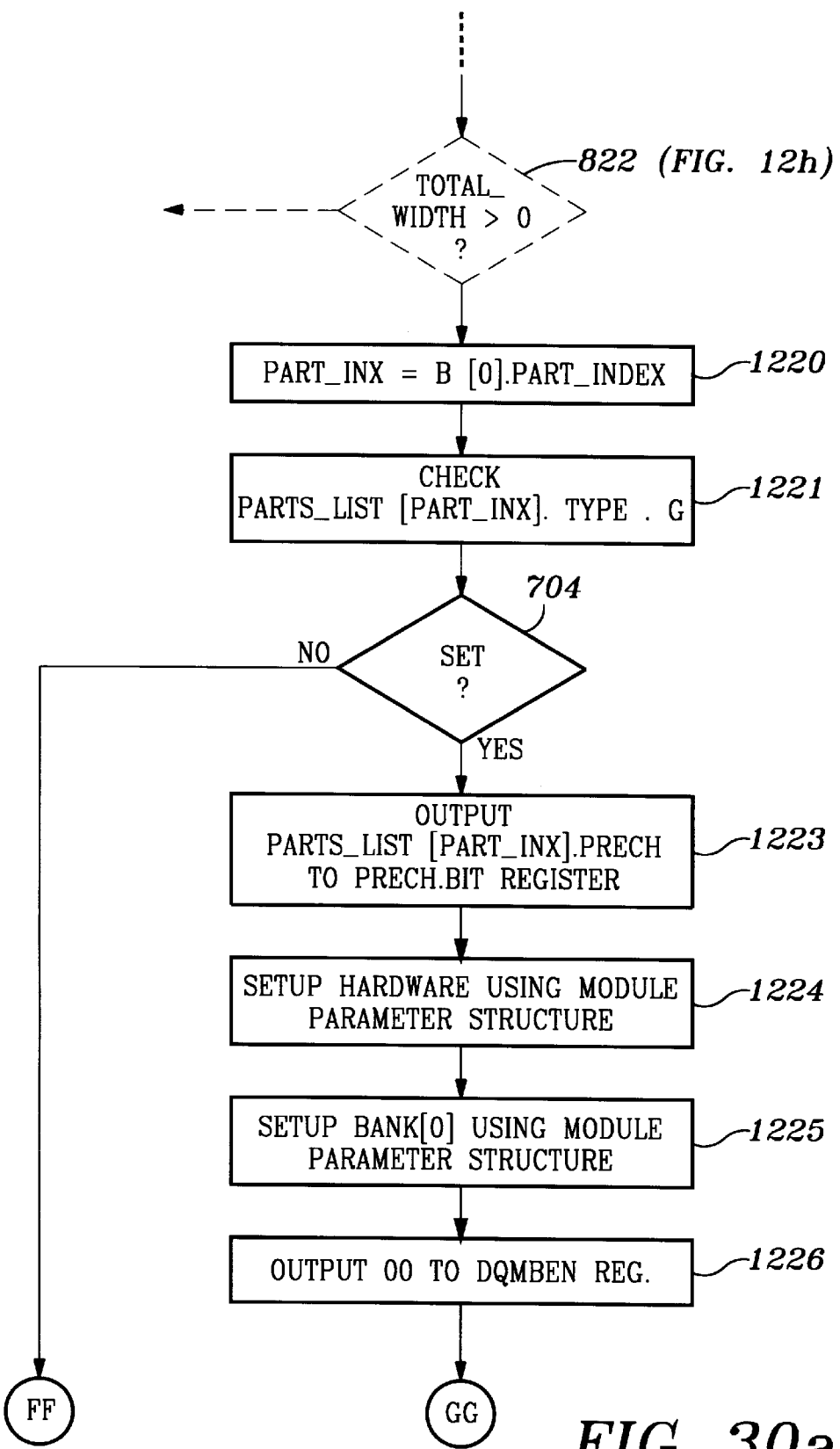
FIGS. 30a–30c illustrate a logic flow diagram revision to FIG. 7 which is required to accommodate SGRAMs.
Figure 30B:
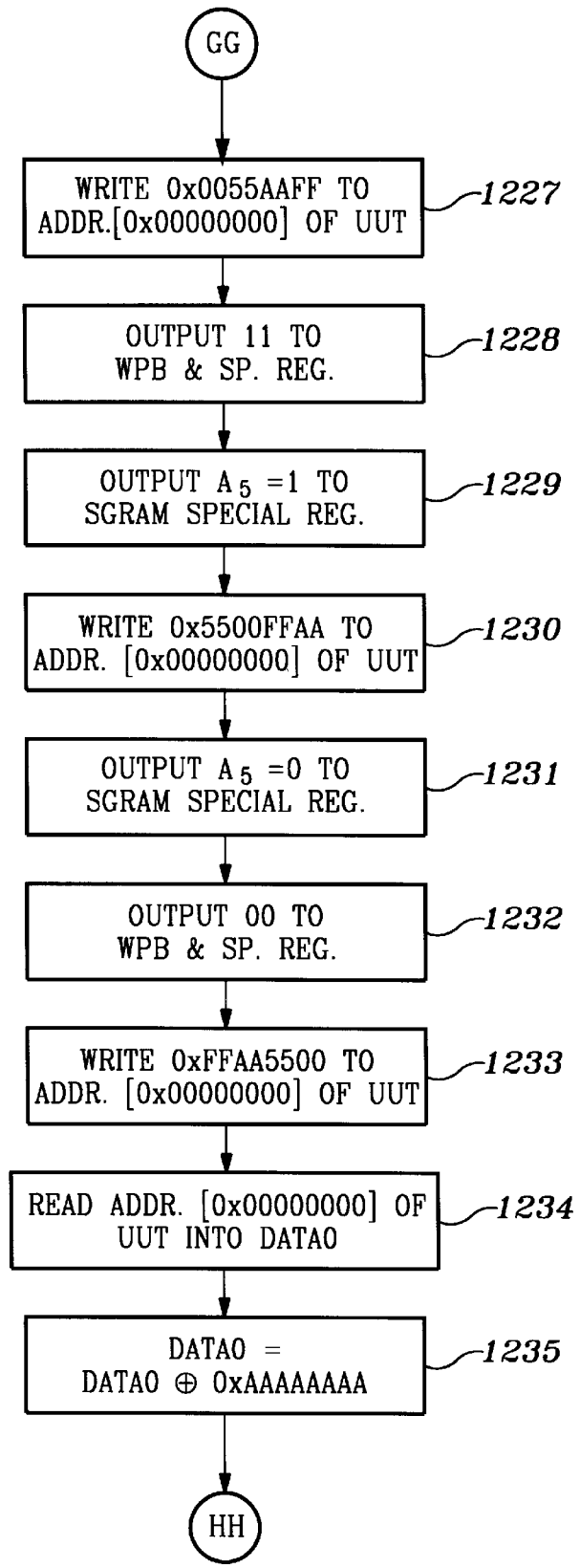
Figure 30C:
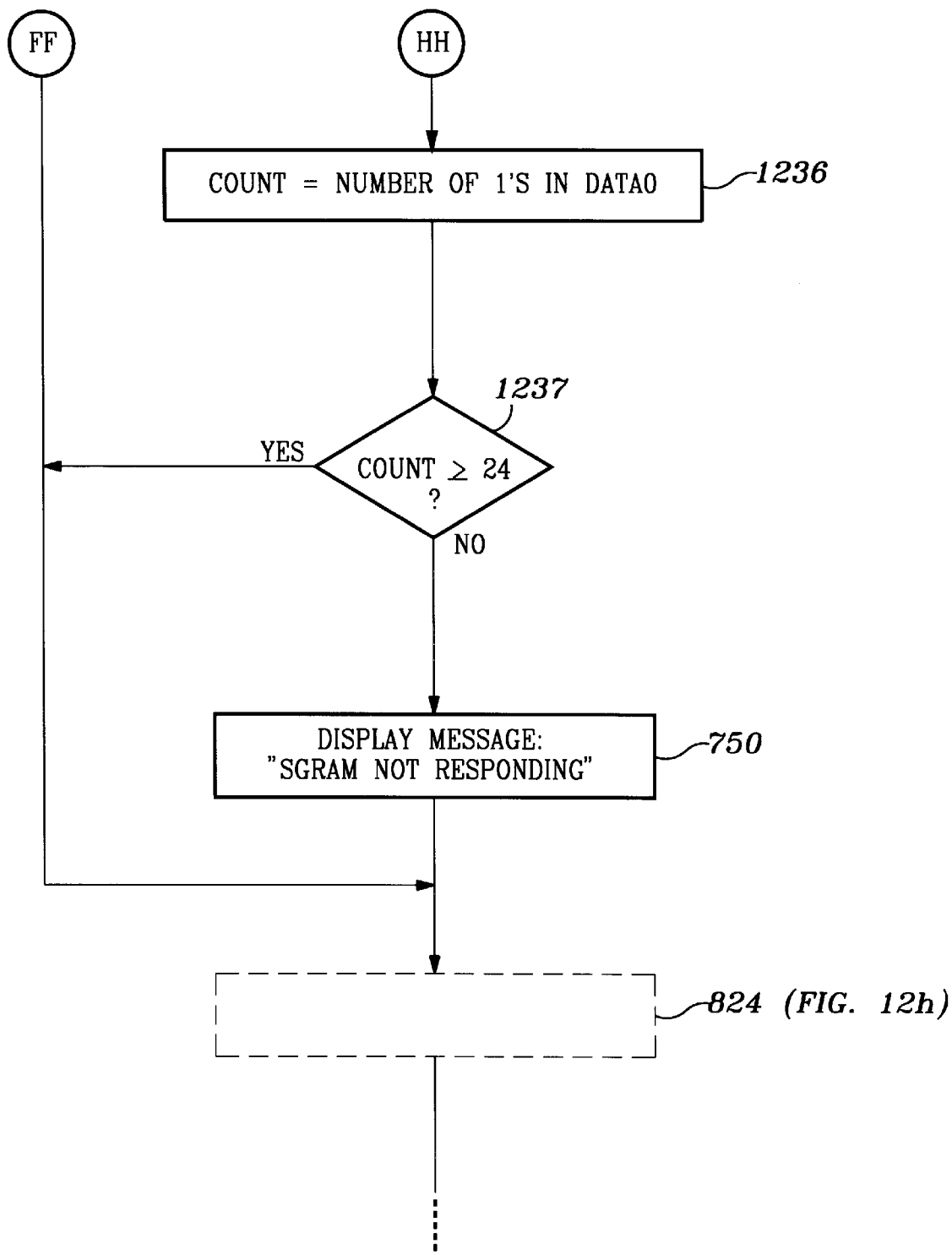

Referring to FIGS. 30a–30c, logic steps 1220–1238 are inserted between logic steps 822 and 824 of FIG. 12h to comprise an SGRAM check sequence that verifies that the extra circuitry internal and unique to an SGRAM responds when the define special function (DSF) line 165 of FIG. 9 is activated. A lack of response indicates that the SGRAM may have an erroneously or intentionally disabled DSF line. The operator of tester 10 is so notified with a warning message on display 12 of FIG. 1.

From the YES branch of logic step 822 of FIG. 30a, the logic flow proceeds to logic step 1220 where the variable PART_INX is retrieved from the PART_INDEX entry of the Per-Bank Structure Table VII for bank 0. From logic step 1220, the logic flow continues to logic step 1221 where the Type G flag entry of the PARTS_LIST Table XI as indexed by the variable PART_INX is sensed by CPU 80. If the TYPE G flag was not set, the logic flow continues at logic step 1333 where the logic flow branches via node FF to logic step 824 of FIG. 12h to bypass checking. Otherwise, the logic flow proceeds from logic step 1222 of FIG. 30a to logic step 1223 where the PRECH entry of the PARTS_LIST Table XI as indexed by the variable PART_INX is supplied by CPU 80 to the Precharge Bit Register 1300 of memory test controller 116 of FIG. 6a, thus programming the correct precharge bit for the UUT being identified.

From logic step 1223, the logic flow continues to logic step 1224 where the memory test controller hardware is setup as previously described at logic step 846 of FIG. 12j. The logic flow process proceeds from logic step 1224 to logic step 1225 of FIG. 30a where Bank 0 of the UUT is initialized by using the Module Parameter Structure Table VI as previously described at logic step 848 of FIG. 12j. From logic step 1225 of FIG. 30a, the logic flow continues to logic step 1226 where all logic 0's are written by the CPU 80 to the DQMBEN Enable Register 252 of FIG. 8, thus disabling all byte-level masking of the UUT. After logic step 1226, the logic flow continues by way of node GG to logic step 1227 of FIG. 30b, where a value 0055AAFF hexadecimal is written by the CPU 80 to address [0] of the UUT, thus initializing a known address with a known pattern.

The logic flow thereafter continues to logic step 1228 where logic 1's are written by the CPU 80 to the WPB & SP register 169 of FIG. 7 to prepare the memory test controller 116 to assert DSF line 165 during the appropriate states of the state machine 150. The SGRAM internal special register 1301 as depicted in FIG. 27 thereby is loaded with the contents of the Row Address Register of FIG. 7. After logic step 1228 of FIG. 30b, the logic flow continues to logic step 1229 where the constant 0020 hexadecimal (representing a logic "1" in bit $A_5$) is written by the CPU 80 into the Row Address Register 191 to trigger a Row Activate Command on line 190. As a result, the contents of the Row Address Register 191 are supplied to the internal special register 1301 of the SGRAM UUT as depicted in FIG. 27.

From logic step 1229, the logic flow continues to logic step 1230, where a pattern 5500FFAA hexadecimal is written by CPU 80 into the internal mask register 1302 of the UUT being identified. The actual memory address is ignored, provided that it falls within the addressing range of the UUT. After logic step 1230, the logic flow continues to logic step 1231 where the constant "0", is supplied by the CPU 80 to the Row Address Register 191 of FIG. 7 to trigger a Row Activate Command on line 190. The contents of the Row Address Register 191 thereupon are applied to the internal special register 1301 of the UUT as depicted in FIG. 27. The special register thereby is set to isolate the mask register 1302 from programming. The logic flow then continues from logic step 1331 to logic step 1232, where logic 0's are written by CPU 80 into the WPB & SP register 169 to configure the memory test controller 116 to suppress all DSF line 165 activity. The SGRAM UUT thereby is allowed to function like an SDRAM.

From logic step 1232, the logic flow continues to logic step 1233 where a pattern FFAA5500 hexadecimal is written to address [0] of the UUT. After logic step 1233, the logic flow proceeds to logic step 1234 where the contents of UUT address [0] are read into the local variable DATA0. The logic flow thereafter continues to logic step 1235 where the contents of local variable DATA0 undergo a bit-wise exclusive-OR logic function with the constant AAAAAAAA hexadecimal.

For a better understanding of the bit-wise logic operations of logic steps 1227–1235, Table XIV has been constructed to list the values generated by the SGRAM check routine, and possible values that could be returned by the UUT. The FIRST WRITE WORD entry having a value of 0055AAFF hexadecimal provides a known bit pattern in a known location, (address[0]) of the UUT. The entry SGRAM MASK having a value of 5500FFAA provides a second known bit pattern that may be loaded into the internal mask register 1302 of the SGRAM UUT. The mask register 1302 has the property of allowing a write or alteration of those bits in a 32-bit memory word which correspond to like bits in the mask register which contain a logic "1". Conversely, writes are disallowed for bits in a 32-bit memory word that correspond to like bits in the mask register that contain a logic "0".

The entry SECOND WRITE WORD having a value FFAA5500 hexadecimal represents a value that is the complement of FIRST WRITE WORD, which will change every bit of the word stored at address [0] of the UUT if there is no mask register present in the UUT. The entry READ IF SGRAM has a value 55555555 hexadecimal if the UUT is an SGRAM with a properly operating mask register. The entry READ IF SDRAM has the value FFAA5500 hexadecimal if the UUT is an SDRAM, or an SGRAM with a disabled mask register. That is, the last value written to the UUT will be reflected. The entry POST-XOR IF SGRAM has the value FFFFFFFF hexadecimal when READ IF SGRAM having the value 55555555 is exclusive-ORed with the constant AAAAAAAA at logic step 1235. Otherwise, POST-XOR IF SDRAM has the value 5500FFAA when READ IF SDRAM having the value FFAA5500 is exclusive-ORed with the constant AAAAAAAA at logic step 1235.

TABLE XIV

| QUANTITY | VALUE, BINARY | VALUE, HEX |
|---|---|---|
| FIRST WRITE WORD | 0000 0000 0101 0101 1010 1010 1111 1111 | 00 55 AA FF |
| SGRAM MASK | 0101 0101 0000 0000 1111 1111 1010 1010 | 55 00 FF AA |
| SECOND WRITE WORD | 1111 1111 1010 1010 0101 0101 0000 0000 | FF AA 55 00 |
| READ IF SGRAM | 0101 0101 0101 0101 0101 0101 0101 0101 | 55 55 55 55 |
| READ IF SDRAM | 1111 1111 1010 1010 0101 0101 0000 0000 | FF AA 55 00 |
| POST-XOR IF SGRAM | 1111 1111 1111 1111 1111 1111 1111 1111 | FF FF FF FF |
| POST-XOR IF SDRAM | 0101 0101 0000 0000 1111 1111 1010 1010 | 55 00 FF AA |

After logic step 1235, the logic flow continues by way of node HH to logic step 1236 of FIG. 30c where the number of logic 1's in the local variable DATA0 are counted and saved in a local variable COUNT. The logic flow then continues to logic step 1237 where the contents of the local variable COUNT are compared to the value "24." If the COUNT is greater than or equal to the constant 24, the logic flow branches to logic step 824 of FIG. 12h to indicate a successful identification of an SGRAM UUT. Otherwise, the logic flow proceeds to logic step 1238 where the message "SGRAM NOT RESPONDING" is displayed. In the event that the internal SGRAM mask register contains a random, unalterable value, it is statistically unlikely that 75% of the bits following the exclusive-OR logic function would be logic 1's. Following logic step 1238, the logic flow continues to logic step 824 of FIG. 12h where the process is continued as before described.

Figure 31:
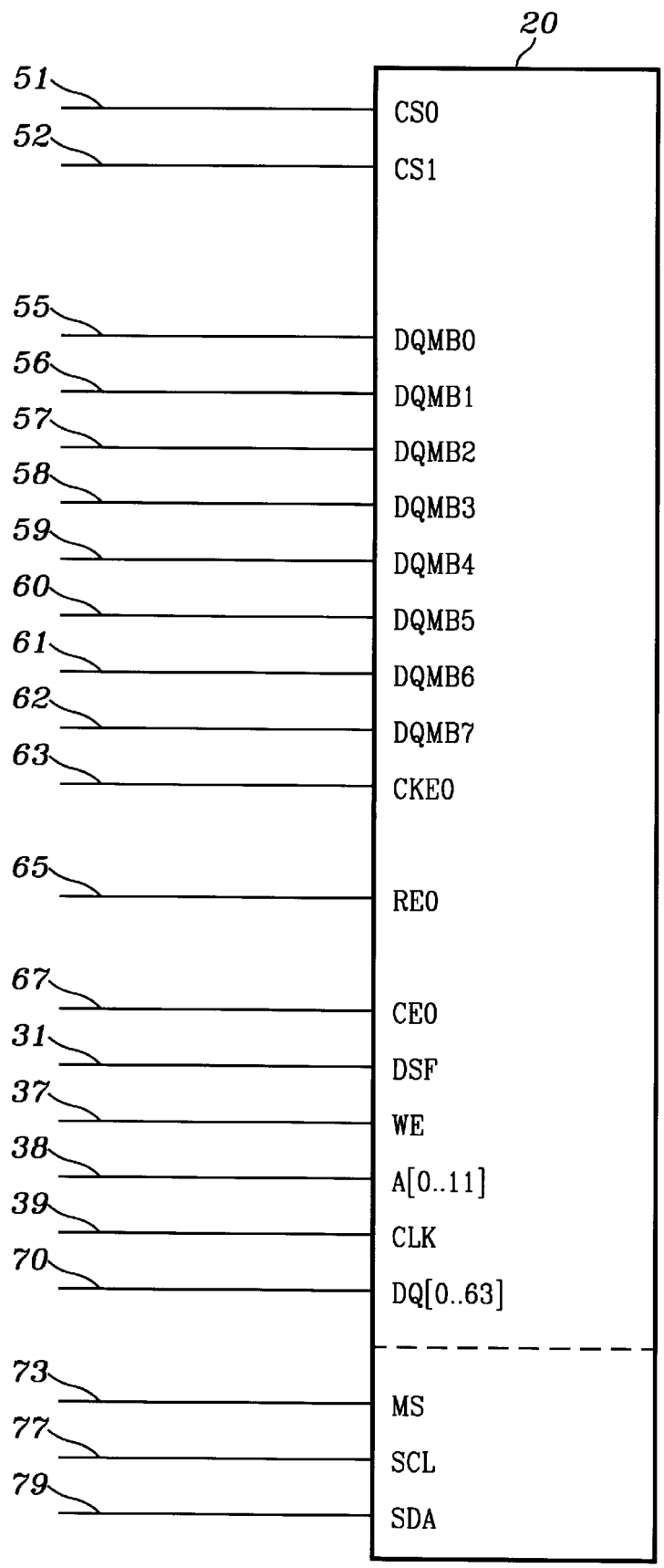
FIG. 31 is a graphic illustration of the control lines of an SGRAM IC.

Referring to FIG. 31, a graphic illustration of the control lines for an SGRAM is shown. It may readily be seen that the illustration of FIG. 31 differs from the SDRAM illustration of FIG. 4 in that the CS2, CS3, CKE1, RE1, and CE1 control signals respectively on lines 53, 54, 64, 66, and 68 have been deleted, and a DSF control line 31 has been added.

Figure 32:
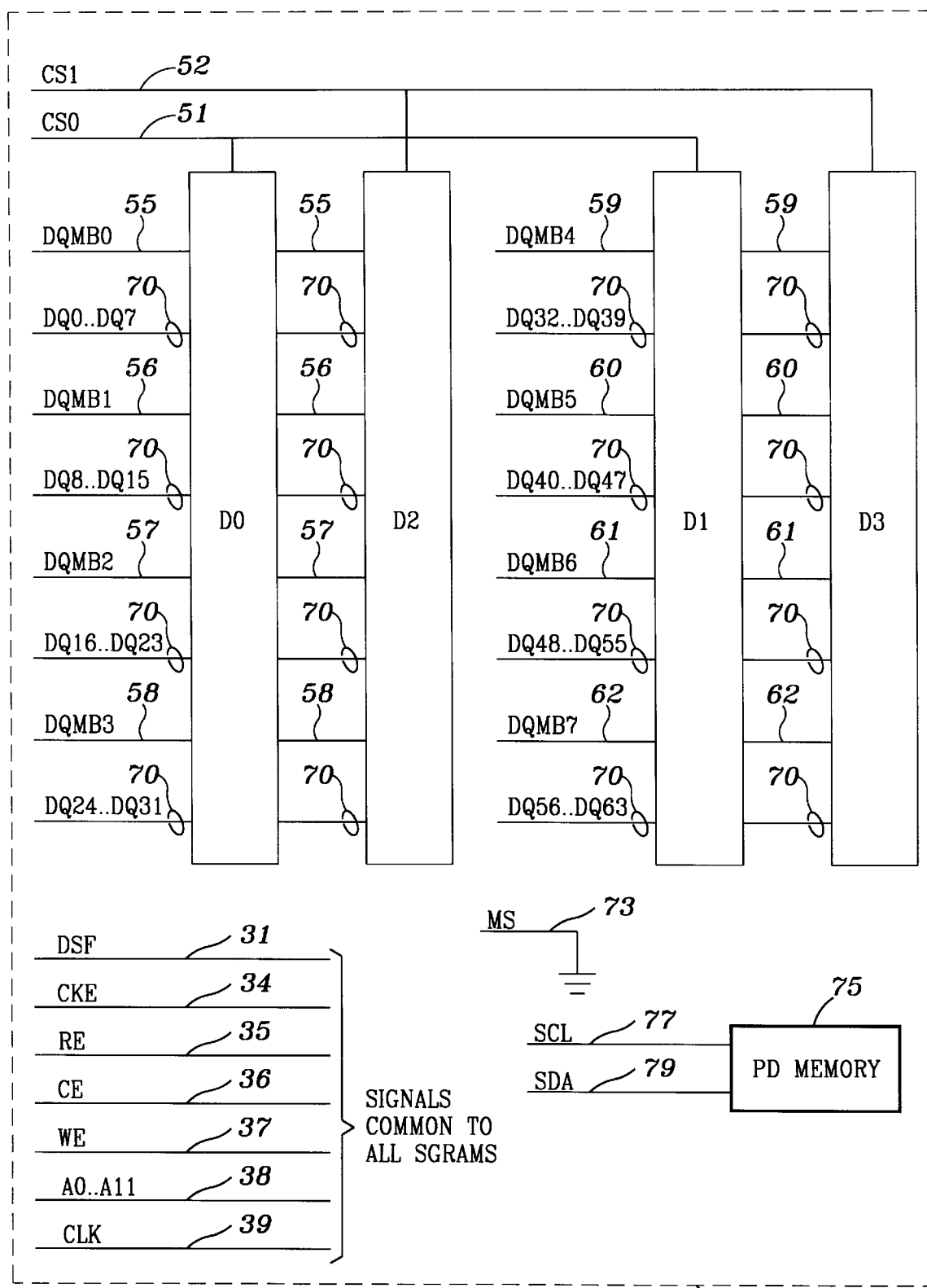
FIG. 32 is a functional block diagram of two parallel, interconnected banks of SGRAM ICs forming an SGRAM memory module having a 64 bit width.

Referring to the functional block diagram illustrated in FIG. 32, two parallel banks of SGRAM ICs are shown which are interconnected to form a typical SGRAM memory module 20 with a width of 64 bits. The principal difference between the diagram of FIG. 5 and the diagram of FIG. 32 is that an added DSF line 31 is common to all SGRAMs.

FIG. 32 is a schematic representation of a typical synchronous graphics RAM (SGRAM) module 20 comprising four SGRAM ICs D0, D1, D2, and D3. Each SGRAM IC has chip select lines CS0 51 and CS1 52. Further, each SGRAM IC has a define special function line DSF 31, a clock enable line CKE 34, a row enable line RE 35, a column enable line CE 36, a write enable line WE 37, a 12-line address bus A0 . . . A11 38, a clock line CLK 39, a grounded module sense line 73, a PD memory serial clock line SCL 77, and a PD memory serial data line SDA 79.

SGRAM ICs D0 and D1 each include data mask byte control lines DQMB0 by way of bus 55, DQMB1 by way of bus 56, DQMB2 by way of bus 57, and DQMB3 by way of bus 58. Similarly, SGRAM ICs D1 and D3 have data mask byte control lines DQMB4 by way of bus 59, DQMB5 by way of bus 60, DQMB6 by way of bus 61, and DQMB7 by way of bus 62.

Each of SGRAM ICs D0, D1, D2, and D3 also are electrically connected to a 64 line bi-directional data bus 70. More particularly, SGRAM ICs D0 and D1 receive data lines DQ0 . . . DQ7, DQ8 . . . DQ15, DQ16 . . . DQ23, and DQ24 . . . DQ31 by way of bus 70. SGRAM ICs D1 and D3 receive data lines DQ32 . . . DQ39, DQ40 . . . DQ47, DQ48 . . . DQ55, and DQ56 . . . DQ63 by way of bus 70.

The SGRAM modules differ from a typical SDRAM module in that SGRAM modules include a DSF line 31 to enable the selection of the mode set register 1301 in the SGRAM IC, and have fewer CS control lines since SGRAM ICs are 32 bits wide. Further, fewer SGRAM ICs are required to make a typical 64-bit-wide SGRAM memory module than SDRAM ICs required to make an SDRAM module of identical width.

With the exception of the DSF line, operation of the control lines for an SGRAM is identical to that for an SDRAM.

It should be apparent to one skilled in the art that from the memory tester disclosures above, that the SGRAM also may be identified by selectively driving the DSF signal during the state machine 150 states 01 and 0A of FIG. 9 to set the special mode register bits $A_6$ and $A_5$ of the SGRAM. During state 07 of FIG. 9, the internal GRAM write-per-bit register may be set during row activation in accordance with SGRAM specifications. In the alternative, hardware may be included on the UUT test fixture to allow the CPU 80 to sense the SGRAM's unique test fixture, and software may be included that exercises the SGRAM special mode, mask, and color registers.

What is claimed is:

1. A portable synchronous memory test system for testing of any one of a plurality of synchronous memories of differing types, control line configurations, width, depth, and access times, which comprises:

test fixture means for receiving a synchronous memory;

clock means for issuing a clock signal to synchronize operation of said synchronous memory test system;

a CPU in electrical communication with said clock means and receiving said clock signal for executing software program instructions;

a ROM means in electrical communication with said CPU, and having stored therein a user interface program, an auto-ID program of nested loops for identifying said types, said control line configurations, said width, and said depth, test parameter tables of ordered entries of bit patterns representative of said plurality of synchronous memories and accessible by said auto-ID program, and test software programs for verifying parameters identified by said auto-ID program, each of said user interface program, said auto-ID program, and said test software programs having program instructions for execution by said CPU in identifying said synchronous memory;

a RAM in electrical communication with said ROM means and said CPU, and having stored therein variable parameters for use during operation of said test software programs;

refresh timer means in electrical communication with said CPU, said ROM and said RAM for interrupting said CPU to preserve memory contents of said test fixture means;

oscillator means in electrical communication with said refresh timer means for timing a refresh cycle;

a programmable delay line in electrical communication with said refresh timer means, said CPU, said RAM, and said ROM for generating data latch strobes for reading data from said test fixture means;

data latch means in electrical communication with said program delay line, said refresh timer means, said CPU, said ROM, and said RAM for transferring data between said test fixture means and said synchronous memory test system in response to said data latch strobes;

memory test controller means in electrical communication with said data latch means, said CPU, said programmable delay line said refresh timer means, said ROM and said RAM for generating control signals to be supplied to said test fixture means for automated identification of said synchronous memory; and controlled power supply means in electrical communication with said test fixture means, said memory test controller means, said data latch means, said CPU, said refresh timer means, said ROM, and said RAM for energizing said test fixture means.

2. The synchronous memory test system of claim 1 further including a voltage level translator means in electrical communication with said test fixture means for accommodating differences in voltage levels between said synchronous memory test system and said synchronous memory, and for turning on and off clock, control, address and data signals received from said test fixture means.

3. The synchronous memory test system of claim 1 further including:

input key means for initiating said synchronous memory test system;

display means for indicating parameters of said synchronous memory including control line configurations, and results from execution of said auto-ID program by said CPU to identify said synchronous memory; and I/O interface means in electrical communication with said input key means, said display means, said RAM, said ROM, said refresh timer means, said programmable delay line, said CPU, said data latch means, said memory test controller means, and said controlled power supply means for transferring output signals from said input key means to said CPU, sending data and control signals received from said CPU to said controlled power supply means, to said display means, to said communication interface means, to said refresh timer means, to said programmable delay line means, to said memory test controller means, to said ROM means, to said RAM, and to said data latch means, and for modifying software programs stored in said ROM and hardware structure of said memory test controller means.

4. The synchronous memory test system of claim 1 where in said clock means generates a 40 MHz clock signal, and said oscillator means generates a 3.6864 MHz signal.

5. The synchronous memory system of claim 1 wherein said CPU is comprised of an internal timer means in electrical communication with said clock means for periodically interrupting said CPU, thereby causing said CPU to execute a memory refresh operation on contents of said RAM.

6. The synchronous memory test system of claim 1 wherein said memory test controller means includes a hardware state machine, and said test software programs include a detect burst program which allows an arbitrary number of burst cycles to be executed by said state machine by receiving commands from said CPU under software control to accommodate single word transfers in and out of said synchronous memory by de-asserting a CKE control signal to said synchronous memory between successive data write and data read cycles from said CPU.

7. The synchronous memory test system of claim 1 further comprising a voltage translator means in electrical communication with said memory test controller means and said synchronous memory for providing a synchronizing clock signal from said memory test controller means to said synchronous memory, for providing a SET MODE control signal from said memory test controller means to said synchronous memory to designate a latency count, for providing a READ DATA command to said synchronous memory to synchronize operation of said memory test controller means and said synchronous memory and to test operation of a synchronous RAM latency counter internal to said synchronous memory.

8. The synchronous memory test system of claim 1 wherein virtual addresses of a size up to 256M words are converted to synchronous memory physical addresses ranging from 12 to 14 row address lines and from 8 to 14 column address lines.

9. The synchronous memory test system of claim 1 wherein said CPU issues finite step control signals to said programmable delay line, and a read command and a memory clock signal to said memory test controller means, and said memory test controller means in response thereto issues a delay start signal to said programmable delay line and a data strobe to said data latch means upon elapse of a programmable delay controlled by said programmable delay line to provide data read from said synchronous memory to said CPU, said memory test controller means further proceeding a read signal sequence and a synchronization clock signal to said synchronous memory to synchronize reception of said read signal sequence by said synchronous memory and generation of said read signal sequence by said memory test controller means.

10. The synchronous memory test system of claim 3 further including a communications interface means in electrical communication with said CPU, said programmable delay line, said memory test controller means, said data latch means, said oscillator means, said refresh timer means, said ROM, said RAM, and said I/O interface means, wherein during a quiescent state when no user inputs occurs by way of said input key means, no messages are received by said synchronous memory test system by way of said communications interface means, and no synchronous memory is being identified, said CPU issues a command to said clock means to cause a reduction in clock frequency, thus decreasing power consumption by said memory test system.

11. The synchronous memory test system of claim 1, wherein said CPU executes said program instructions of said auto-ID program to write test patterns from a representative number of words into said synchronous memory, to increment a delay between issuance of a read command by said memory test controller means to said synchronous memory and a reading of said test patterns from said synchronous memory by said CPU, with said delay increasing from a minimum to a maximum value in successive write/read iterations until said test patters written and read from said synchronous memory are identical, thereby determining access time of said synchronous memory.

12. The synchronous memory test system of claim 1 wherein said plurality of synchronous memories includes SDRAMs and SGRAMs.

13. The synchronous memory test system of claim 1 wherein said memory test controller means includes a precharge bit register for activating a precharge bit of said synchronous memory in executing a precharge cycle preceding a read or write cycle of a row in a memory array.

14. The synchronous memory test system of claim 1 wherein said memory test controller means includes a WPB & SP register for asserting a DSF signal during SGRAM identification to program internal SGRAM mode set, mask and color registers.

15. The synchronous memory test system of claim 1, wherein said one of said plurality of synchronous memories is a memory module and said test fixture means includes clock buffers which are enabled only when said synchronous memory is inserted in said test fixture means to reduce effects from electromagnetic radiation.

* * * * *